(12) United States Patent
Hoffman

(10) Patent No.: US 9,487,856 B2
(45) Date of Patent: Nov. 8, 2016

(54) DIAMOND-COATED SUBSTRATES

(71) Applicant: Technion Research & Development Foundation Limited, Haifa (IL)

(72) Inventor: Alon Hoffman, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 14/416,388

(22) PCT Filed: Jul. 22, 2013

(86) PCT No.: PCT/IL2013/050627
§ 371 (c)(1),
(2) Date: Jan. 22, 2015

(87) PCT Pub. No.: WO2014/016835
PCT Pub. Date: Jan. 30, 2014

(65) Prior Publication Data
US 2015/0203953 A1  Jul. 23, 2015

Related U.S. Application Data

(60) Provisional application No. 61/674,351, filed on Jul. 22, 2012.

(51) Int. Cl.
*C23C 16/02* (2006.01)
*C23C 14/02* (2006.01)
(Continued)

(52) U.S. Cl.
CPC ............... *C23C 14/025* (2013.01); *C23C 8/24* (2013.01); *C23C 14/0611* (2013.01); *C23C 16/0272* (2013.01); *C23C 16/271* (2013.01); *Y10T 428/265* (2015.01)

(58) Field of Classification Search
USPC .......... 51/307, 309; 428/336, 408, 457, 698; 427/249.1, 249.8, 249.12, 249.13, 427/249.14, 343; 204/192.1, 192.16
See application file for complete search history.

(56) References Cited

U.S. PATENT DOCUMENTS 5,858,539 A * 1/1999 Reineck ................. C23C 16/02
428/408
6,572,936 B1 * 6/2003 Domoto ................. B26B 19/38
427/577

(Continued)

FOREIGN PATENT DOCUMENTS

WO   WO 2014/016835       1/2014

OTHER PUBLICATIONS

Fayer et al "Depostion of continous and well adhering diamond films on steels" Appl. Phys. Lett 67 (16) oct. 995 p. 2299-2301.*

(Continued)

*Primary Examiner* — Archene Turner

(57) ABSTRACT

A composite structure, comprising a cemented carbide substrate (e.g., tungsten carbide substrate cemented with cobalt, such as WC—Co), a thin interlayer disposed over the substrate, and a contiguous diamond film disposed over the interlayer, as well as processes of preparing such a composite structure and uses thereof, are provided. The composite structure is characterized by at least one of a substrate binder concentration of at least 2 percents by weight, interlayer thickness less than 20 microns, a homogenous interlayer made substantially of crystalline chromium nitride, a low to null binder concentration in the interlayer, and a high co-adhesion of the diamond film to the interlayer and the interlayer to the substrate.

29 Claims, 44 Drawing Sheets
(28 of 44 Drawing Sheet(s) Filed in Color)

(51) Int. Cl.
  C23C 16/27 (2006.01)
  C23C 8/24 (2006.01)
  C23C 14/06 (2006.01)

(56) References Cited

U.S. PATENT DOCUMENTS

| | | | |
|---|---|---|---|
| 6,821,624 B2 * | 11/2004 | Utsumi | C23C 14/024 204/192.1 |
| 7,195,817 B2 | 3/2007 | Lev et al. | |
| 2006/0147631 A1 | 7/2006 | Lev et al. | |

OTHER PUBLICATIONS

International Preliminary Report on Patentability Dated Feb. 5, 2015 From the International Bureau of WIPO Re. Application No. PCT/IL2013/050627.

International Search Report and the Written Opinion Dated Nov. 15, 2013 From the International Searching Authority Re. Application No. PCT/IL2013/050627.

Buijnsters et al. "Chemical Vapour Deposition of Diamond on Nitrided Chromium Using an Oxyacetylene Flame", Diamond and Related Materials, XP004199774, 9(3-6): 341-345, Apr. 1, 2000. Experimental.

Fayer et al. "Deposition of Continuous and Well Adhering Diamond Films on Steel", Applied Physics Letters, XP012013792, 67(16): 2299-2301, Oct. 16, 1995. P.2299, r-h Col.

Glozman et al. "A Study of the Initial Stages of Diamond Deposition on Ferrous Substrates Coated by A Nitrided Chromium Interlayer and on Nitrided Polycrystalline Chromium Substrates", Diamond and Related Materials, 6: 1847-1856, 1997.

Glozman et al. "Adhesion Improvement of Diamond Films on Steel Substrates Using Chromium Nitride Interlayers", Diamond and Related Materials, 6: 796-801, 1997.

Glozman et al. "Growth and Adhesion Enhancement of Diamond Films Deposited on Steel Substrates by a Cr—N Interlayer", Israel Journal of Chemistry, 38: 75-84, 1998.

Glozman et al. "Influence of Cr—N Interlayer Properties on the Initial Stages of CVD Diamond Growth on Steel Substrates", Diamond and Related Materials, XP004115113, 7(2-5): 597-602, Feb. 1, 1998. Experimental.

Glozman et al. "Study of the Wear Behavior and Adhesion of Diamond Films Deposited on Steel Substrates by Use of a Cr—N Interlayer", Diamond and Related Materials, 8: 859-864, 1999.

Ilan et al. "The Effect of Cr Interlayer on the Microstructure of CrN Coatings on Steel", Thin Solid Films, 377-378: 578-584, 2000.

Kreines et al. "Fretting Wear of Thin Diamond Films Deposited on Steel Substrates", Diamond & Related Materials, 13: 1731-1739, 2004.

Laikhtman et al. "Tribological and Adhesion Properties of CVD Diamond Films Grown on Steel With a Cr—N Interlayer", Advanced Materials and Nanotechnology, Proceedings of the International Conference (AMN-4), AIP Conference Proceedings, 1151: 157-161, 2009.

Lux et al. "Diamond Substrate Interactions and the Adhesion of Diamond Coatings", Pure & Applied Chemistry, 66(9): 1783-1788, 1994.

Shi et al. "Growth of a Well-Adhering Diamond Coating on Sintered Tungsten", Diamond and Related Materials, 4: 1079-1087, 1995.

* cited by examiner

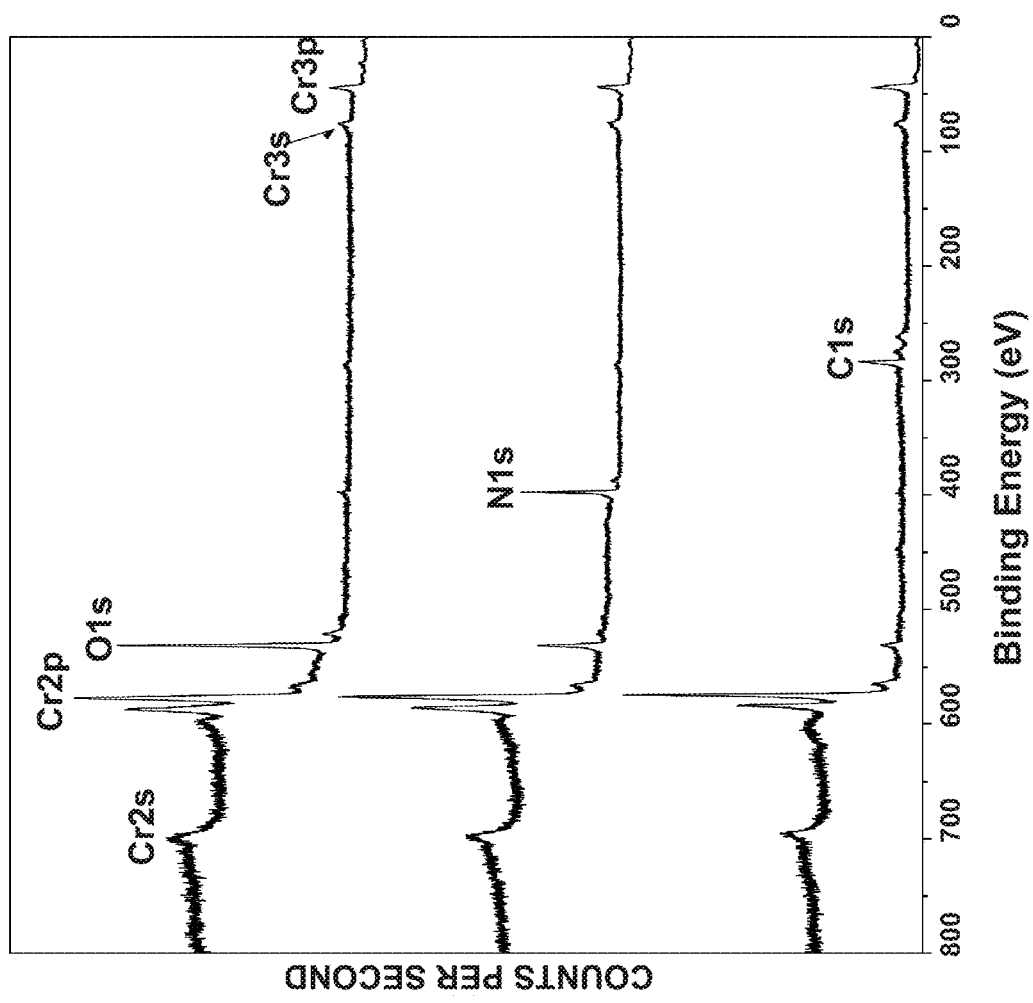

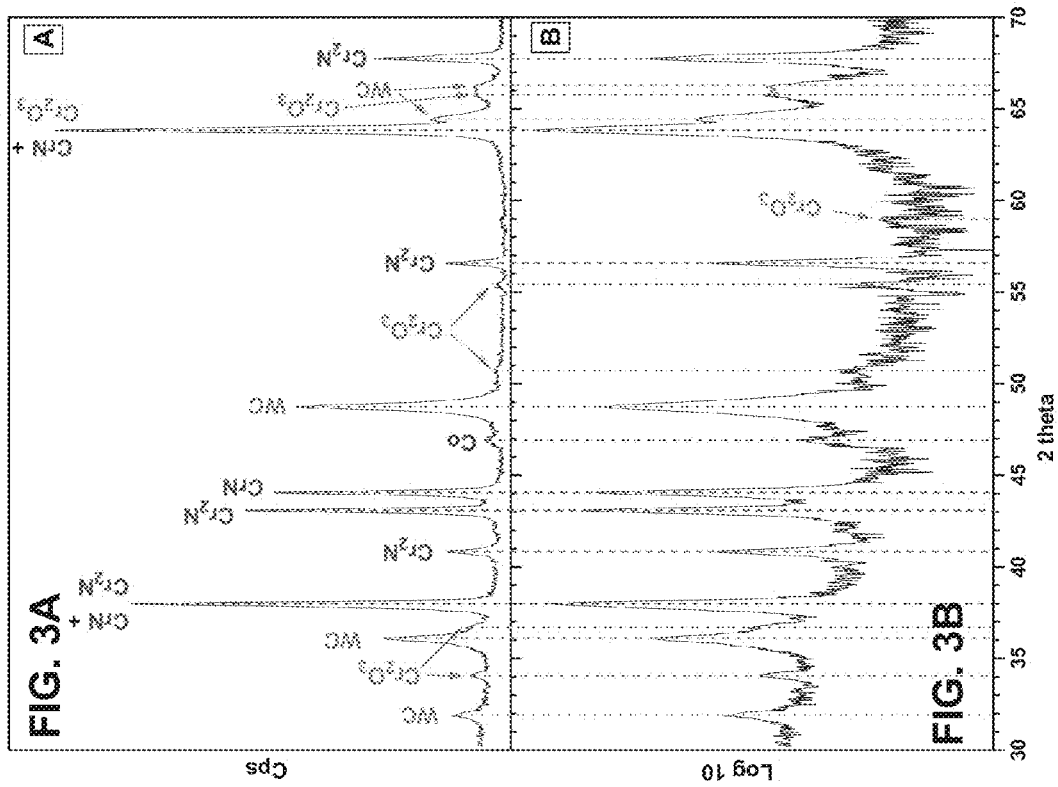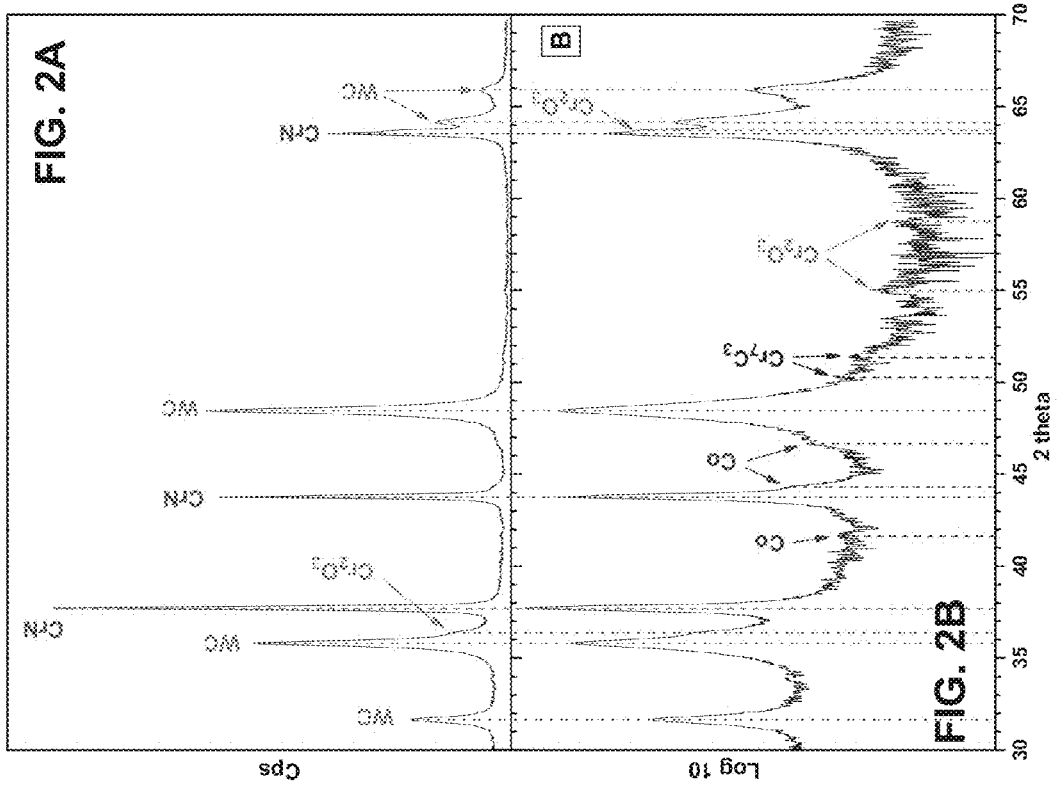

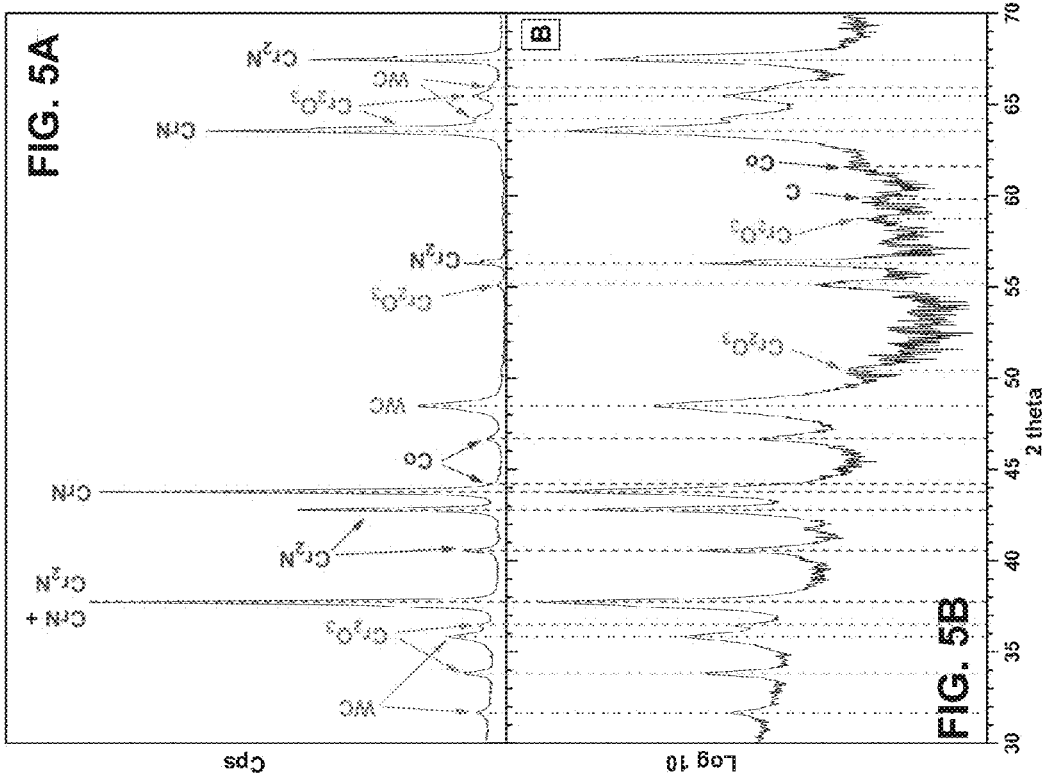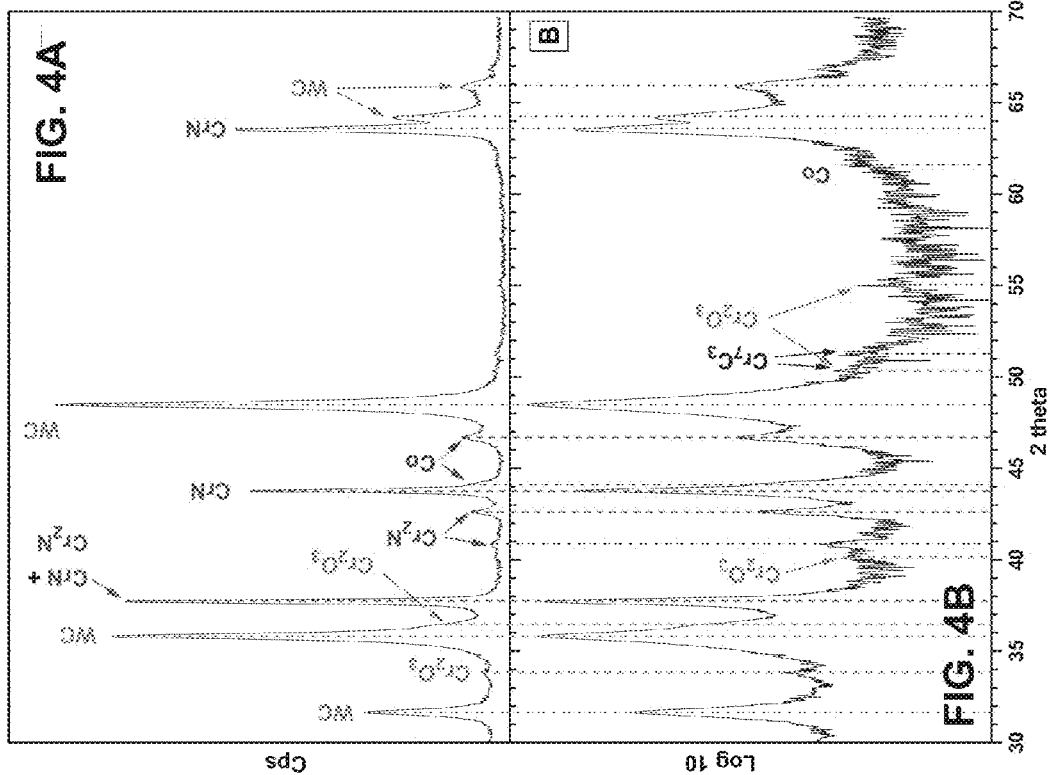

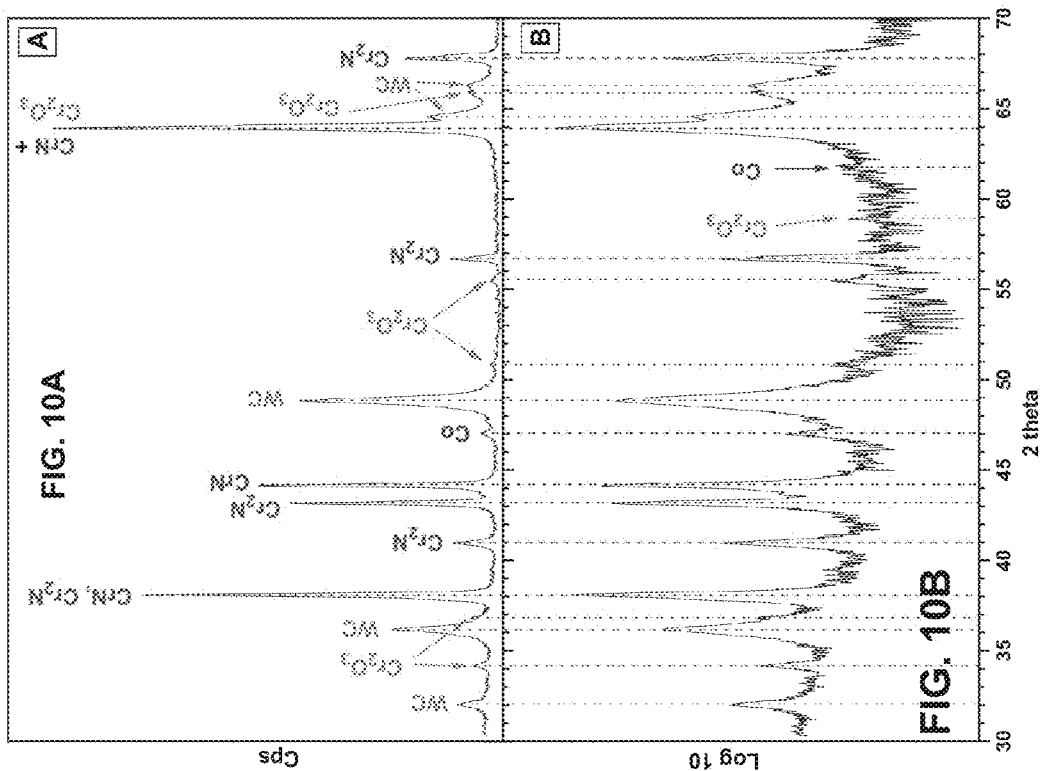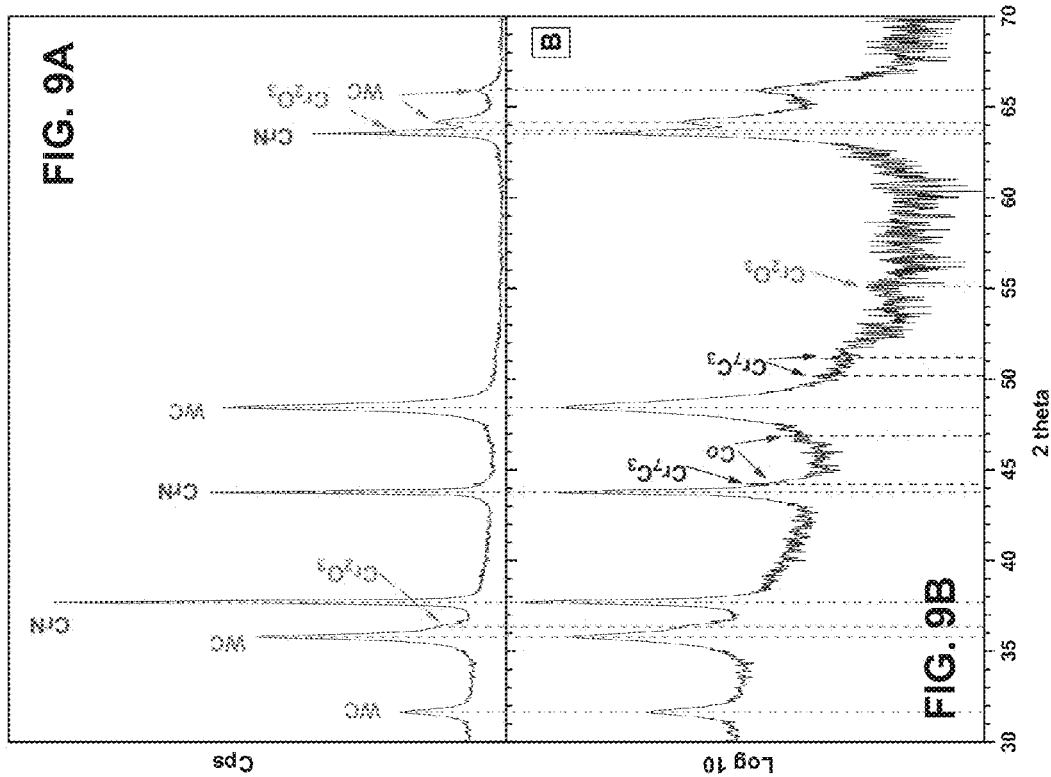

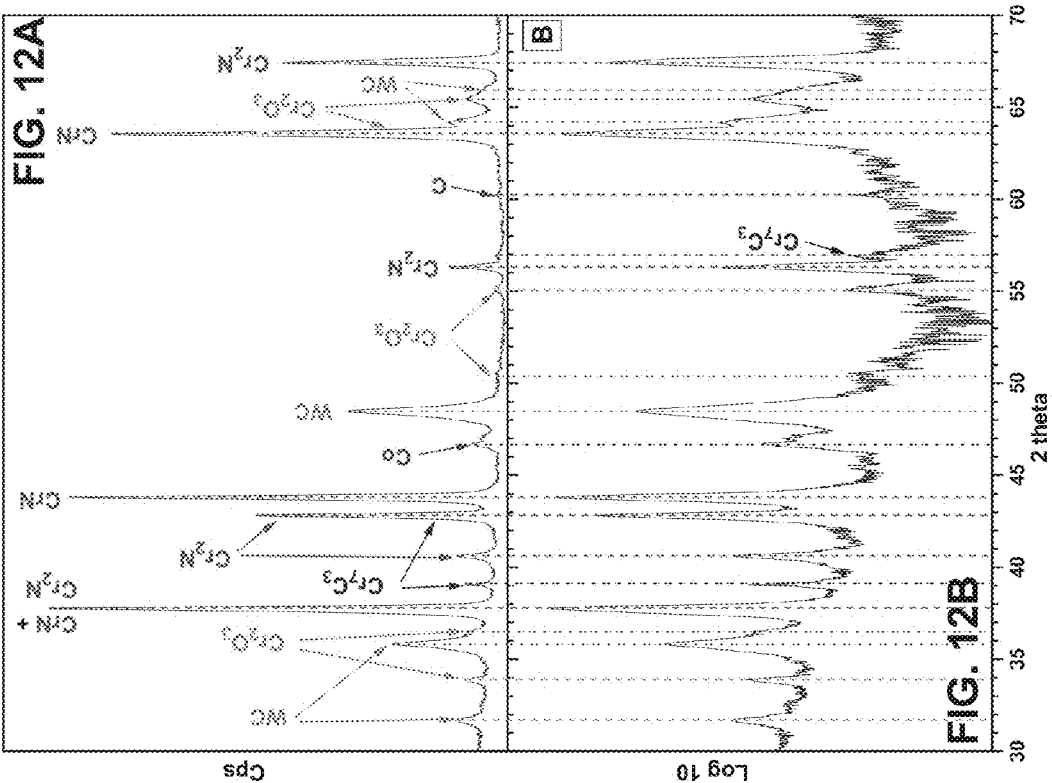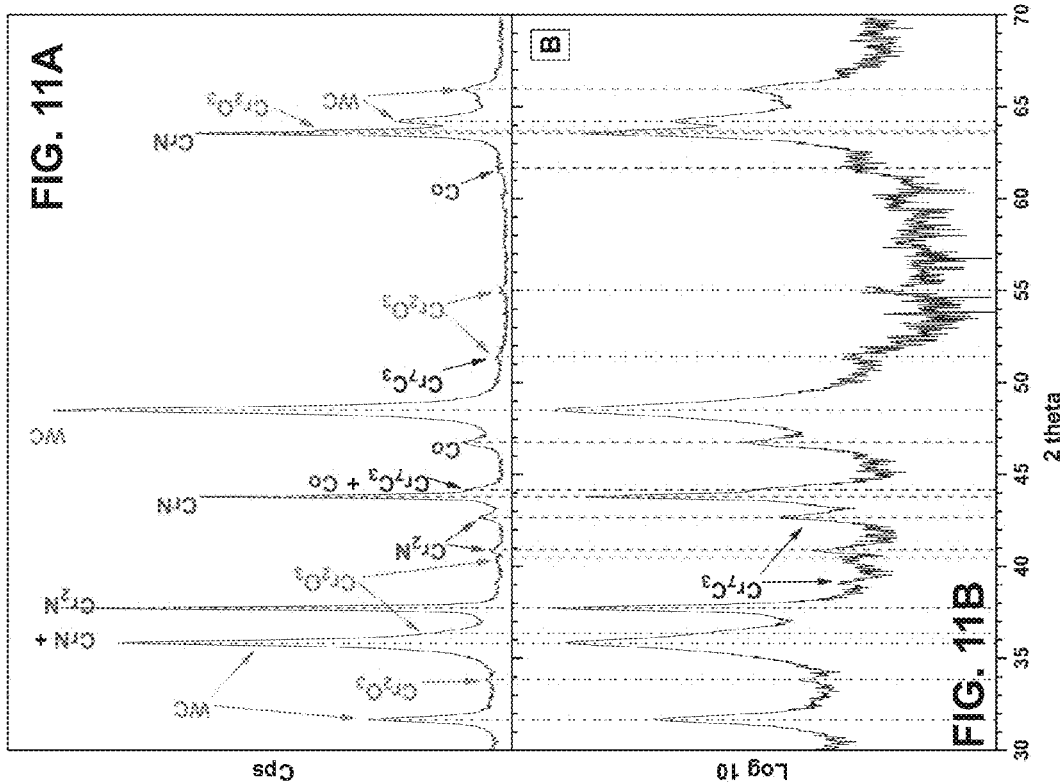

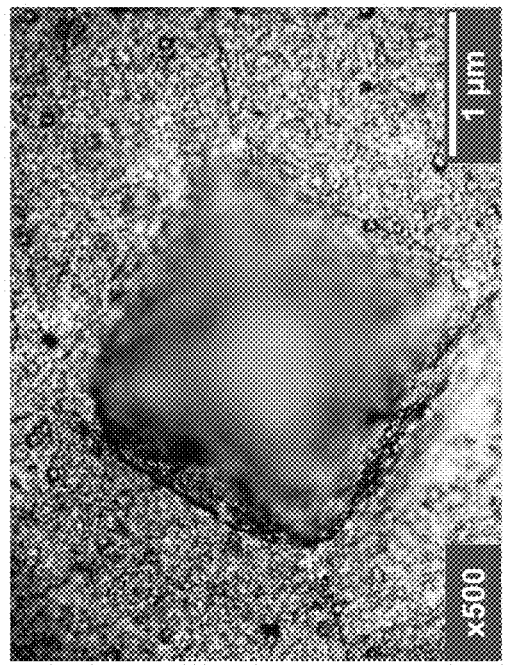
FIG. 18B
FIG. 18A
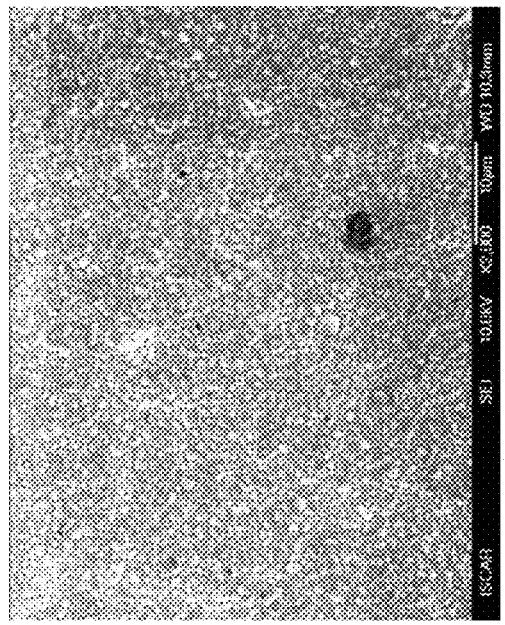
FIG. 18C

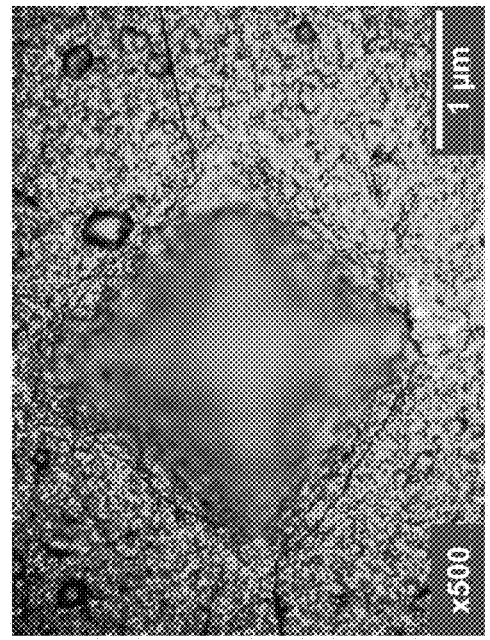
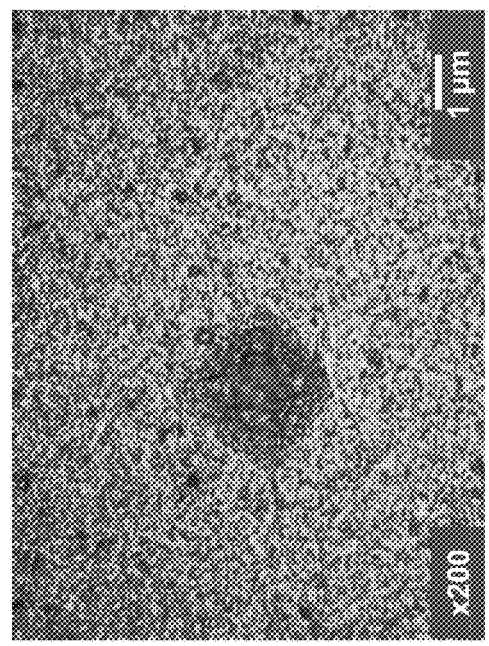
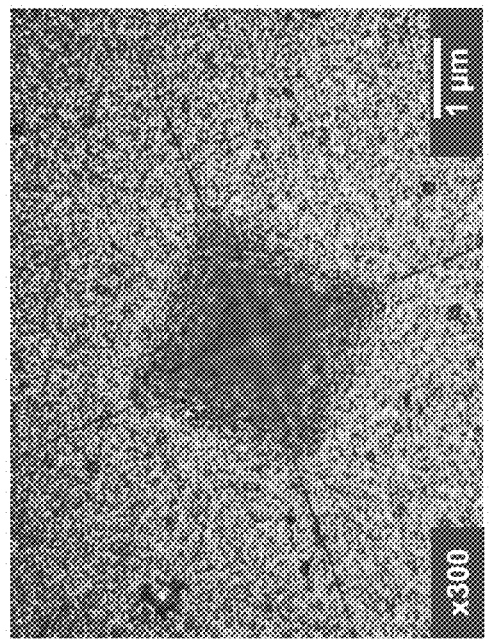
FIG. 20A
FIG. 20B
FIG. 20C

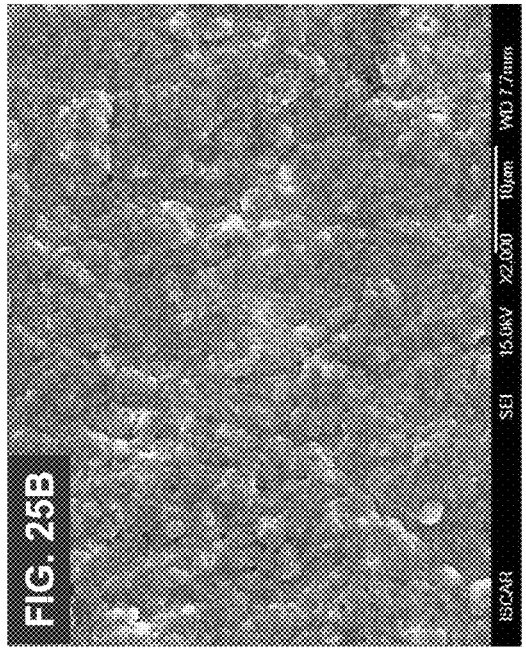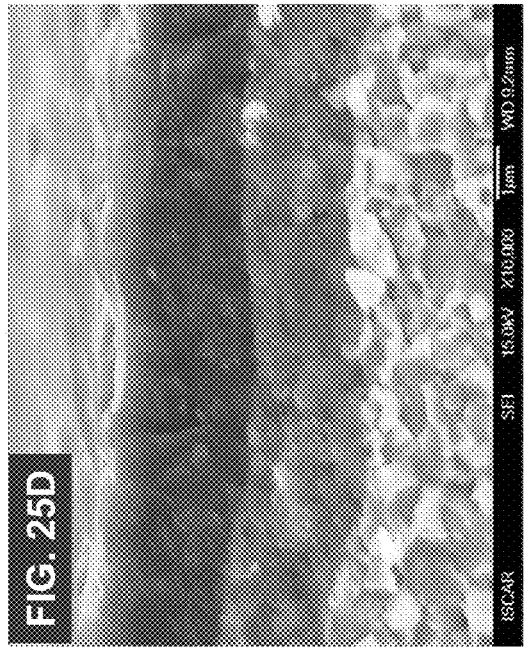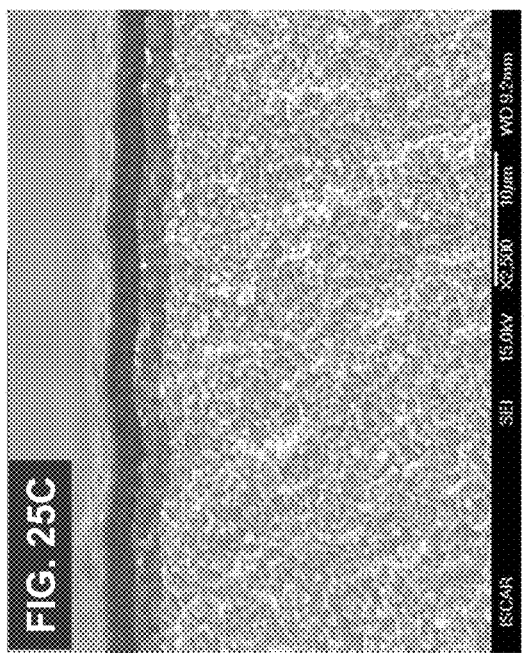

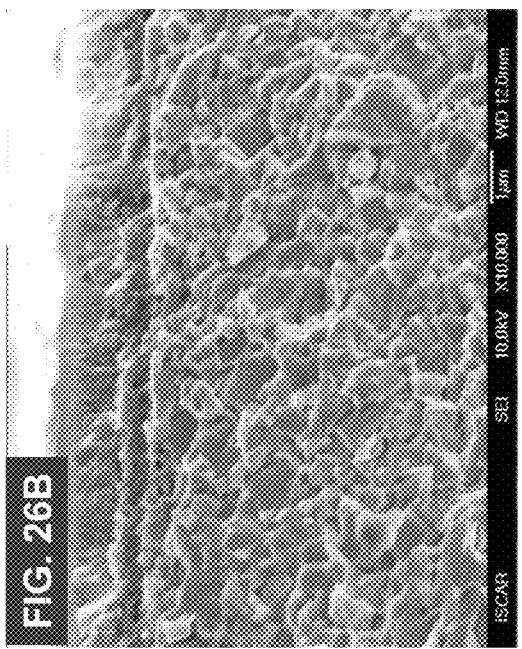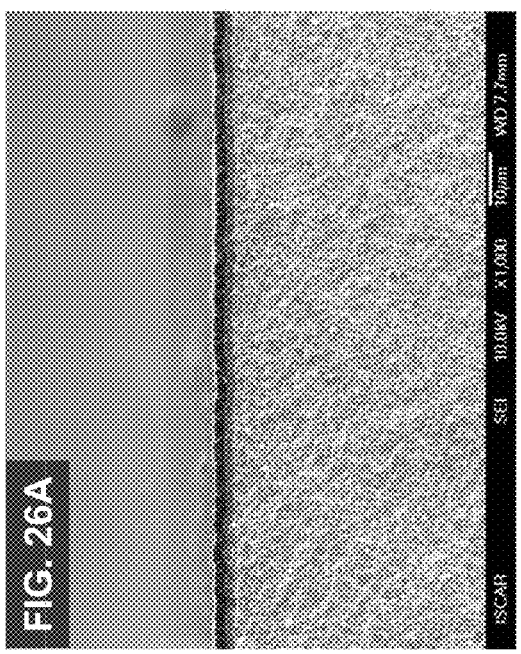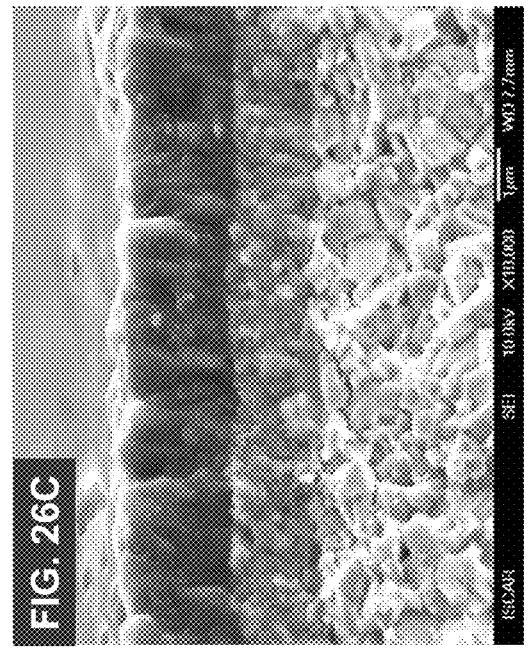

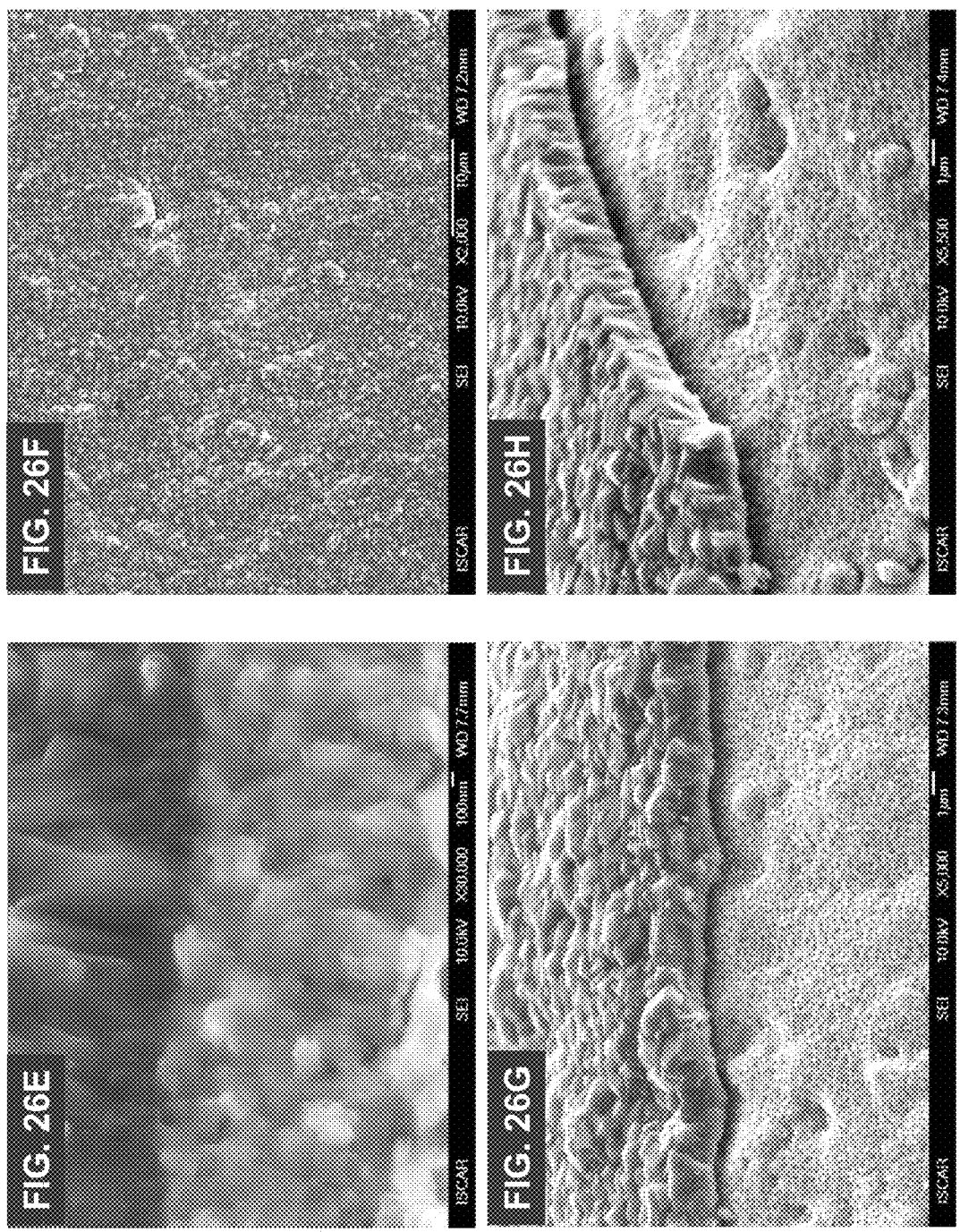

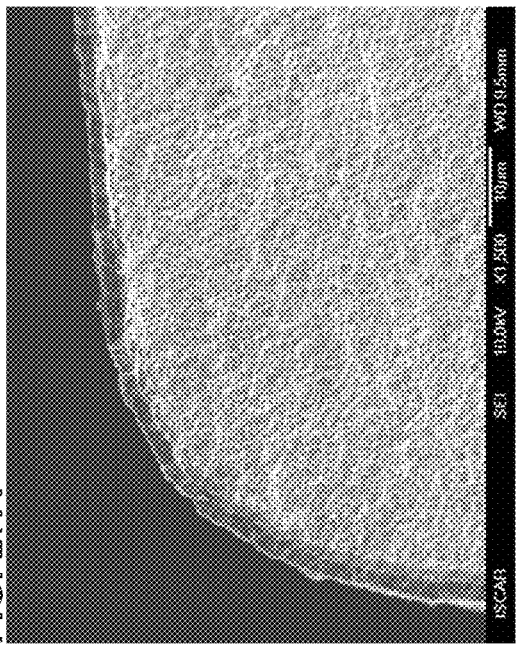
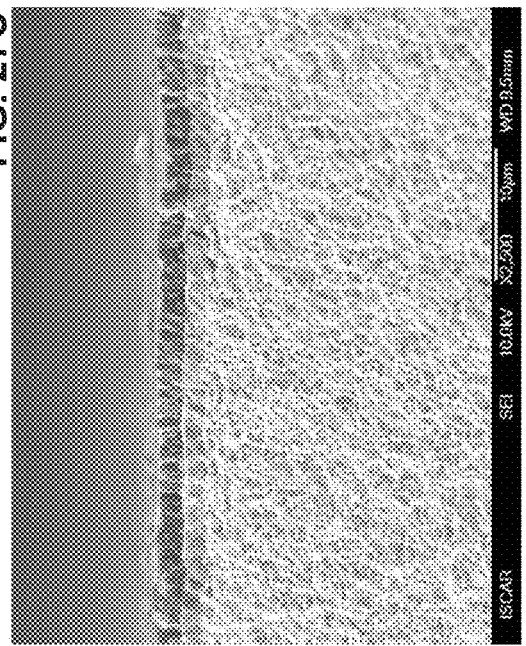
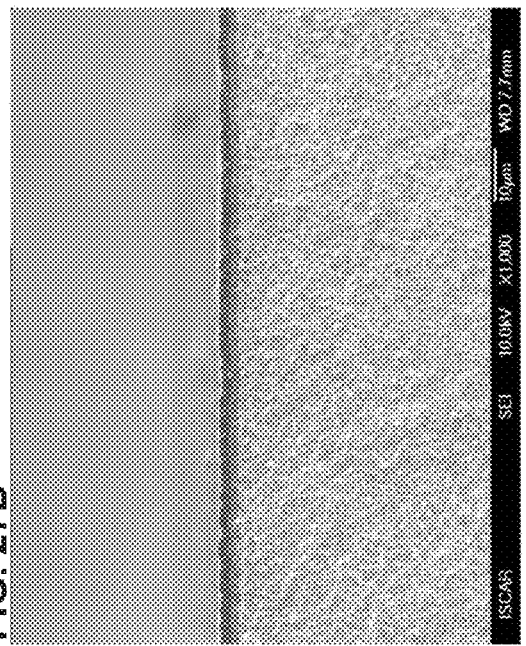

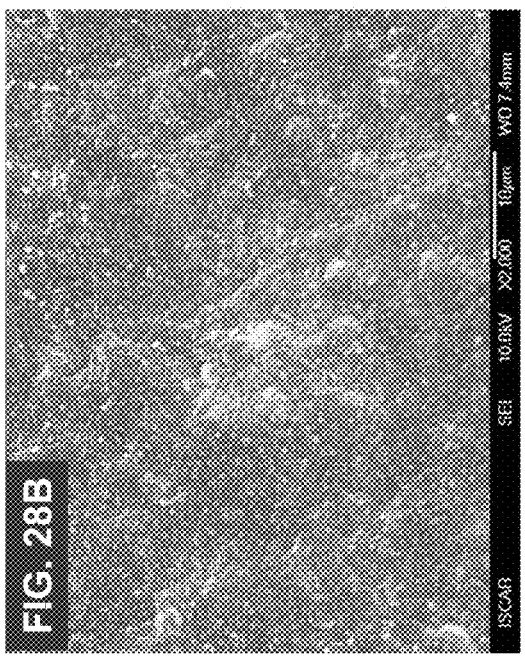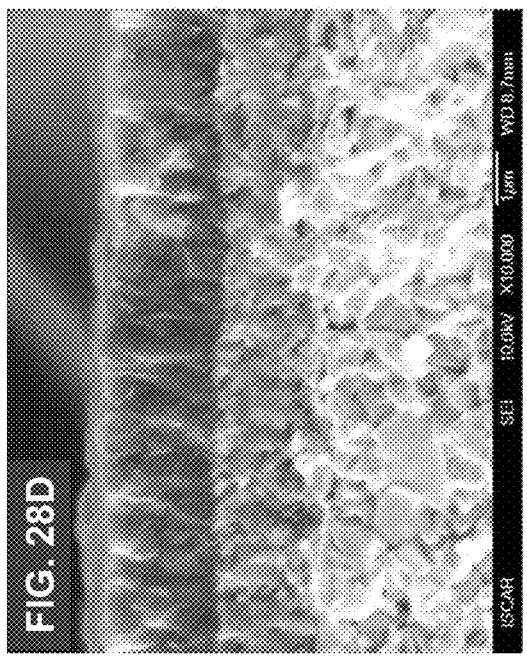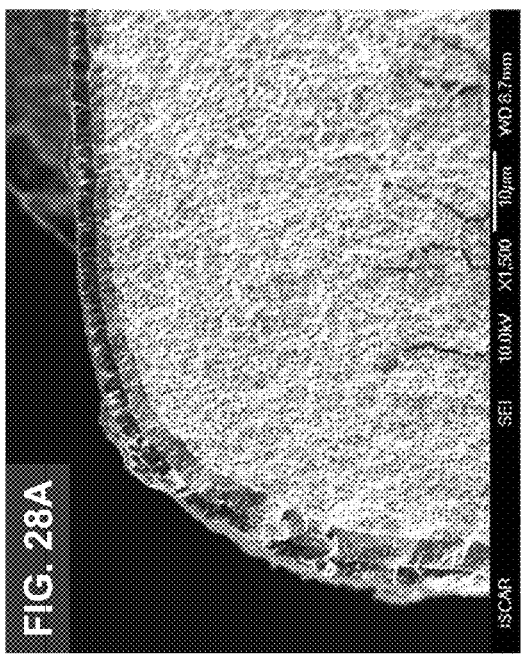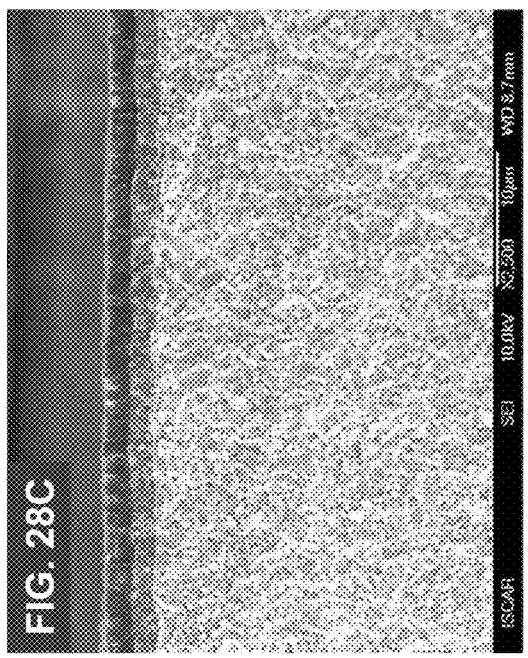

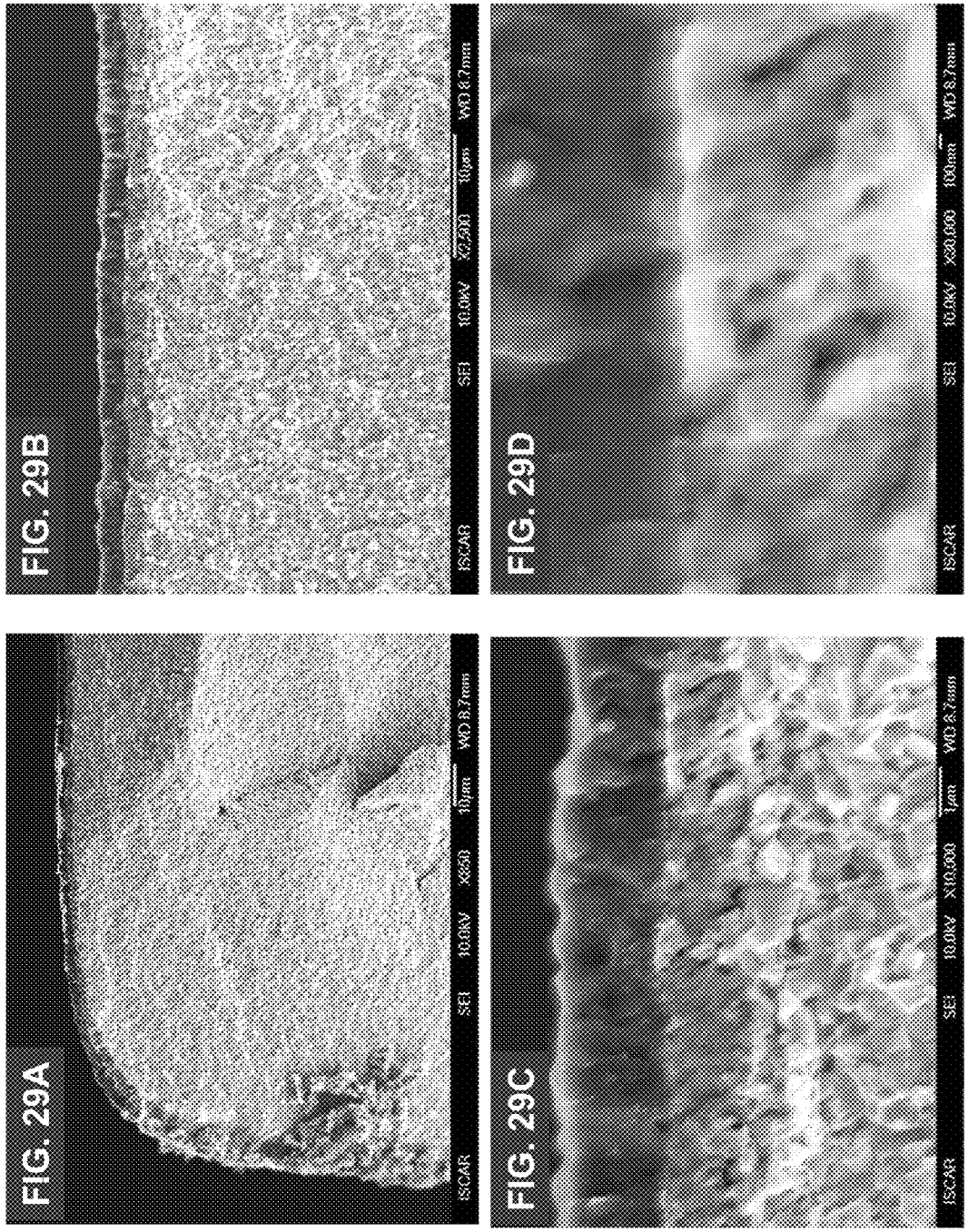

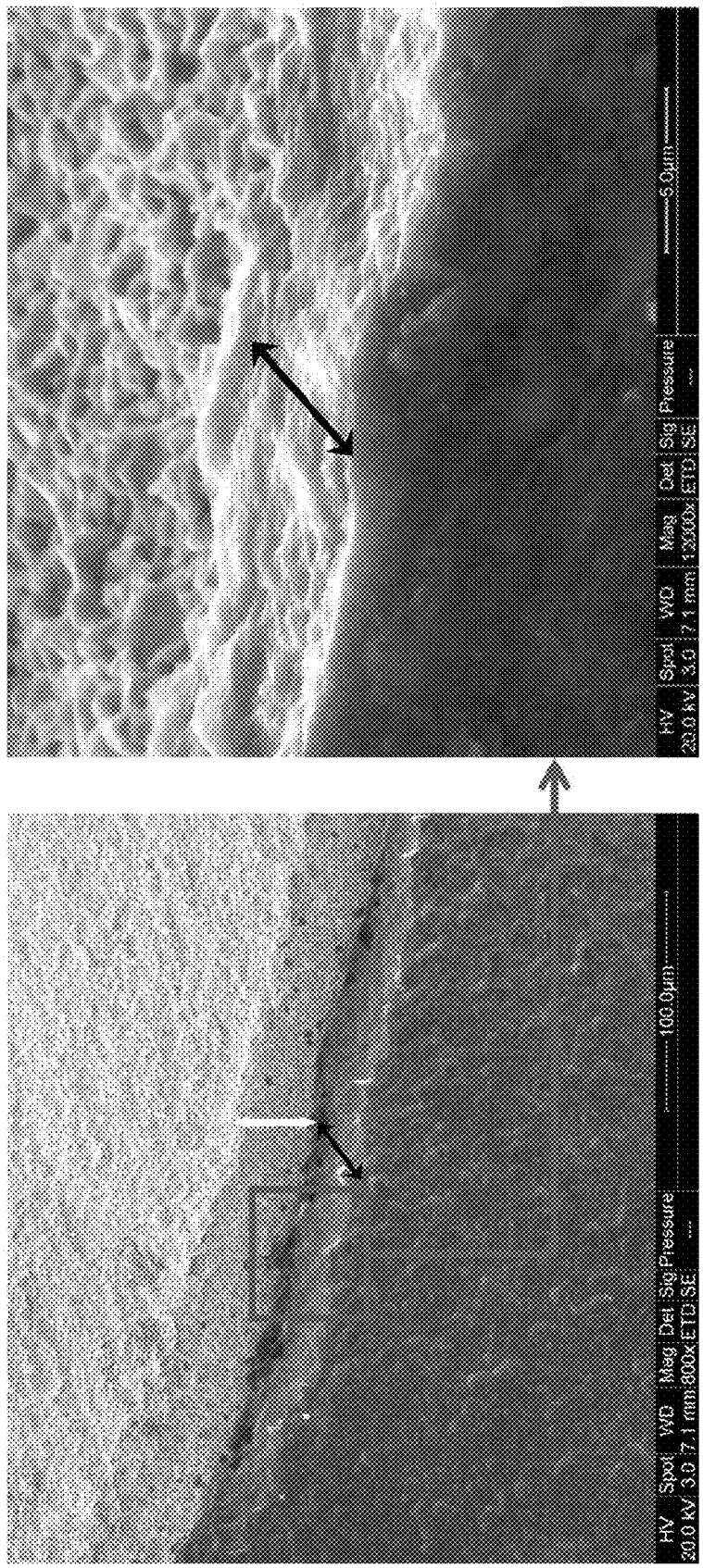

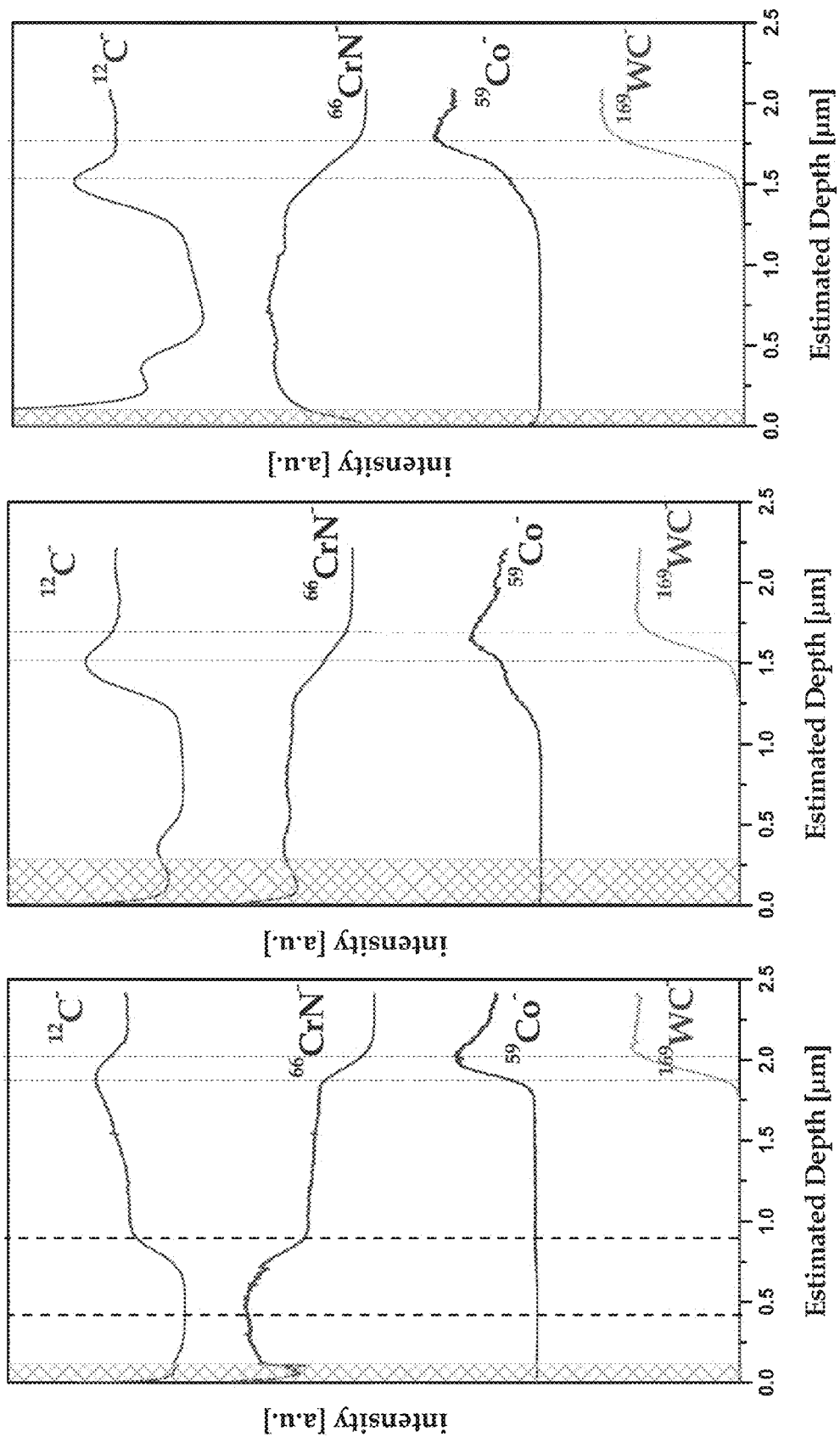

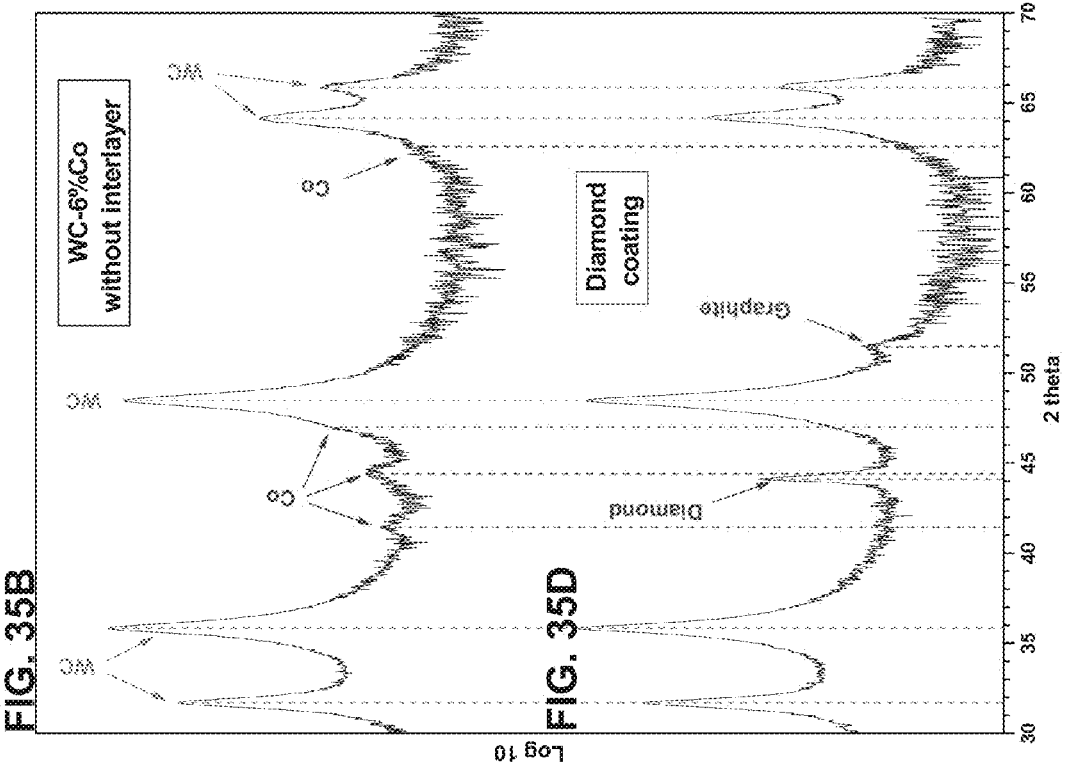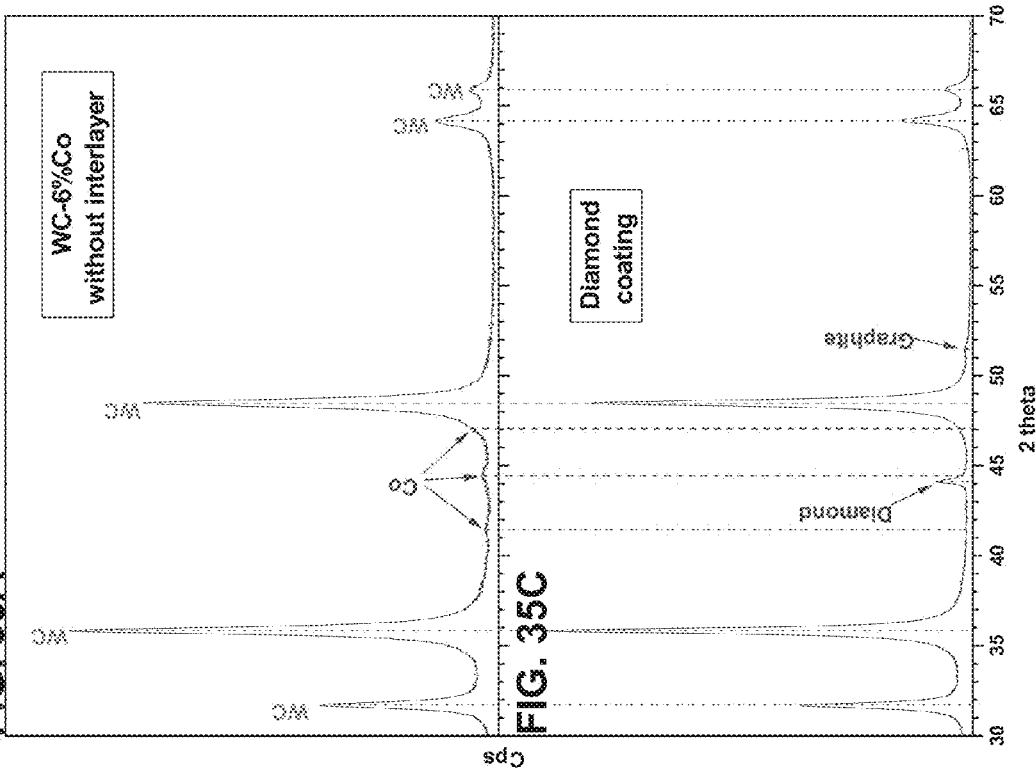

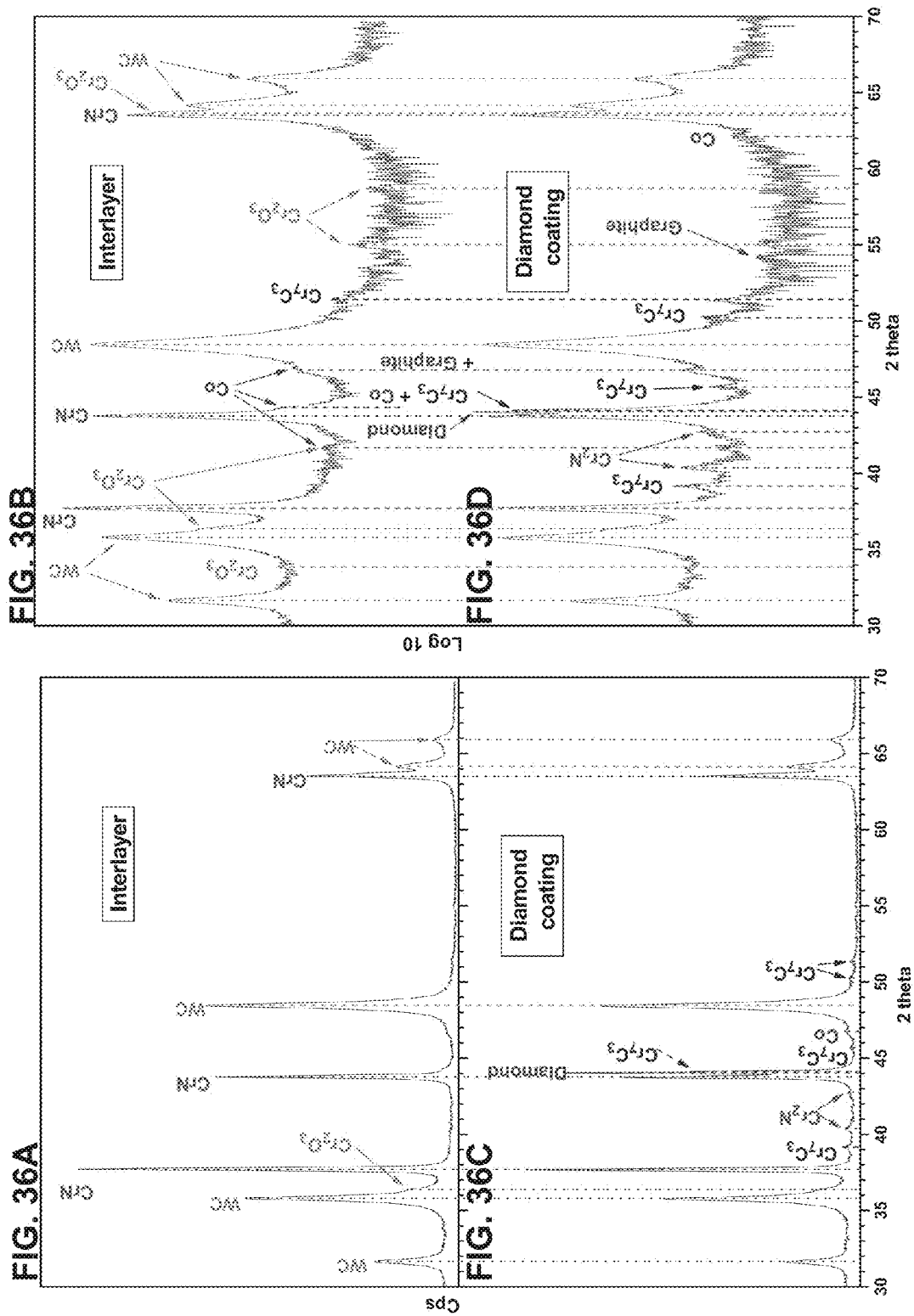

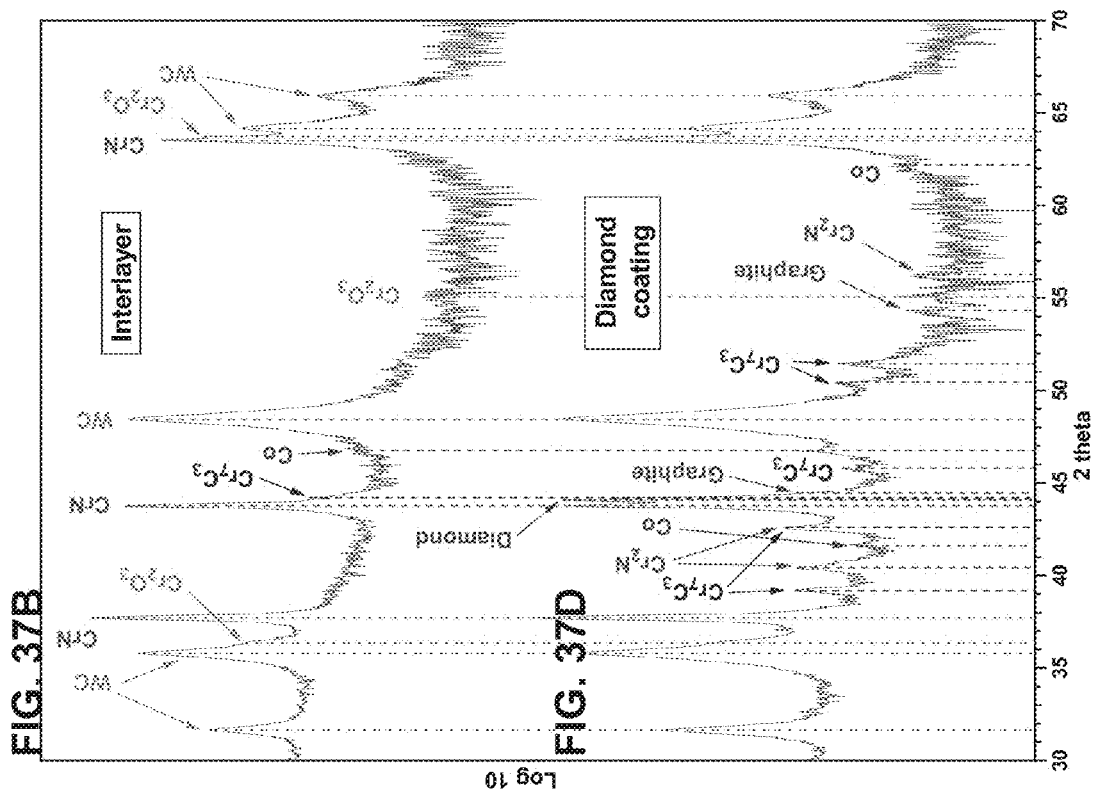
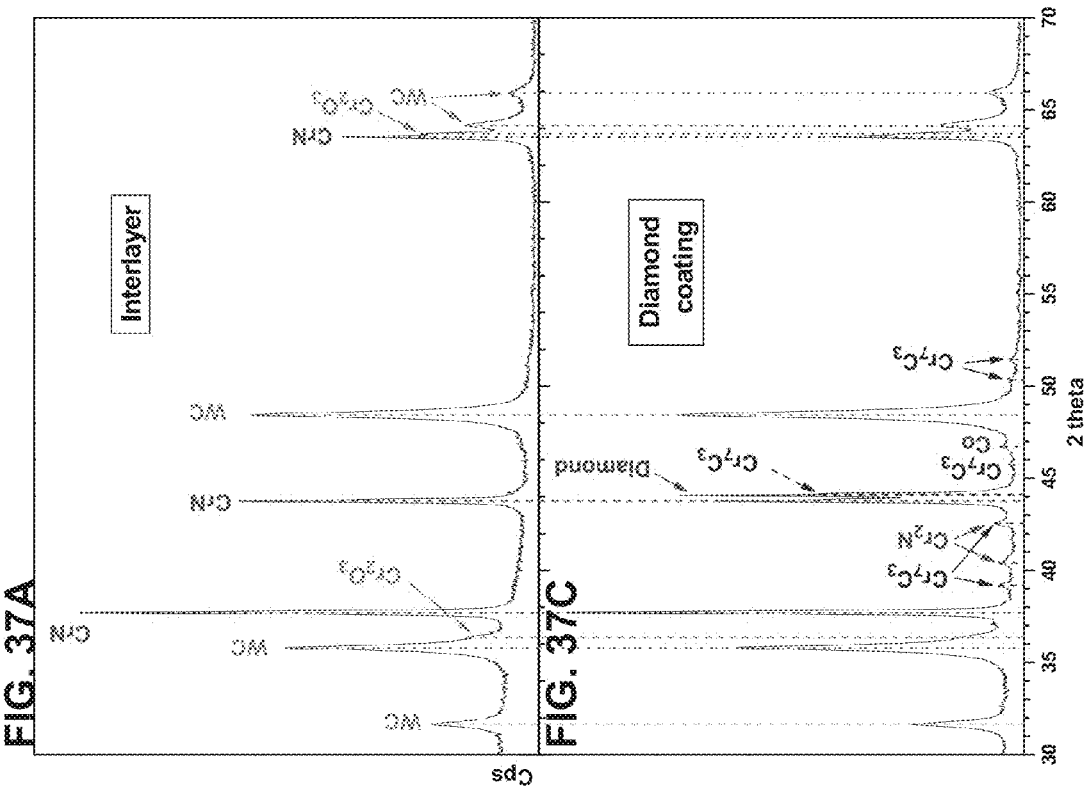

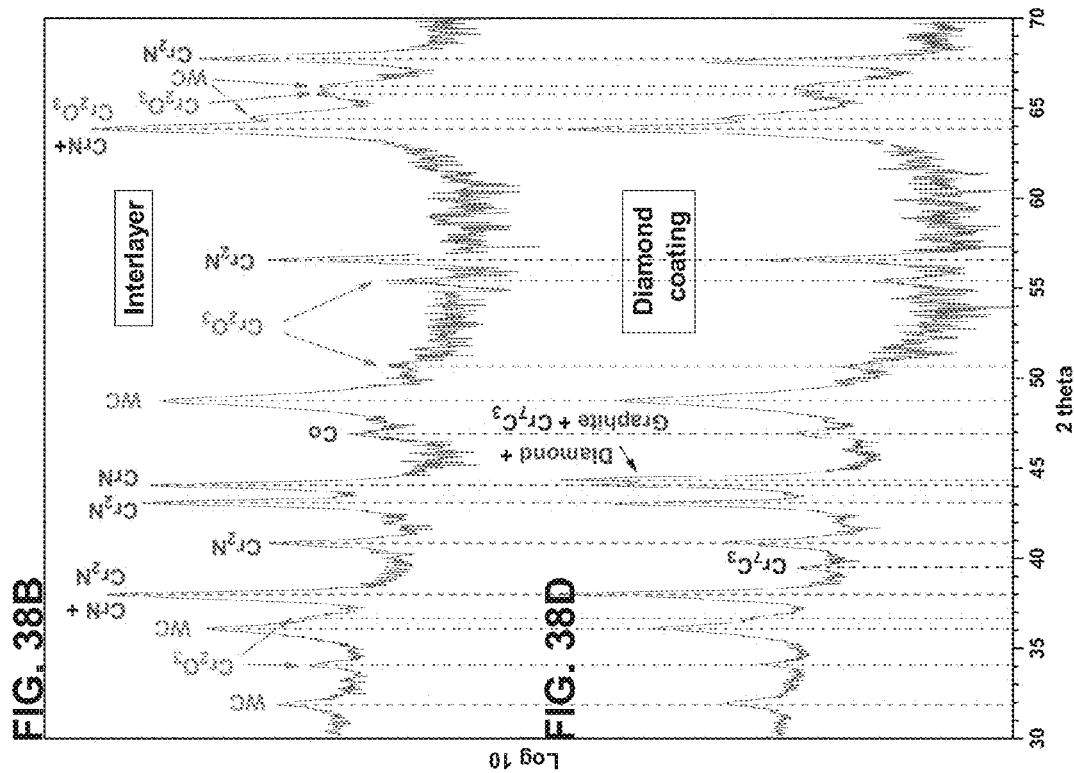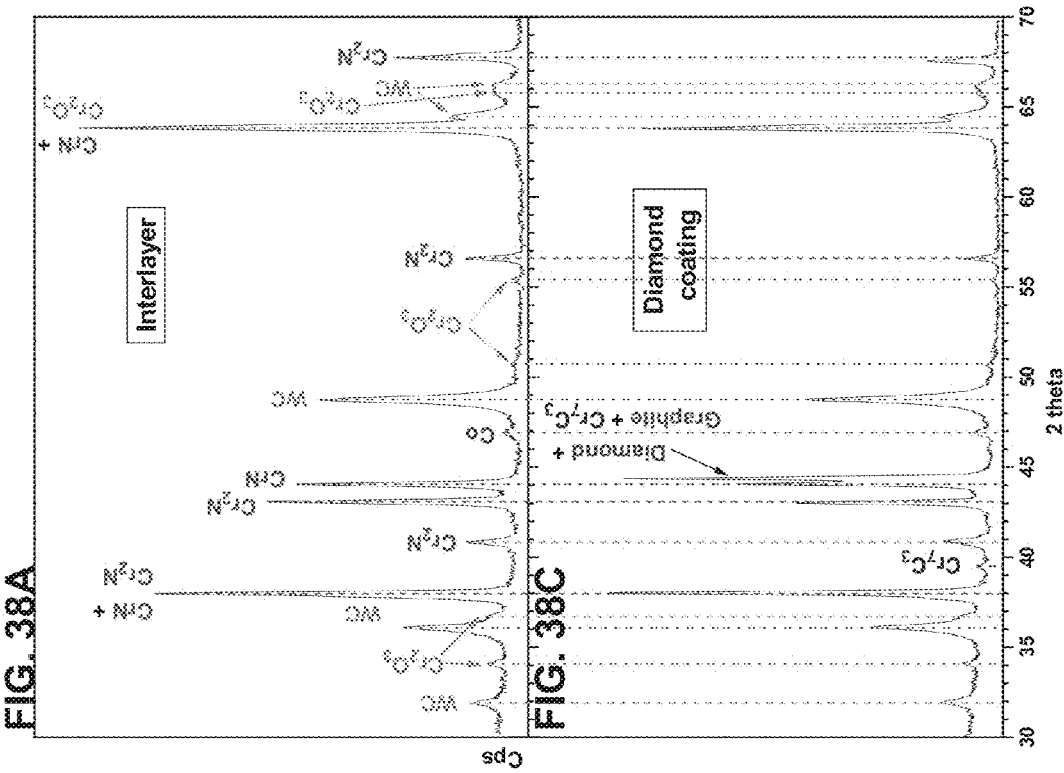

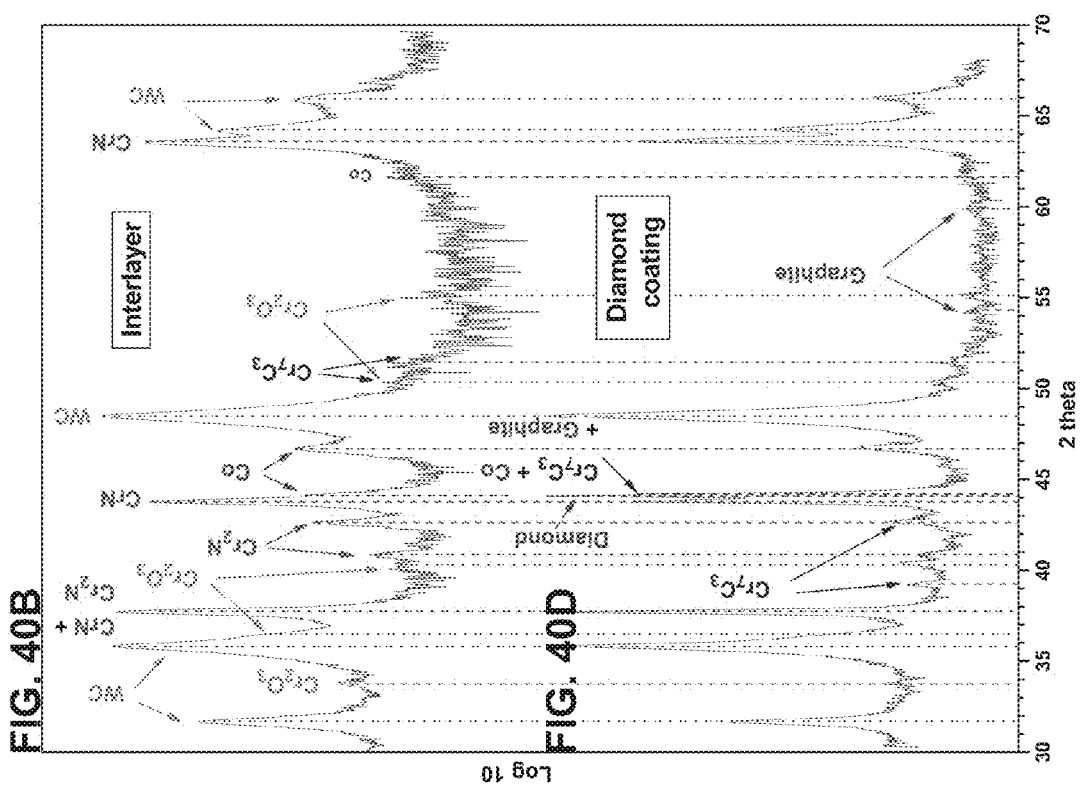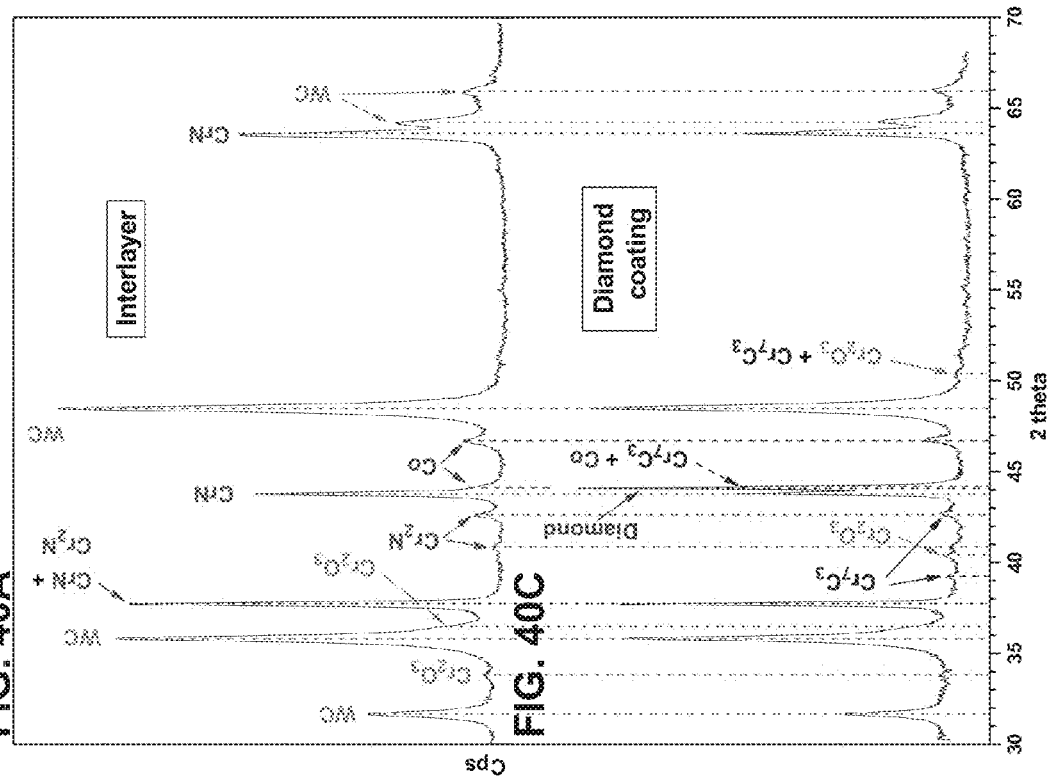

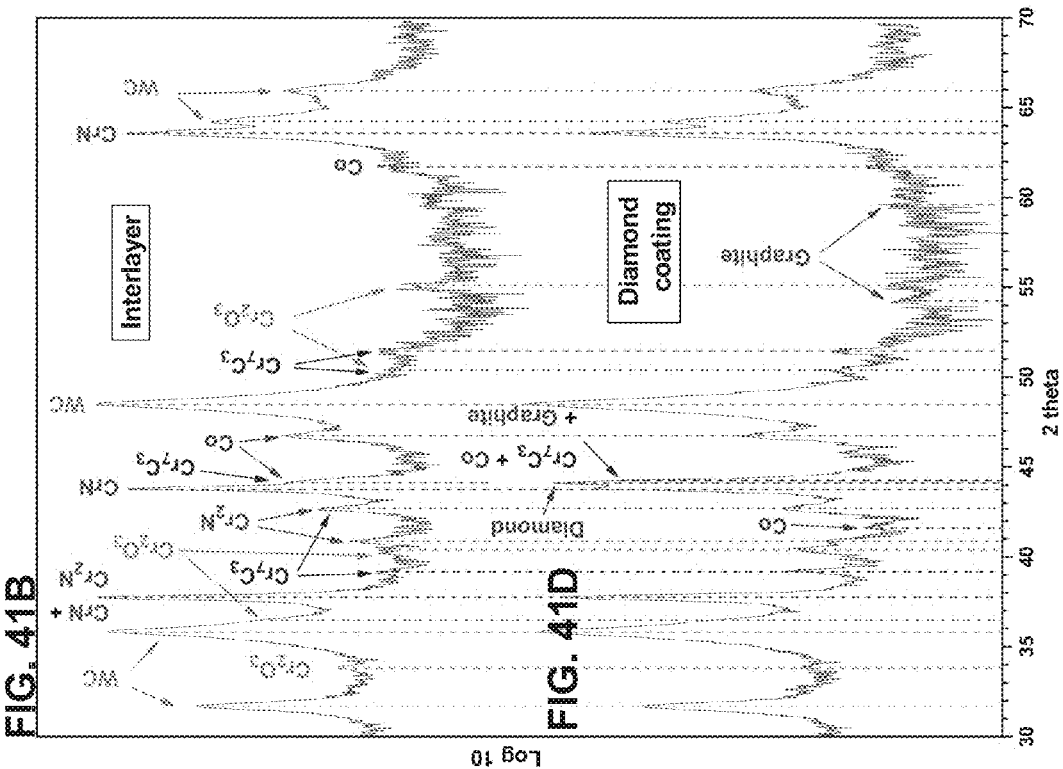
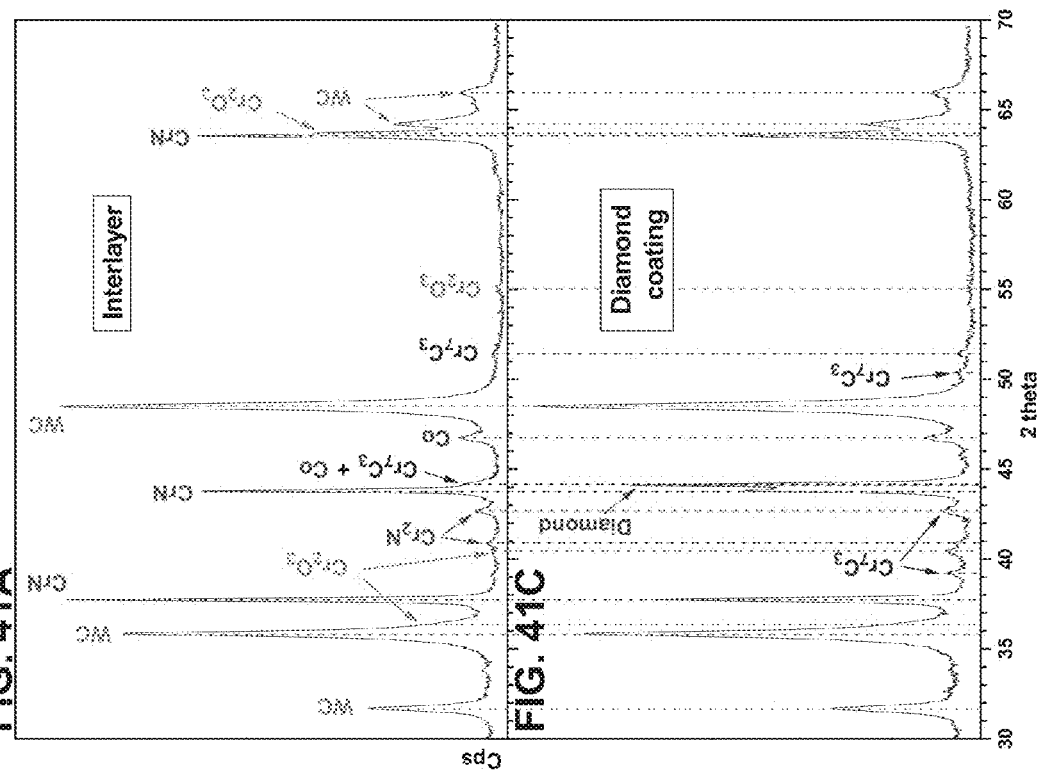

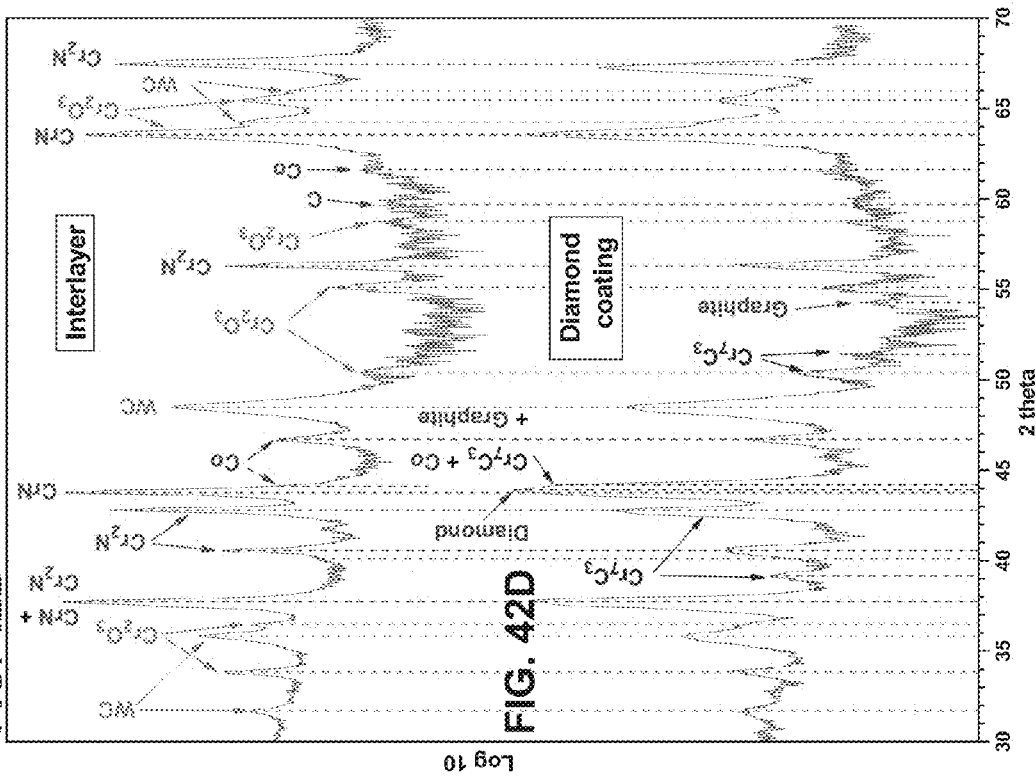
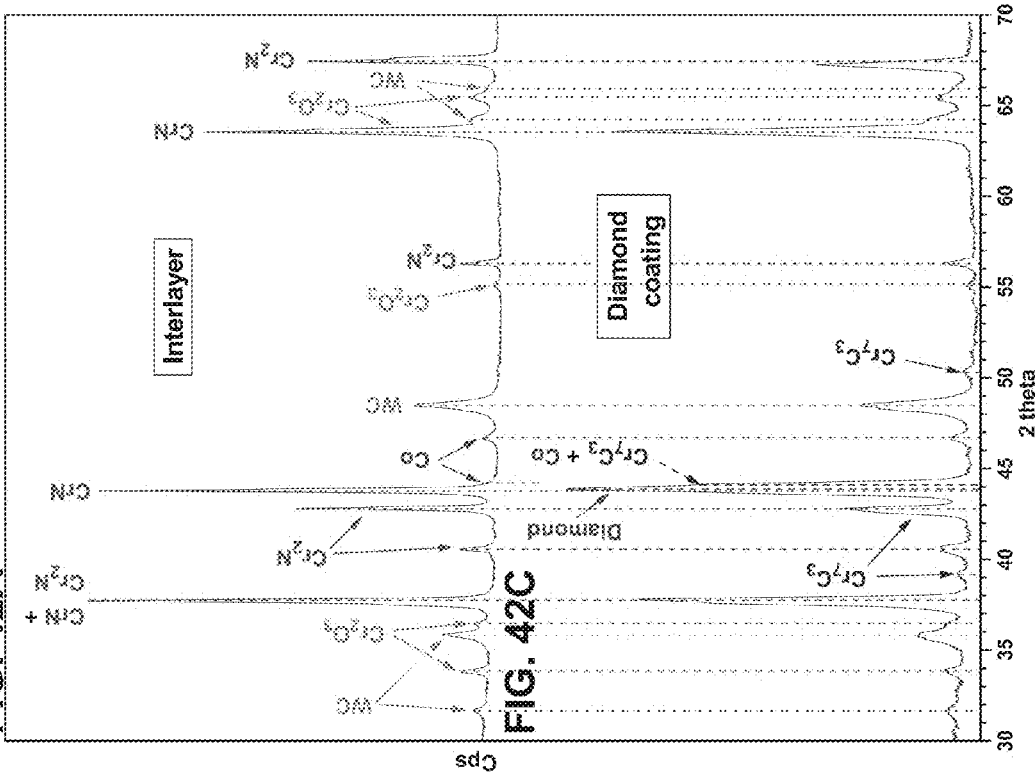

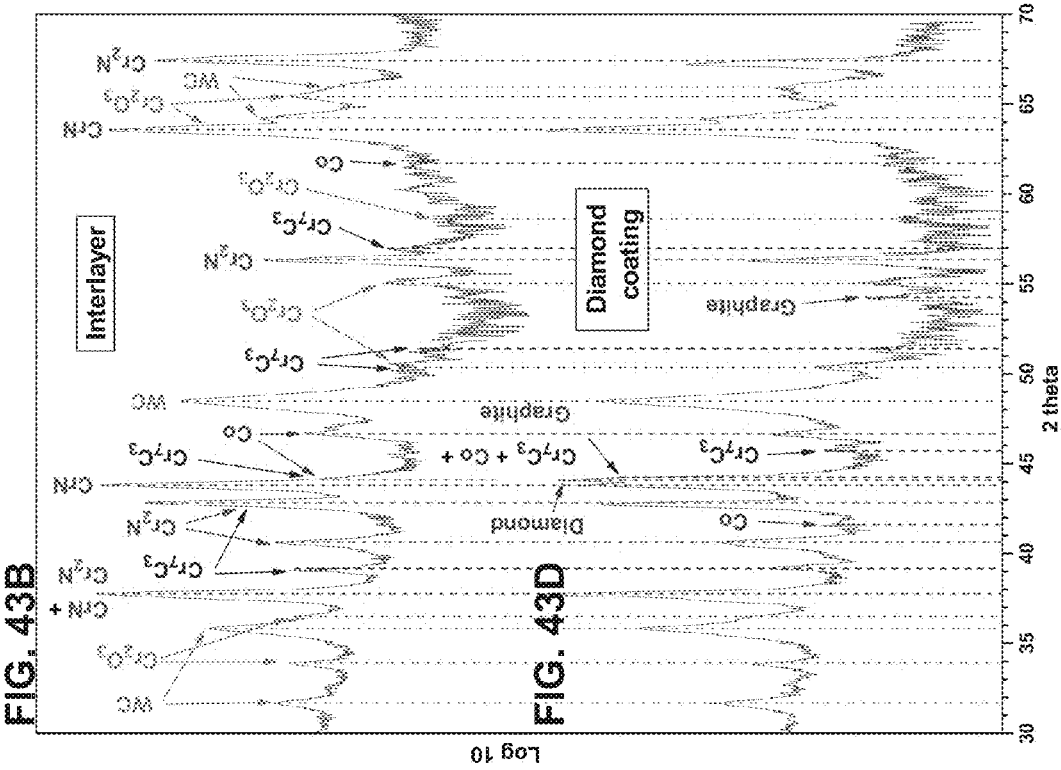
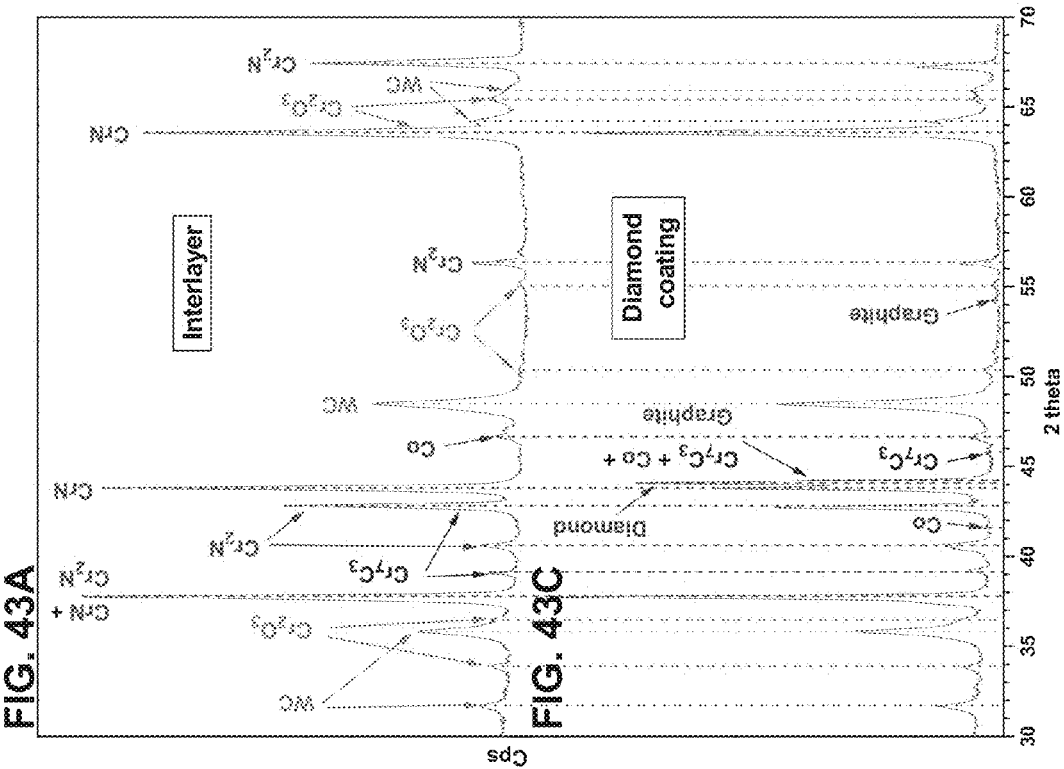

DIAMOND-COATED SUBSTRATES

RELATED APPLICATIONS

This application is a National Phase of PCT Patent Application No. PCT/IL2013/050627 having International filing date of Jul. 22, 2013, which claims the benefit of priority under 35 USC §119(e) of U.S. Provisional Patent Application No. 61/674,351 filed on Jul. 22, 2012. The contents of the above applications are all incorporated by reference as if fully set forth herein in their entirety.

FIELD AND BACKGROUND OF THE INVENTION

The present invention, in some embodiments thereof, relates to material science and, more particularly, but not exclusively, to diamond-coated substrates, processes of preparing same and uses thereof.

The industrial use of diamond films for coating various substrates increases constantly due to its special characteristic properties. Diamond is a unique substance owing to its exceptional optical, mechanical, thermal and electrical properties, and particularly due to its structure which confers high hardness and good resistance to mechanical wear, damage and mechanical stresses. The diamond's high wear resistance makes it a preferred candidate for high-impact applications in the form of thin diamond coatings on hard substrates for making tools such as, for example, drill bits, surface polishing pads, cutting edges and blades, earth-boring machines and various other articles and tools.

Diamond-coated articles are commonly prepared by forming a layer of polycrystalline diamond (diamond film) to the surface of a substrate material. Polycrystalline diamond films can be formed by chemical vapor deposition (CVD) of carbon at specific temperatures and pressures. Carbon CVD is essentially based on contacting a surface of a substance susceptible to carbon vapors, namely to a carbon-containing gas. A substance susceptible to carbon vapors is a substance which is not inert to the carbon-containing gas, and thus do not retard or prevent carbon absorption into a surface thereof, which is needed for initial diamond formation and the subsequent diamond film deposition and growth. On the other hand, if a substrate is prone to absorb carbon, this advantageous trait may become disadvantageous since an accelerated carbon absorption during carbon deposition may tip the dynamic equilibrium such that carbon accumulation on the surface of the substrate is disfavored, and/or such that competing thermodynamic processes, favoring the formation of carbides and/or the more thermodynamically stable graphite, inhibit diamond formation.

Examples of carbon vapors-susceptible metallic substrates, which allow carbon absorption, include high-speed steel (HSS) or stainless steel (SS), which are essentially alloys of iron (Fe), carbon (C) and other alloying elements. Examples of carbon vapors-absorbing composite substrate materials include cemented/sintered carbide or nitride substances, such as tungsten carbide (WC) and silicon nitride ($Si_3N_4$), which have a structure of carbide or nitride grains bound together by a metallic binder ("cement").

One example of a highly suitable composite substrate material for carbon absorption, opening the possibility to deposit a diamond film thereon, is tungsten carbide cobalt alloy (WC—Co), or tungsten carbide cemented with cobalt. In the case of substrates made of WC—Co, cobalt is present mostly between the carbide crystals as a binder, but it also covers some of the WC grains owing to the excellent wetting properties of Co and WC, hence practically, there is no WC surface free of cobalt in such a cemented carbide. Tungsten carbide (WC, often referred to colloquially as carbide) is an inorganic chemical substance containing equal parts of tungsten and carbon atoms (stoichiometric mixture). Tungsten carbide is approximately three times stiffer than steel, with a Young's modulus of approximately 550 GPa, and is much denser than steel or titanium. It is comparable with corundum ($\alpha$-$Al_2O_3$) or sapphire in hardness and can only be polished and finished with abrasives of superior hardness such as cubic boron nitride and diamond amongst others, in the form of powder, wheels, and compounds. Tungsten carbide is high melting, 2,870° C. (5,200° F.), extremely hard (8.5-9.0 Mohs scale, Vickers hardness number of 2242) with low electrical resistance (about $2 \times 10^{-7}$ Ohm·m), comparable with that of some metals such as vanadium $2 \times 10^{-7}$ Ohm·m). Molten cobalt can maintain contact with the solid surface of WC, which can be sintered to form the composite material WC—Co. Investigation of the phase diagram of the WC—Co system shows that WC and Co form a pseudo binary eutectic. The phase diagram also shows that there are so-called $\eta$-carbides with composition (W,Co)6C that can be formed and the fact that these phases are brittle is the reason why control of the carbon content in WC—Co hard metals is important.

Diamond coatings are typically performed by chemical vapor deposition (CVD) which is typically carried out at elevated temperatures, e.g., 600-800° C., in the atmosphere of methane and hydrogen as a source of atomic carbon and hydrogen. The formation of diamond films by CVD onto non-diamond substrates consist of two sequential processes: nucleation and growth. The nucleation process is usually achieved by seeding the substrate surfaces with very small diamond particles in the nanometer range. The growth or CVD process consists of exposing the surface to the activated hydrocarbon at well defined substrate temperatures and deposition time. The thickness of the diamond films is determined by the particular deposition conditions, i.e. degree of gas activation and composition at the growing surface, substrate temperature and deposition time.

Good adhesion of the deposited diamond coatings onto appropriate substrates is an important factor in all diamond-coated tool and device applications. Without strong bonding to the substrate, the coating will not endure harsh mechanic stress and will eventually delaminate.

One cause for poor adhesion of the diamond film to the substrate is thermal expansion of the composite system. Upon cooling from diamond deposition temperature to ambient temperature, the dimensions of the coated object change due to shrinkage, while the extent of shrinkage is governed by the coefficient of thermal extension (CTE). Typically the CTE's of the diamond coating and that of preferred substrates differ substantially. For example, HSS and SS substrates have CTE of approximately $13 \times 10^{-6}$, and cemented carbide substrates have CTE of about $3 \times 10^{-6}$, both large values compared with the CTE of about $0.3 \times 10^{-6}$ measured for diamond. Hence, due to large difference between the CTE's of the coating and substrate, the substrate shrinkage is more extensive compared to the diamond's coating film, and therefore the diamond coating develops high level of compressive residual stress. This incompatibility in CTE and resulting residual stress buildup limit the thickness of the diamond coating and typically leads to delamination, namely detachment of the film from the substrate.

Thus, due to diamonds exceptional mechanical properties of low thermal extension coefficient, high compressive strength, hardness and wear resistance, compared to the properties of the substrate's material, existing diamond-coated tools and articles typically fail due to insufficient strength of the interface between the diamond coating and the substrate, rather than wear of the diamond coating itself. Therefore, one of the persistent problems still plaguing modern diamond coating technologies is the generally poor adhesion owing to stresses which result from thermal expansion.

Another cause for poor adhesion of the diamond coating film to the substrate stems from chemical considerations. It has been established that iron and cobalt, which are typically used as binders in cemented carbides, act as catalysts converting the diamond into graphite. This detrimental catalytic effect leads to the formation of the layer of graphitic carbon and degrades the adhesion of diamond to steel and cemented carbide substrates. As a result of the described catalytic affect, the direct deposition of diamond on steel or cemented carbide substrate results in the formation of a non-adhering layer of graphitic soot covered by poor-quality diamond. Also, high diffusion rate of carbon atoms into the iron- or cobalt-containing substrate leads to loss of carbon atoms from the interface, leaving voids behind and degrading the interface strength even further.

Thus, current diamond coating methodologies which utilize cemented carbide substrates also suffer from incompatibility between the chemistry and microstructure of the diamond coating and that of the substrate due to carbon diffusion and the formation of a non-adhering layer of graphite.

To achieve a good adhesion between the diamond film and the carbide substrate, it is essential to limit the carbon-cobalt interaction with the CVD conditions and therefore with the diamond film. In addition, in order to obtain good adhesion between the diamond film and the substrate, it is essential to relieve the thermo-mechanical stress during cooling, and limit the carbon-catalyst interaction during the CVD conditions. To date, this has been achieved by (i) depletion of the catalyst from the surface; or (ii) by applying an interlayer between the substrate and the deposited diamond film. Other attempts at overcoming the chemical incompatibility included use of alternative carbide binders.

For example, Shi, C. R. et al. [*Diam. Rel. Mat.*, 4 (1995) 1079-1087] teach a continuous well-adhering high-quality diamond films grown on sintered tungsten using a Ni—Fe binder.

U.S. Pat. Nos. 5,523,158, 5,523,159, 5,547,121, 5,567,525 and 5,738,698 teach the use of a vanadium containing braze to increase the reliability of a braze joint formed between a diamond film and a tungsten carbide surface.

The use of interfacial layers, or interlayers, acting as diffusion barriers has been proposed to improve the adhesion of diamond coatings to some of the aforementioned materials. These layers are interposed between the substrate and the diamond coating. However, some of these interfacial layers do not form chemical bonds with diamond and therefore do not provide good adhesion between the diamond coating and the substrate. As a result, the adhesion between diamond coating and the substrate remains a problem. Moreover, some interfacial layers do not provide stress relieve for diamond coating and do not prevent the residual stress buildup due to incompatible CTEs. Thus, upon the cooling to ambient temperature the diamond coating deposited on a substrate with some interfacial layer is under high residual stress, which limits the coating thickness and may lead to its delamination, as mentioned above.

One solution to the problem of diamond deposition onto steel is utilization of an intermediate layer between the substrate and the deposited film. which consists of a nitridized chromium and results in a chromium nitride interlayer composed of a composite crystalline CrN and $Cr_2N$ film, as described, for example, in Fayer, A. et al., *Appl. Phys. Lett.*, 67, 1995, 2299-2301; Weiser, P. S. et al., *Surf. Coat. Techn.*, 71, 1995, 167-174; Glouzman O., et al., *Diam. Rel. Mat.*, 6, 1997, 796-801; Gluzman, O. et al., *Diam. Rel. Mat.*, 7, 1998, 597-602; Glouzman O., et al., *Israel J. Chem.*, 38, 1998, 75-84; Glouzman O., et al., *Diam. Rel. Mat.*, 8, 1999, 859-864; and Kreins, L. et al., *Diam. Rel. Mat.*, 13(9), 2004, 1731. In these studies it was found that for the interlayer to afford formation of well adhered diamond film, the interlayer must act as a diffusion barrier, and therefore must be thick enough, about 20 microns, in order for it to fulfill that role. However, although diamond film was formed on steel utilizing a chromium nitride interlayer, the required thickness of the interlayer meant that fine structural features in the substrate, such as corners, curves and sharp edges, typically measuring in the 5-50 micron range, would become "fuzzy", loosing definition due to the thickness of the thick interlayer.

U.S. Pat. No. 7,195,817 teaches diamond-coated steel or cemented carbide substrates, wherein adhesion of the diamond film is improved by use of a combination of interlayers disposed between the diamond coating and the substrate in order to alleviate thermal expansion stresses and inhibit the diffusion of carbon and other species between the substrate and the forming diamond film. The proposed combination of interlayers is taught to provide both mechanical stress relief based on the presence of a metallic interlayer, and inhibition of graphite formation based on the presence of a ceramic interlayer. However, this reference fails to provide working examples which were shown to provide the desired result.

Additional background art includes U.S. Pat. Nos. 8,147,927, 8,147,927, 7,879,412, 5,921,856, 5,763,879, 5,997,650, 6,454,027, 6,617,271, 5,952,102 and 5,681,783, Lux, B. and Haubner, R., *Pure & Appl. Chem.*, (1994), 66(9), p. 1783-1788 and Han S. et al., *Thin Solid Films*, (2000), p. 578-584.

SUMMARY OF THE INVENTION

Although various methodologies have been proposed for solving the aforementioned problems associated with adhesion of a diamond film to cemented carbide substrates, these problems remain essentially unsolved.

The present inventor has designed and successfully prepared and practiced a novel methodology for diamond coating, in which adhesion of a diamond film onto cemented carbide substrates such as tungsten carbide (WC—Co) substrates is improved by means of forming an interlayer of crystalline stoichiometric chromium nitride (CrN) prior to the chemical vapor deposition of a polycrystalline diamond film thereon. The CrN is formed so as to maintain high crystallinity of the chromium nitride during all steps of the process, thereby allowing it to serve as an effective diffusion barrier between the substrate and the diamond film, as well as to promote adhesion of all the components of the composite structure. In an exemplary process, formation of the interlayer is effected by deposition of a thin metallic film of chromium of a certain thickness, followed by nitridation of the chromium by thermal activation and flowing of $NH_3$ above the chromium layer at a certain temperature and time to afford a highly crystalline CrN film. This procedure is followed by a diamond nucleation pretreatment and diamond film deposition.

The present inventor has demonstrated that the deposited diamond film displays excellent adhesion to the WC—Co substrate, presumably due to the good adhesion of the CrN interlayer to both the film and substrate and the fact that the CrN interlayer is an excellent diffusion barrier for both cobalt (emanating from the substrate) and carbon (emanating from the carbon CVD on the surface).

Without being bound by any particular theory, it is assumed that one of the requirements for good adhesion of the diamond layer to the WC—Co substrate is an intimate contact between the diamond layer and a stoichiometric and crystalline CrN form/phase of the interlayer, which is the form of chromium nitride that acts as an effective diffusion layer barrier with respect to the cobalt component in the substrate.

The resulting composite article, comprising a cemented carbide substrate coated with diamond, can be used to construct many polishing and cutting tools, mechanical seals, medical devices and the likes, which are characterized by an extended life time of the diamond coating.

Thus, according to an aspect of some embodiments of the present invention, there is provided a composite structure, which includes a cemented carbide substrate, an interlayer disposed over the substrate and a contiguous diamond film disposed over the interlayer, wherein the cemented carbide substrate includes a binder, and the interlayer includes crystalline chromium nitride, the composite structure being characterized by one or more of the following characteristics:

a thickness of the interlayer which is lower than 20 microns;

a concentration of the binder in the interlayer which is lower than 0.5 percents by weight;

a concentration of carbon in the interlayer which is lower than 0.5 percents by weight; and a co-adhesion of the diamond film to the interlayer and of the interlayer to the substrate, which is exhibited by a microhardness test at a load of at least 20 kg.

In some embodiments, the composite structure is characterized by exhibiting at least three of the peaks of an X-Ray diffraction pattern selected from the group consisting of the X-Ray diffraction patterns as presented in FIG. 36C, FIG. 37C, FIG. 38C, FIG. 39C, FIG. 40C, FIG. 41C, FIG. 42C and FIG. 43C.

In some embodiments, the composite structure is characterized by exhibiting at least five, or at least six or at least seven of the peaks of an X-Ray diffraction pattern selected from the group consisting of the X-Ray diffraction patterns as presented in FIG. 36C, FIG. 37C, FIG. 38C, FIG. 39C, FIG. 40C, FIG. 41C, FIG. 42C and FIG. 43C.

In some embodiments, the composite structure is characterized by exhibiting an X-Ray diffraction pattern substantially identical to an X-Ray diffraction pattern selected from the group consisting of the X-Ray diffraction patterns as presented in FIG. 36C, FIG. 37C, FIG. 38C, FIG. 39C, FIG. 40C, FIG. 41C, FIG. 42C and FIG. 43C.

In some embodiments, the composite structure is characterized by an X-Ray diffraction pattern as presented in FIG. 41C.

In some of any of the embodiments described herein, the concentration of the binder in the substrate is at least 2 percents by weight.

In some embodiments, the concentration of the binder in the substrate is at least 4 percents by weight.

In some of any of the embodiments described herein, the concentration of the binder in the substrate at the interface with the interlayer is at least 90 percents of a concentration of the binder at the bulk of the substrate.

In some embodiments, the concentration of the binder in the cemented carbide substrate is at least 90 percents of the concentration of the binder in an intact cemented carbide substrate.

In some embodiments, the concentration of the binder in the interlayer is lower than 0.1 percents by weight.

In some of any of the embodiments described herein, the chemical composition of the interlayer is substantially homogenous with respect to a perpendicular axis of the interlayer.

In some of any of the embodiments described herein, the chemical composition of the interlayer is characterized by a gradient with respect to the ratio of crystalline CrN to CrN along a perpendicular axis of the interlayer, namely the chromium nitride layer is characterized by a gradient going from crystalline CrN at the top side of the interlayer to CrN where X (the ratio of chromium to nitrogen) is 2 or more at the bottom of the interlayer.

In some of any of the embodiments described herein, the ratio of chromium to nitrogen in the interlayer that ranges from 0.90 to 1.50.

In some of any of the embodiments described herein, the concentration of carbon in the interlayer is lower than 0.1 percents by weight.

In some of any of the embodiments described herein, the binder is selected from the group consisting of cobalt, nickel, iron and any combination thereof.

In some of any of the embodiments described herein, the cemented carbide substrate includes tungsten carbide and a binder.

In some embodiments, the binder includes cobalt.

In some of any of the embodiments described herein, the composite structure presented herein is characterized by a secondary ion mass spectrogram (SIMS) exhibiting at least one, at least two or at least three, or any of:

a concentration of carbon;

a concentration of chromium nitride;

a concentration of cobalt; and a concentration of tungsten, as determined by SIMS spectrum in FIG. 34D or FIG. 34E.

In some embodiments, the composite structure presented herein is characterized by a SIMS spectrum as presented in FIG. 34D.

In some of any of the embodiments described herein, the thickness of the interlayer is lower than 10 microns.

In some embodiments, the thickness of the interlayer ranges from 1 micron to 2 microns.

In some of any of the embodiments described herein, the composite structure presented herein includes a single interlayer interposed between the substrate and the diamond film.

According to another aspect of some embodiments of the present invention, there is provided a process of preparing any of the composite structures presented herein, the process is effected by:

depositing a layer of metallic chromium onto a surface of the cemented carbide substrate, to thereby form a cemented carbide substrate having a layer of metallic chromium deposited onto its surface;

nitridizing (converting into a nitride) the layer of metallic chromium by exposing the cemented carbide substrate having the layer of metallic chromium deposited onto its surface to gaseous ammonia, at a temperature of at least 700° C., to thereby form the cemented carbide substrate having a layer of chromium nitride deposited on its surface; and depositing the contiguous diamond film onto the layer of chromium nitride, thereby preparing the composite structure.

In some of any of the embodiments described herein, depositing the layer of metallic chromium is effected by a physical vapor deposition (PVD) method.

In some embodiments, the PVD method is selected from the group consisting of sputter deposition, magnetron sputtering and cathodic arc.

In some of any of the embodiments described herein, depositing the layer of metallic chromium is effected by magnetron sputtering.

In some embodiments, the magnetron sputtering is effected at a substrate temperature that ranges from 130° C. to 170° C.

In some embodiments, the magnetron sputtering is effected at 150° C.

In some embodiments, the magnetron sputtering is effected at a rate that ranges from 0.5 micron/hour to 2 microns/hour.

In some embodiments, the magnetron sputtering is effected at a rate of 1 micron/hour.

In some of any of the embodiments described herein, depositing the layer of metallic chromium is effected such that a thickness of the layer of metallic chromium is lower than 20 microns.

In some embodiments, depositing the layer of metallic chromium is effected such that a thickness of the layer of metallic chromium is lower than 10 microns.

In some embodiments, depositing the layer of metallic chromium is effected such that a thickness of the layer of metallic chromium ranges from 1 micron to 2 microns.

In some of any of the embodiments described herein, exposing to ammonia is effected by exposing the cemented carbide substrate having the layer of metallic chromium deposited onto its surface to ammonia at a flow ranging from 200 sccm to 500 sccm.

In some embodiments, exposing to ammonia is effected by exposing the cemented carbide substrate having the layer of metallic chromium deposited onto its surface to ammonia at a flow of 350 sccm.

In some embodiments, exposing to ammonia is effected by exposing the cemented carbide substrate having the layer of metallic chromium deposited onto its surface to ammonia at a pressure that ranges from 100 to 300 Torr.

In some embodiments, exposing to ammonia is effected by exposing the cemented carbide substrate having the layer of metallic chromium deposited onto its surface to ammonia at a pressure of 200 Torr.

In some of any of the embodiments described herein, exposing to ammonia is effected by exposing the cemented carbide substrate having the layer of metallic chromium deposited onto its surface to ammonia at a temperature that ranges from 600° C. to 1000° C.

In some of any of the embodiments described herein, exposing to ammonia is effected for a time period that ranges from 30 minutes to 90 minutes.

In some embodiments, exposing to ammonia is effected for a time period of 60 minutes.

In some of any of the embodiments described herein, the process is further effected by cleaning the surface of the cemented carbide substance prior to depositing the layer of metallic chromium.

In some embodiments, the cleaning step is effected by sand blasting the surface.

In some of any of the embodiments described herein, the process is further effected by carbidizing (converting into a carbide) the layer of chromium nitride prior to the step of depositing the contiguous diamond film onto the layer of chromium nitride.

In some embodiments, the carbidizing step is effected by:

heating the cemented carbide substrate having a layer of chromium nitride deposited on its surface to a temperature that ranges from 500° C. to 800° C.;

exposing the substrate to a thermally activated gas mixture of methane and hydrogen at a volume ratio that ranges from 1:90 to 1:99 for a time period that ranges from 10 minutes to 20 minutes.

In some of any of the embodiments described herein, the process is further effected by seeding the layer of chromium nitride with diamond particles by contacting the layer of chromium nitride with an abrasive slurry prior to depositing the diamond film.

In some embodiments, the abrasive slurry includes diamond particles.

In some embodiments, the diameter of the diamond particles is less than 0.25 μm.

In some of any of the embodiments described herein, the step of depositing the contiguous diamond film onto the layer of chromium nitride is effected by:

heating the cemented carbide substrate having the layer of chromium nitride deposited on its surface to a temperature that ranges from 500° C. to 800° C.; and exposing the substrate to a thermally activated gas mixture of methane and hydrogen at a volume ratio that ranges from 1:90 to 1:99.

In some embodiments, exposing to the mixture is effected by exposing the substrate to the mixture at a pressure that ranges from 40 Torr to 60 Torr.

In some embodiments, exposing to the mixture is effected for a time period that ranges from 30 minutes to 10 hours.

In some of any of the embodiments described herein, the process is effected using a cemented carbide having a binder which is selected from the group consisting of cobalt, nickel, iron and any combination thereof.

In some embodiments, the process is effected using a cemented carbide substrate which includes tungsten carbide and a binder.

In some embodiments, the process is effected using a cemented carbide wherein the binder is cobalt.

According to another aspect of some embodiments of the present invention, there is provided a composite structure prepared by the process as presented herein.

According to another aspect of some embodiments of the present invention, there is provided an article of manufacture which includes any of the composite structures presented herein.

In some embodiments, the article of manufacture is selected from the group consisting of a drill bit, an end mill, a router, a thread mill, a tap, a polishing pad, a blade, a punch head, a machining tool and a tribological tool.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

Figure 6B:
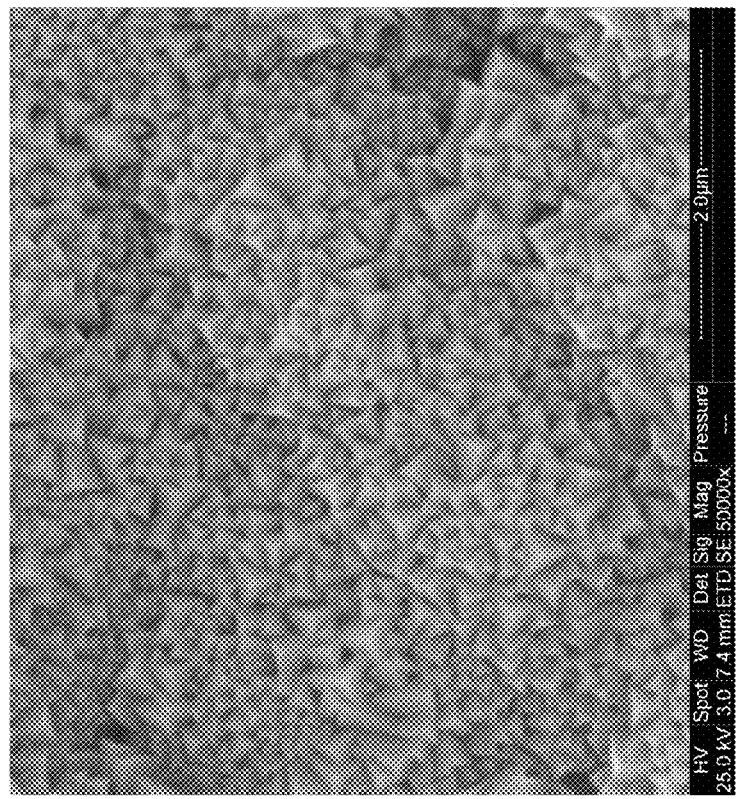
Figure 6A:
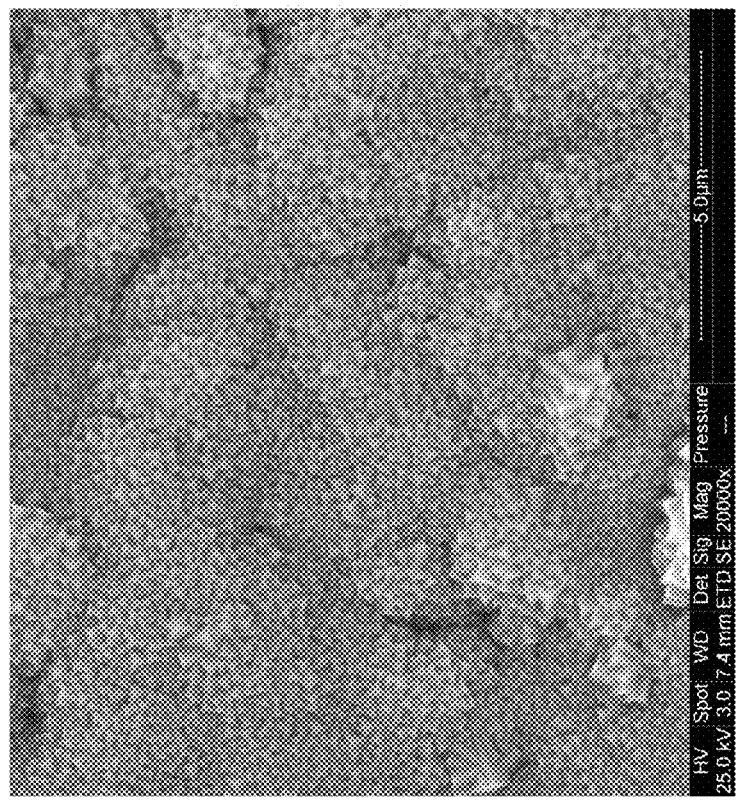
Figure 7B:
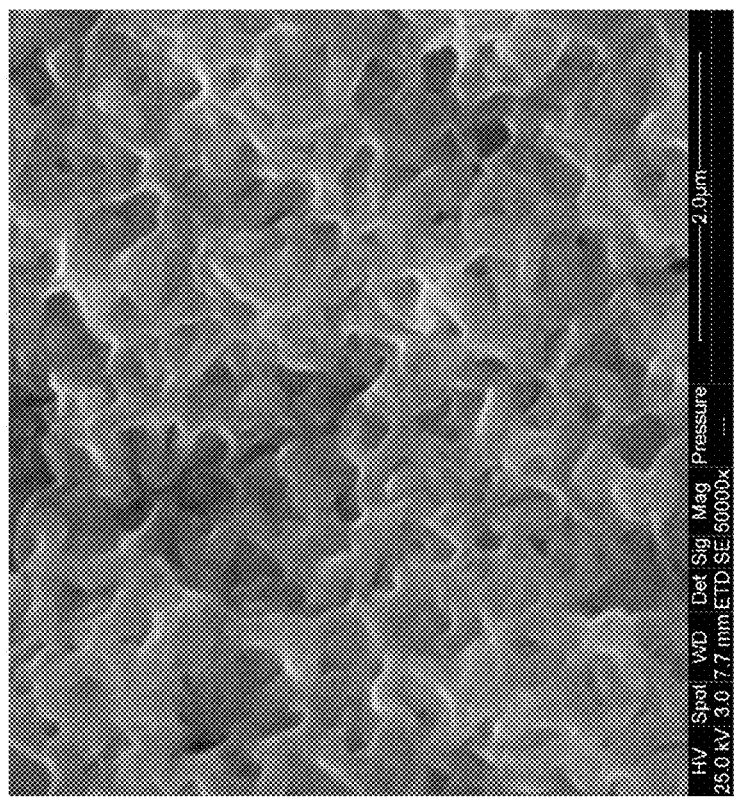
Figure 7A:
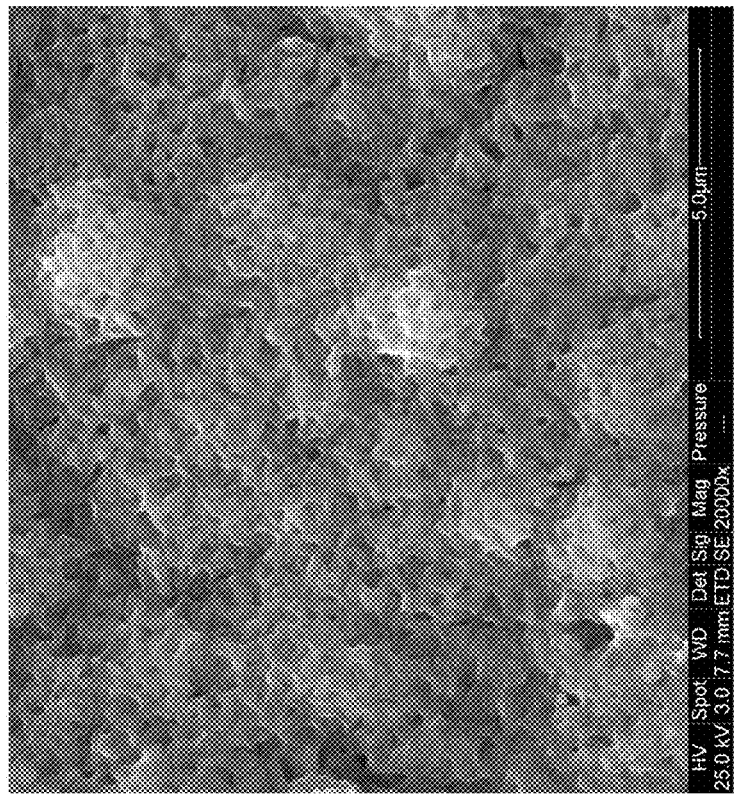
Figure 8B:
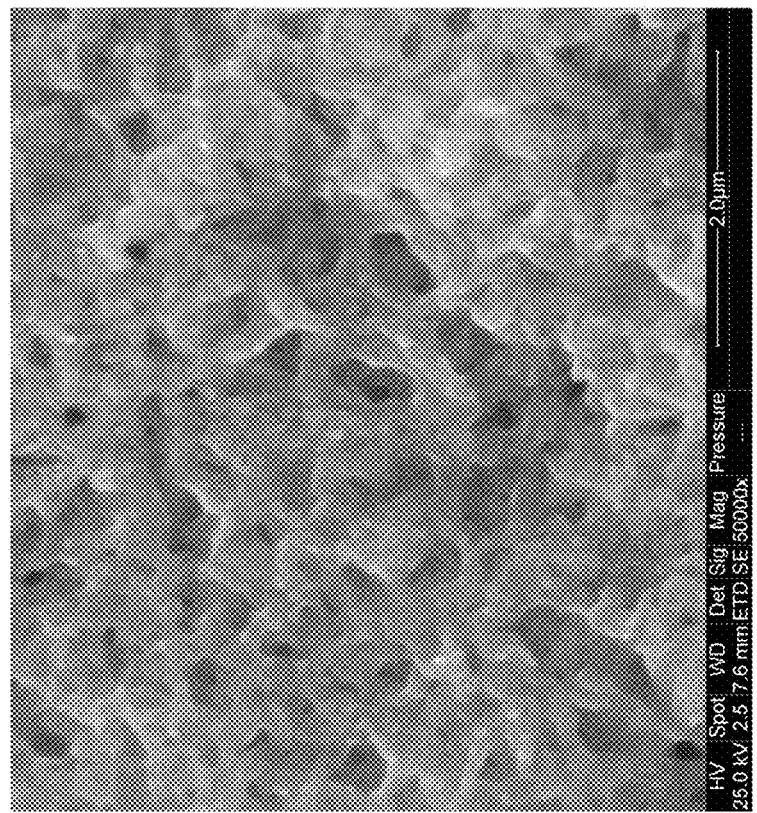
Figure 8A:
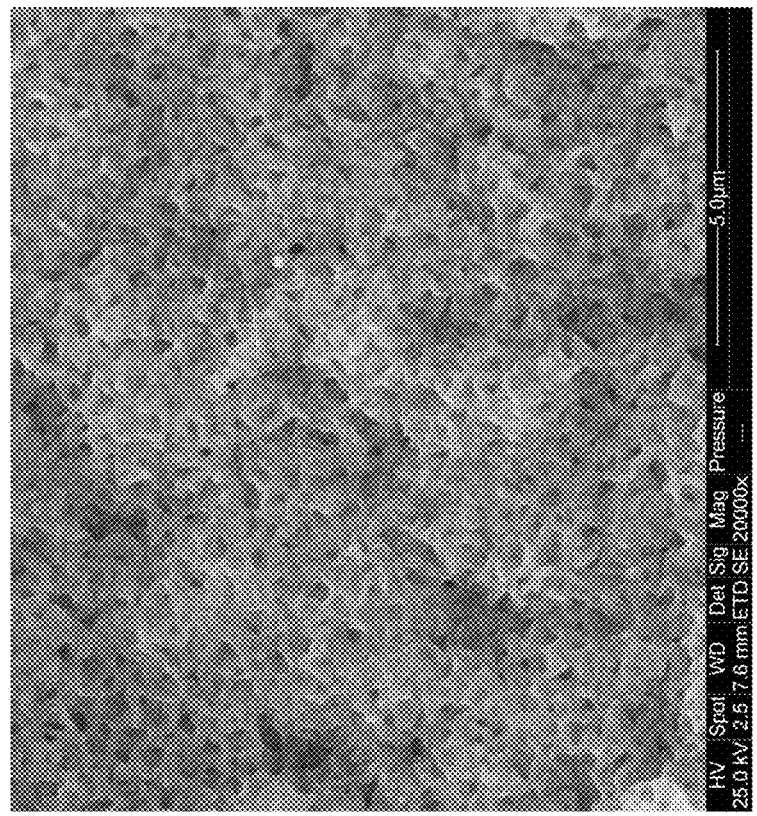
Figure 14:
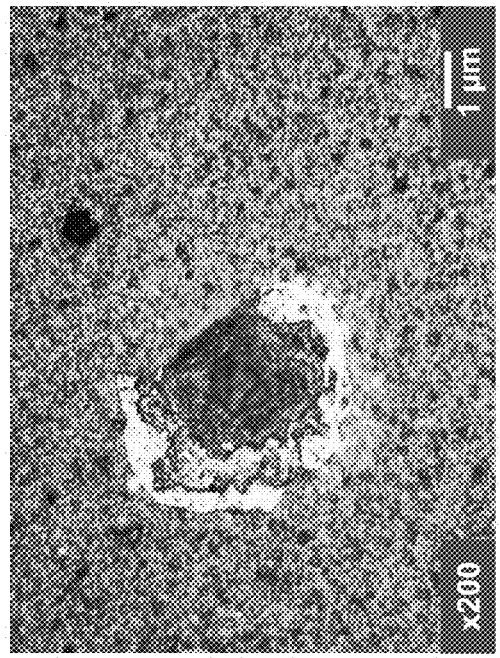
Figure 13:
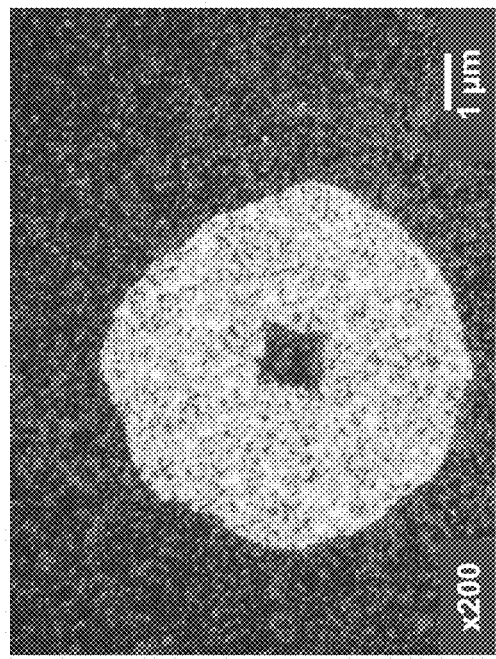
Figure 15:
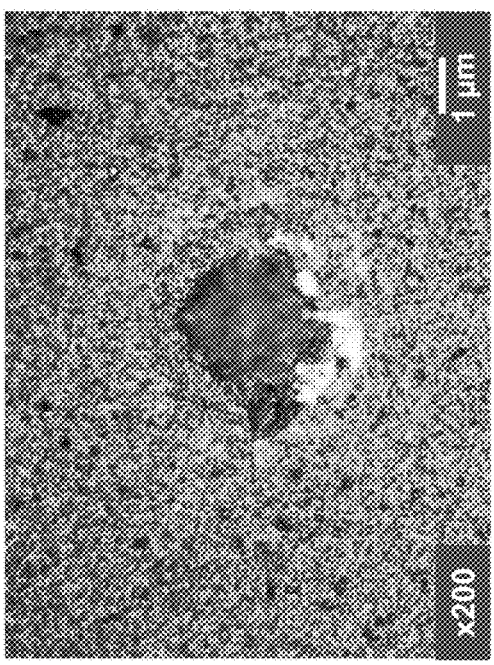
Figure 16B:
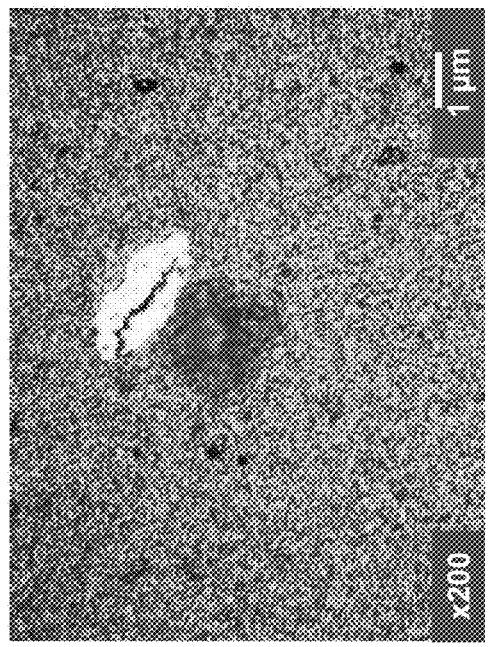
Figure 16A:
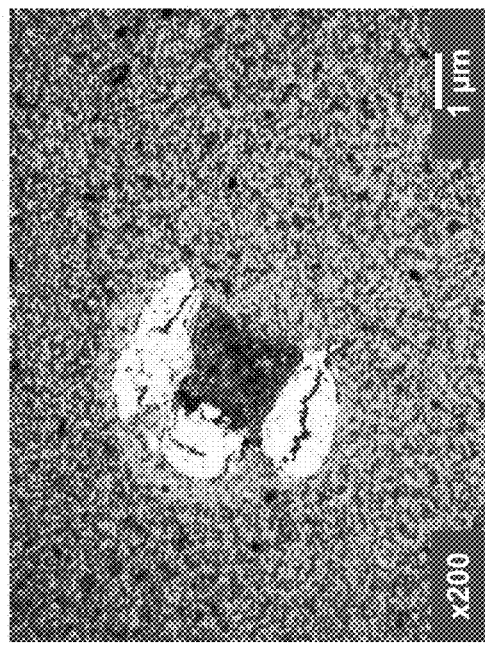
Figure 17:
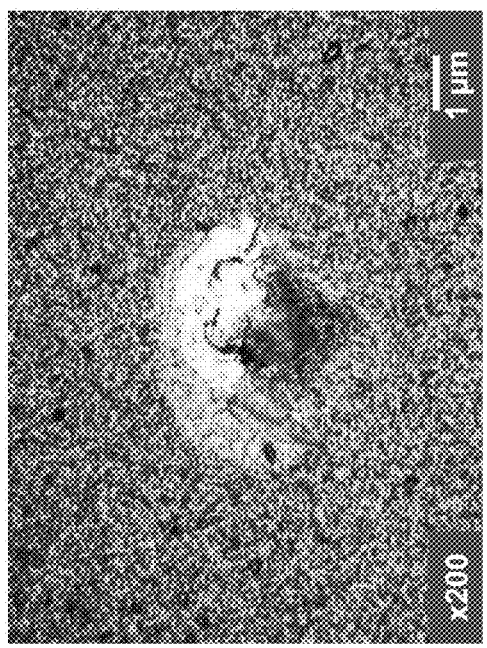
Figure 19B:
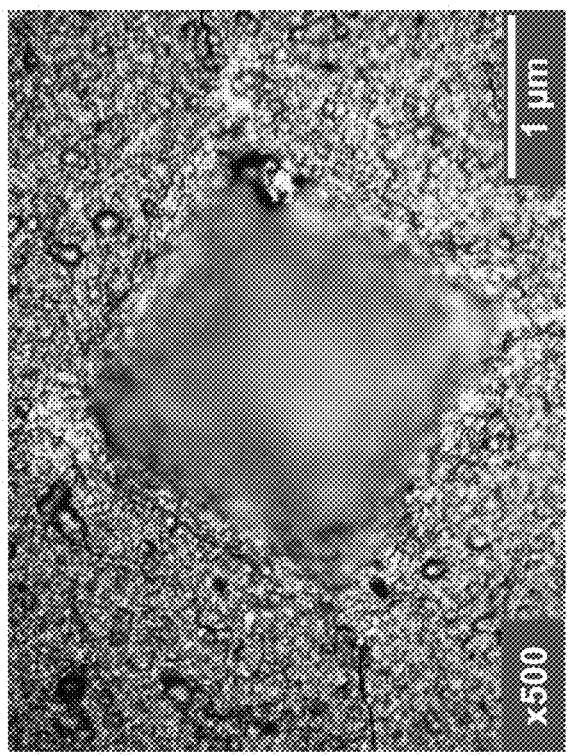
Figure 19A:
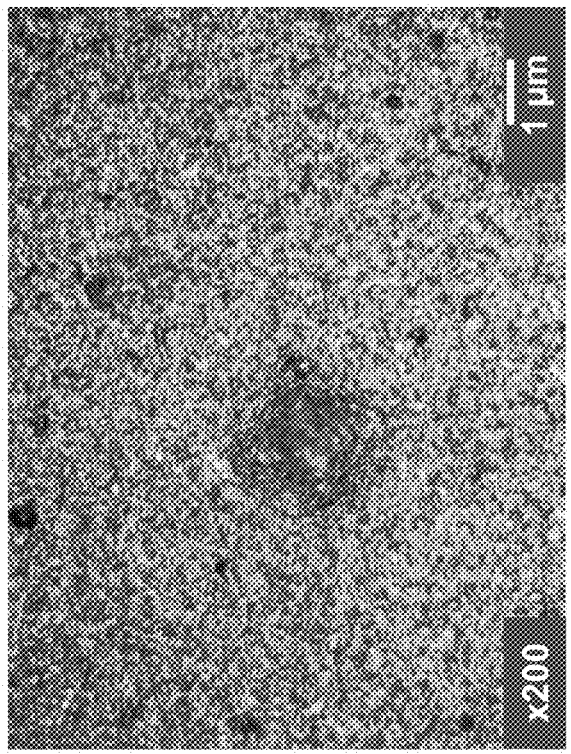
Figure 21A:
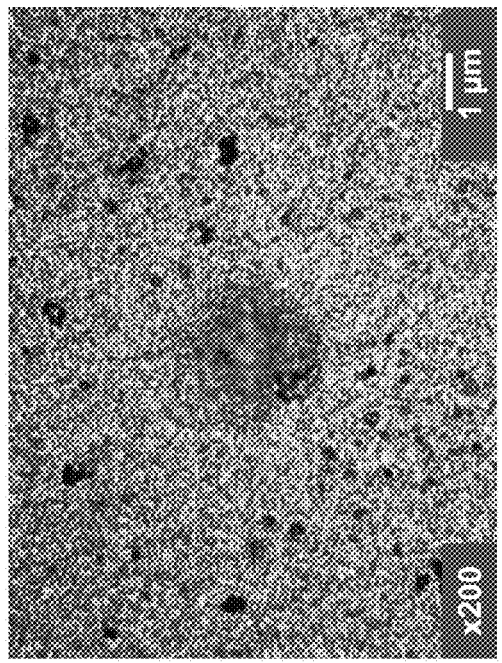
Figure 21B:
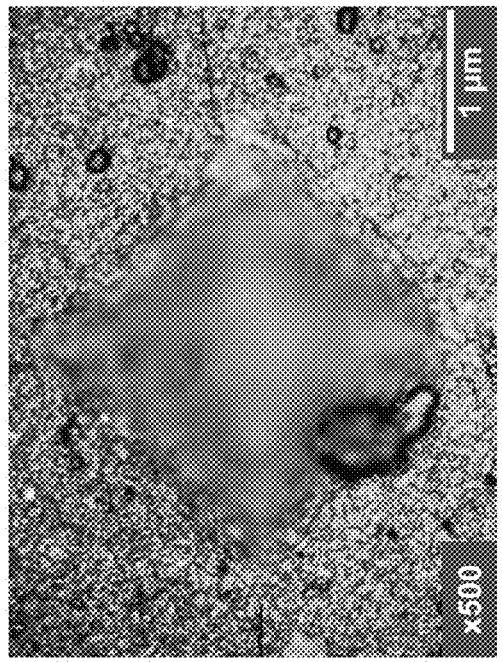
Figure 21C:
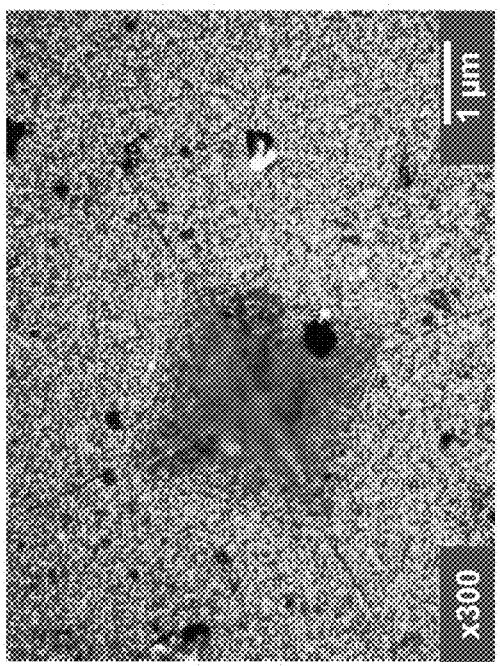
Figure 22B:
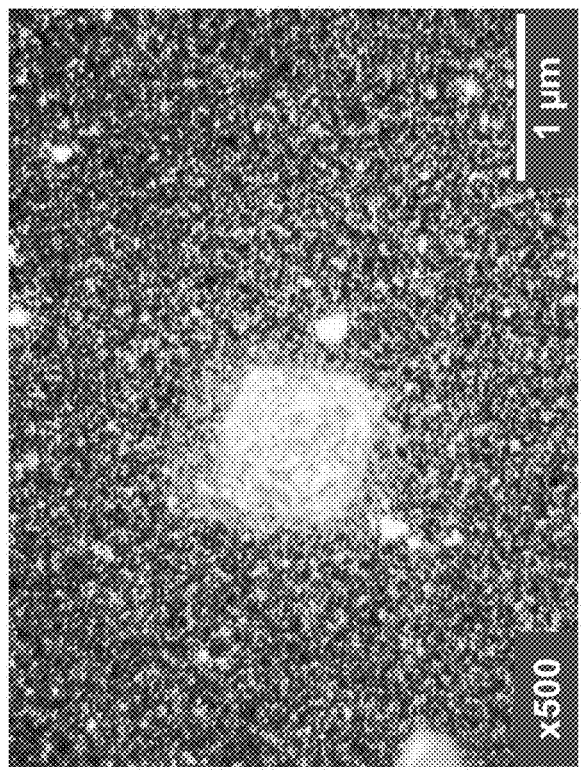
Figure 22A:
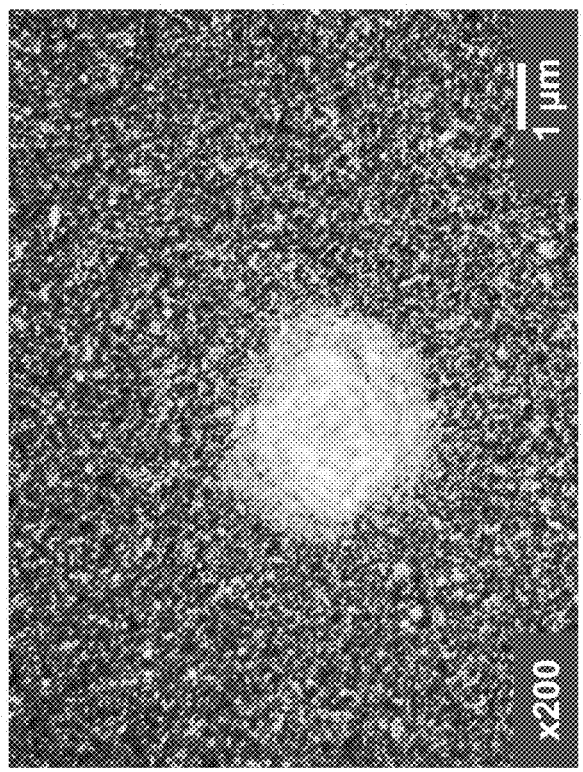
Figure 22D:
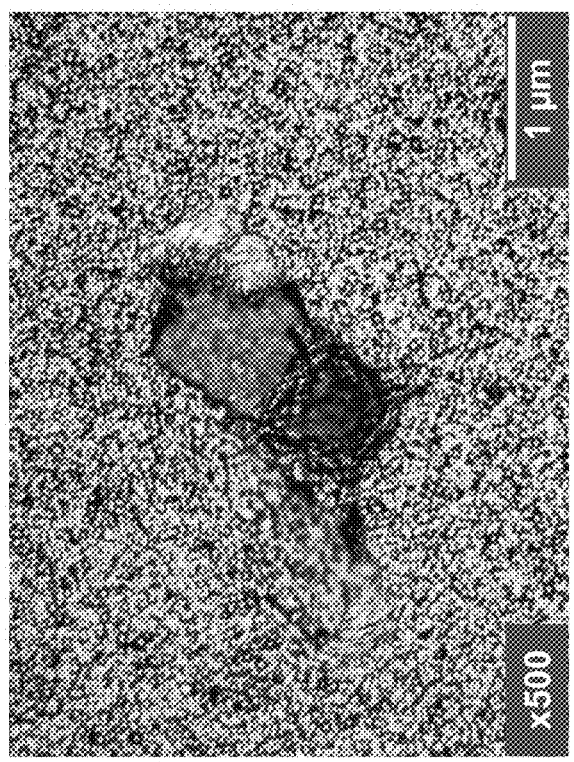
Figure 22C:
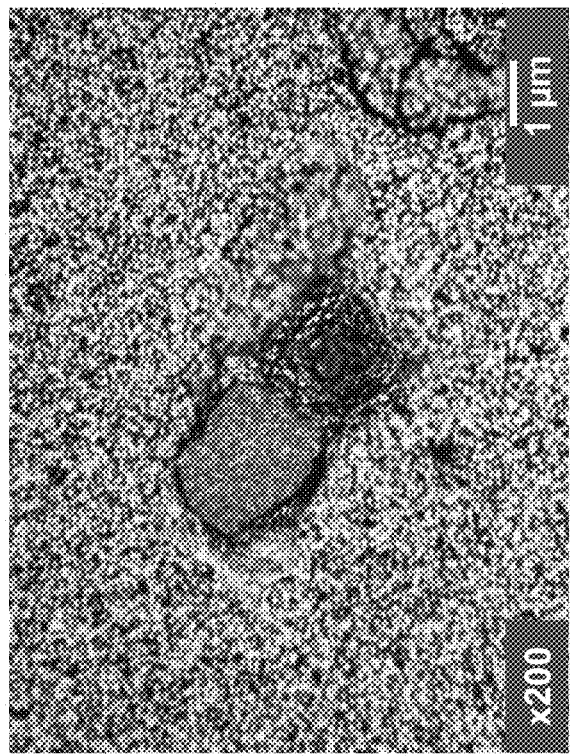
Figure 23:
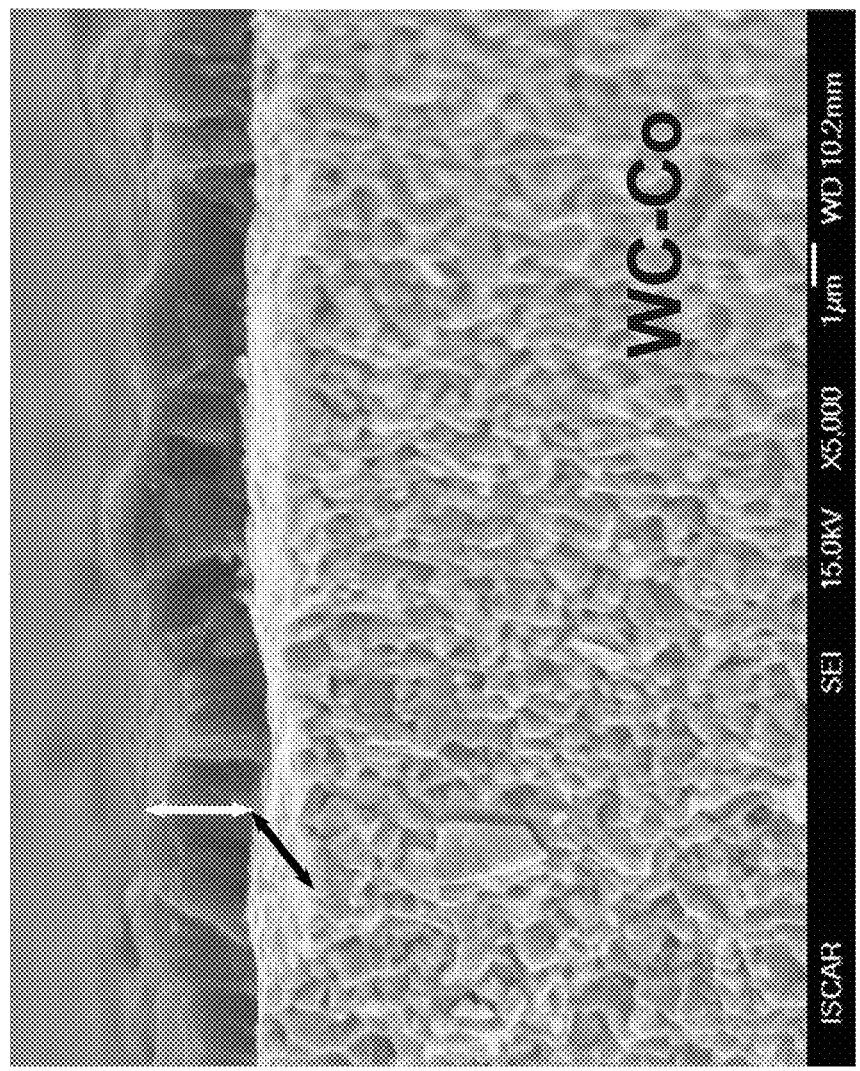
Figure 24A:
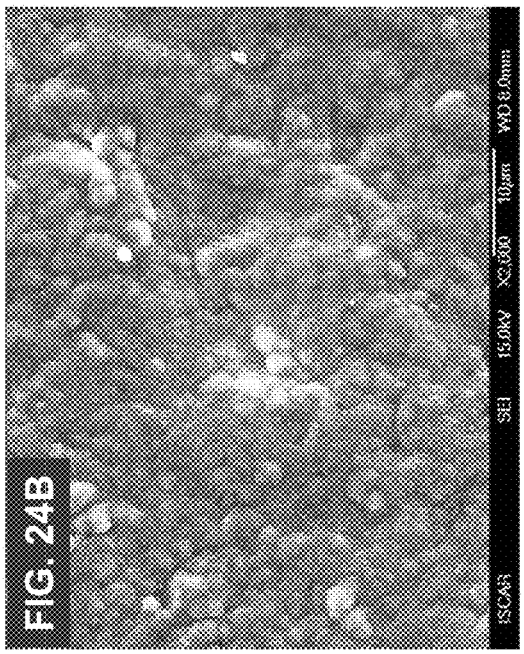
Figure 24B:
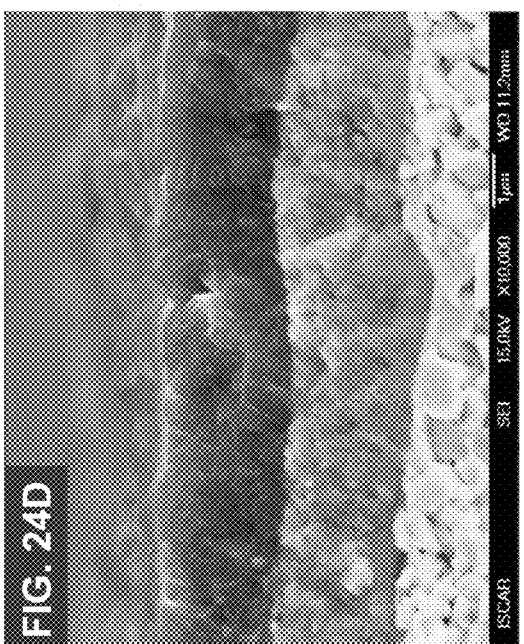
Figure 24C:
Figure 24D:
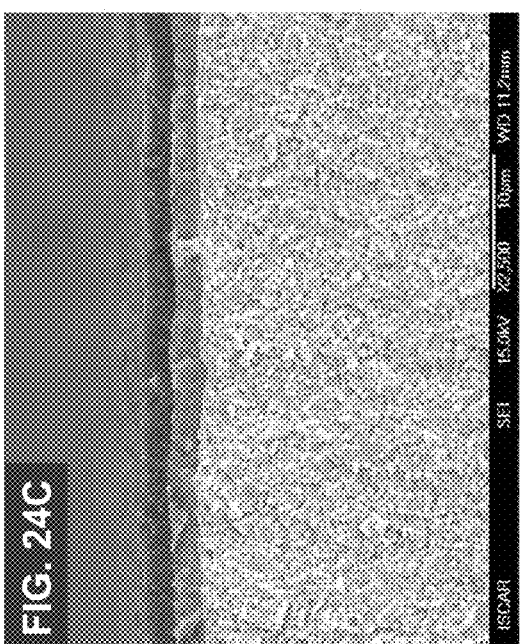
Figure 27E:
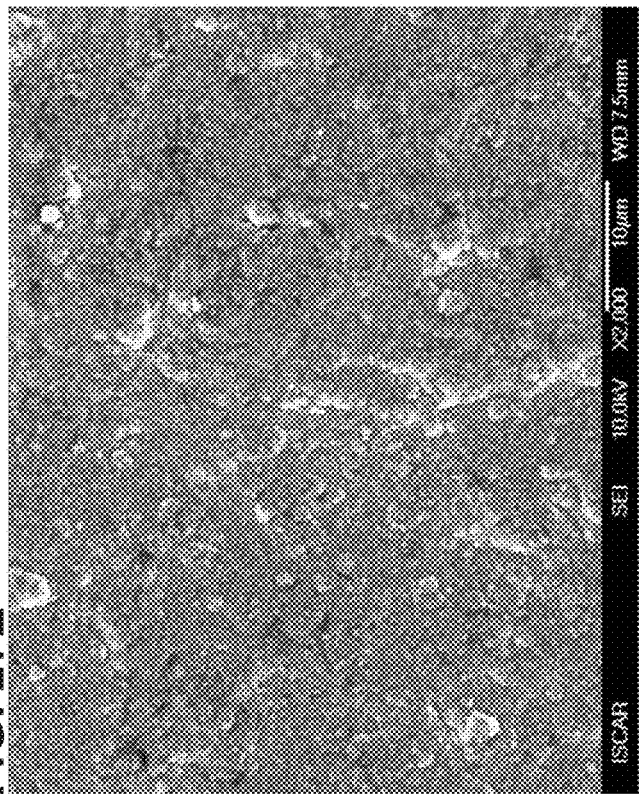
Figure 27D:
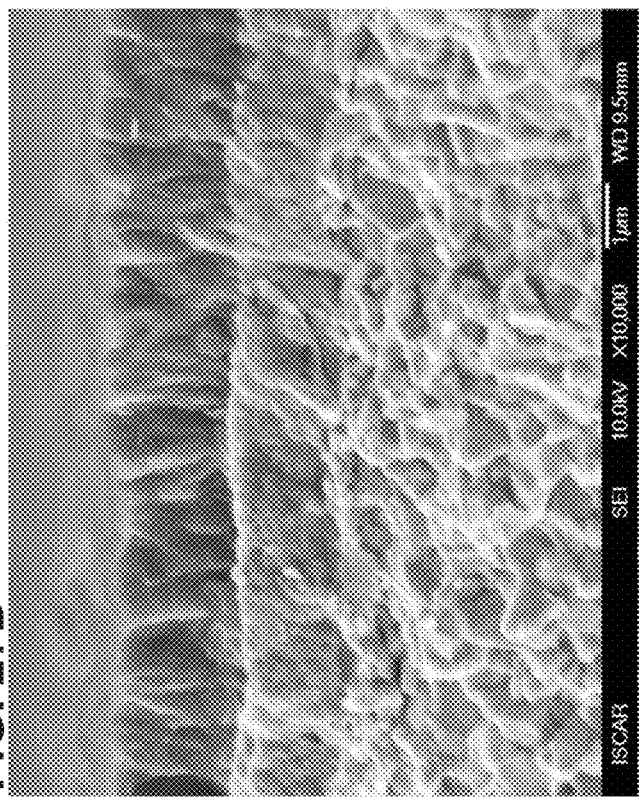
Figure 30D:
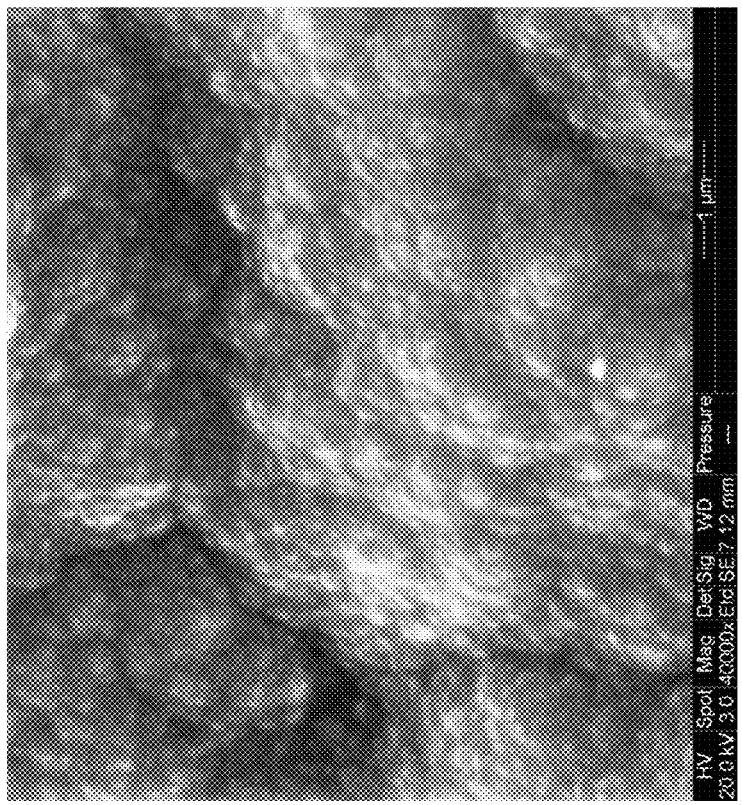
Figure 31A:
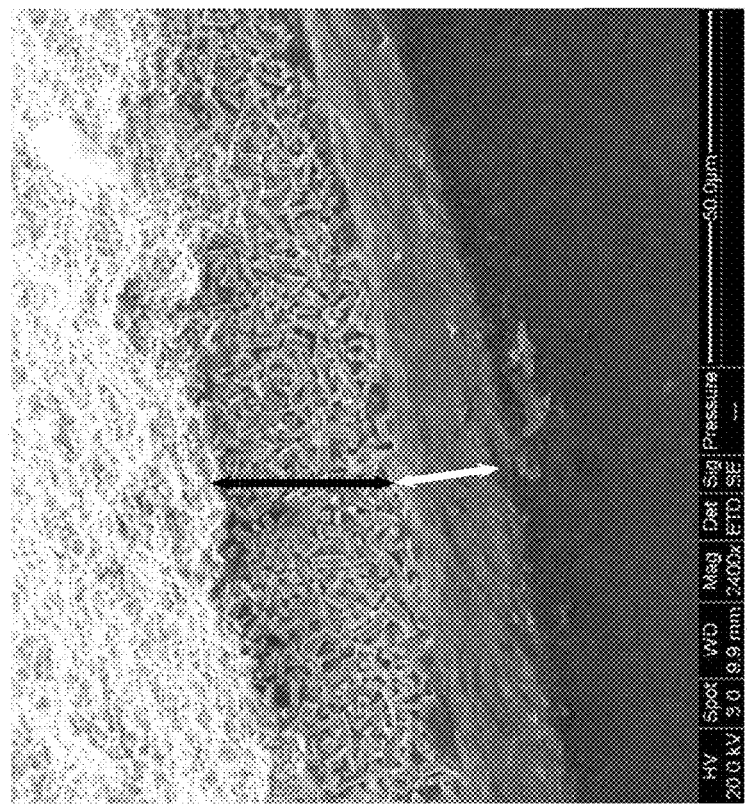
Figure 31B:
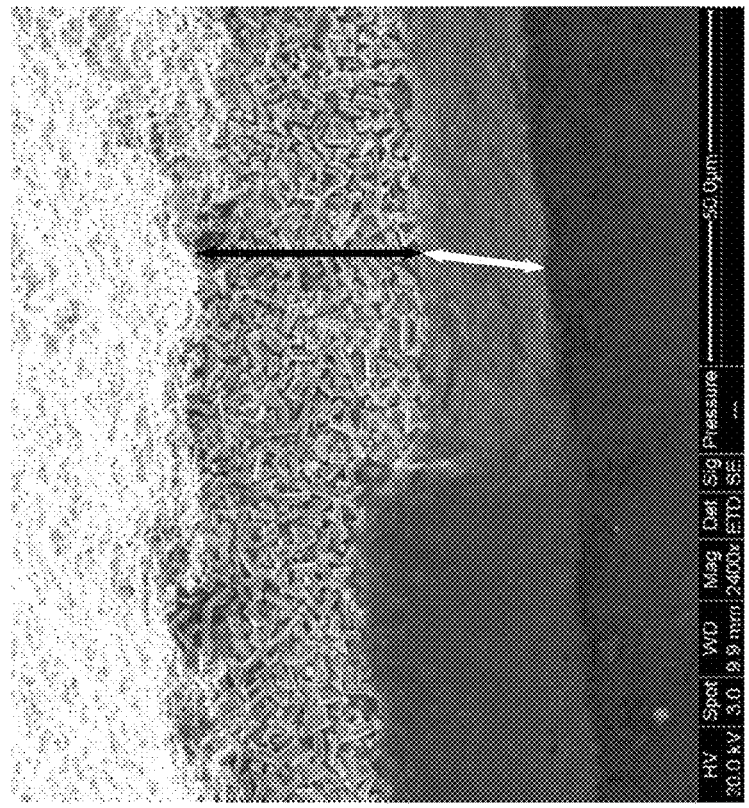
Figure 31D:
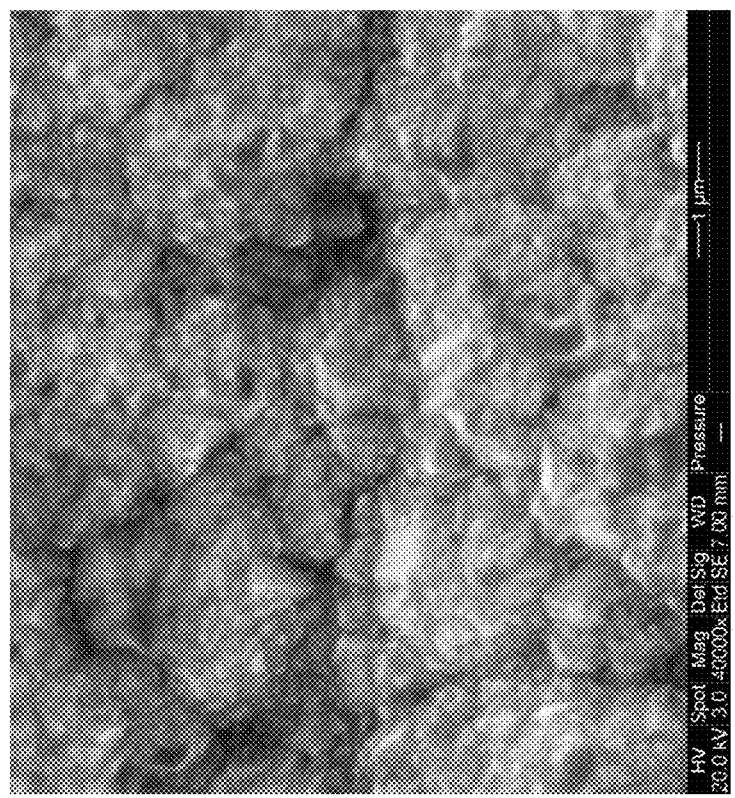
Figure 34E:
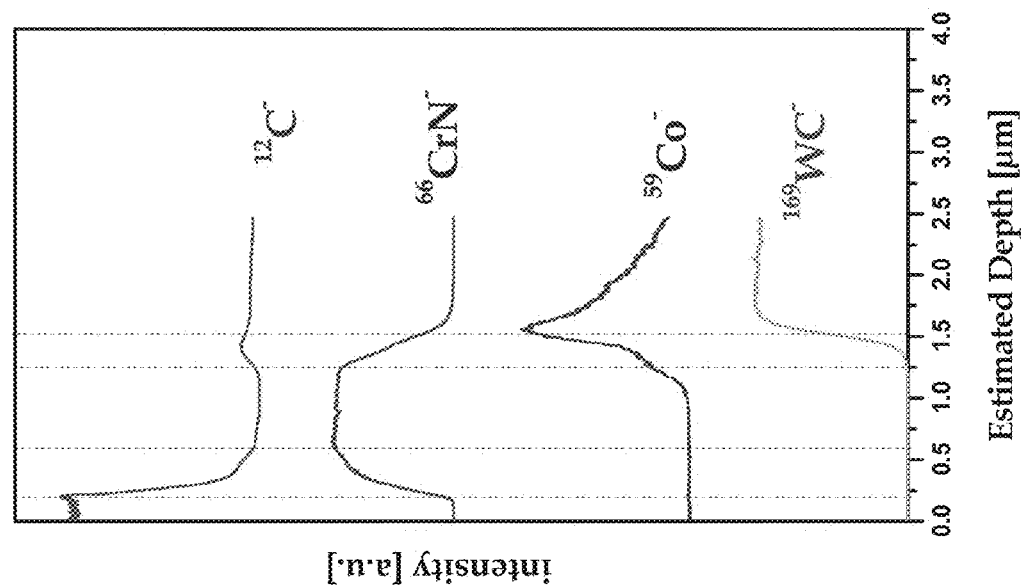
Figure 34D:
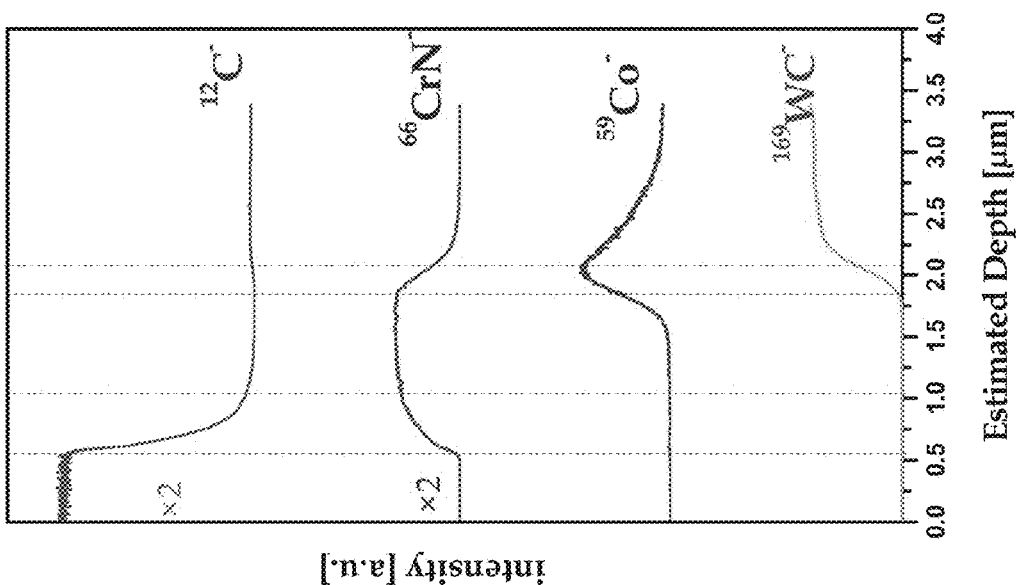
Figures 39A, 39C:
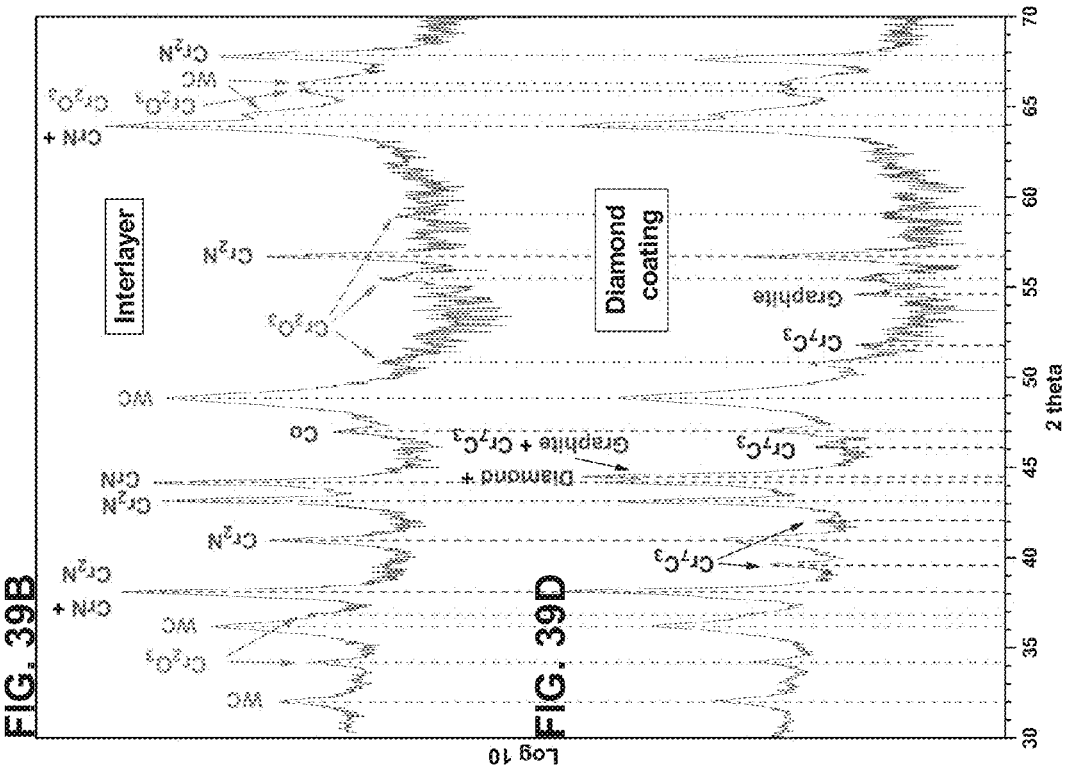
Figures 39B, 39D:
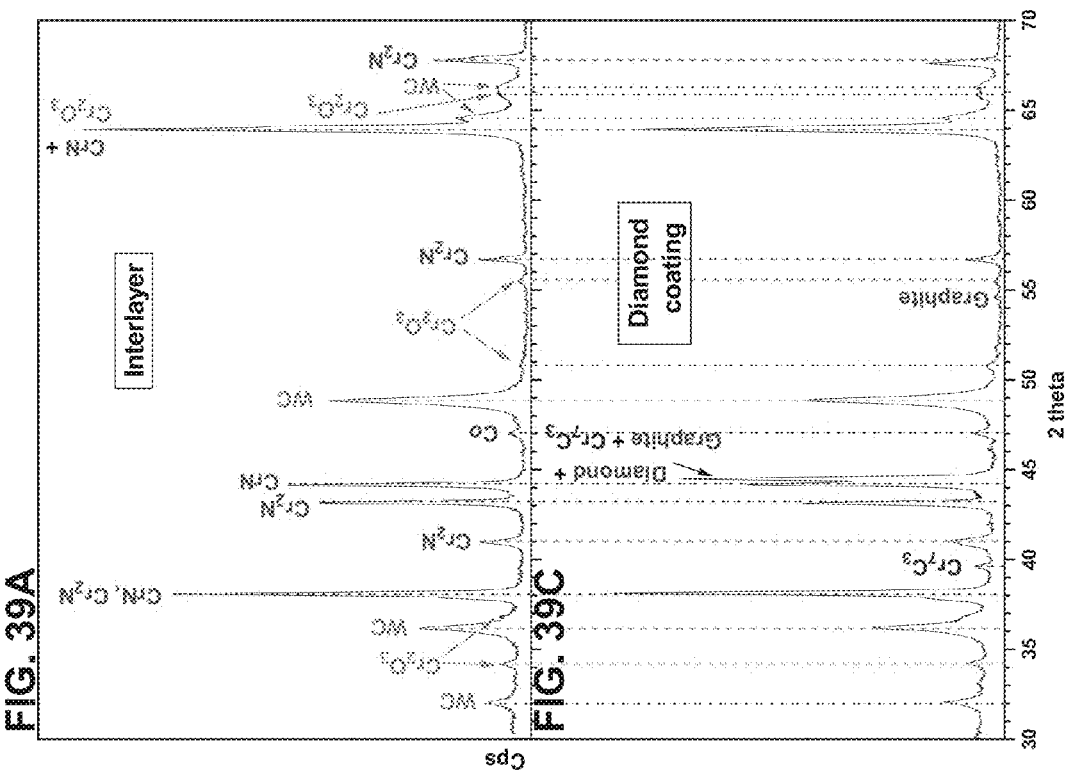

FIGS. 1A-C present XPS spectra measured for a 1 micron thick chromium layer deposited on a WC-10% Co substrate by magnetron sputtering (FIG. 1A), a chromium nitride layer obtained by nitridation of a chromium layer (FIG. 1B), and a chromium nitride-carbide layer obtained by carbidization of a chromium nitride layer (FIG. 1C);

FIGS. 2A-B present XRD patterns obtained for a 1 micron thick chromium nitride, formed onto a WC-6% Co substrate, wherein FIG. 2A shows the photon count per second and FIG. 2B shows Log 10 of the counts;

FIGS. 3A-B present XRD patterns obtained for a 2 microns thick chromium nitride, formed onto a WC-6% Co substrate, wherein FIG. 3A shows the photon counts per second and FIG. 3B shows Log 10 of the counts;

FIGS. 4A-B present XRD patterns obtained for a 1 micron thick chromium nitride, formed onto a WC-10% Co substrate, wherein FIG. 4A shows the photon counts per second and FIG. 4B shows Log 10 of the counts;

FIGS. 5A-B present XRD patterns obtained for a 2 microns thick chromium nitride, formed onto a WC-10% Co substrate (wherein FIG. 5A shows the photon counts per second and FIG. 5B shows Log 10 of the counts;

FIGS. 6A-B present SEM micrographs of a 1 micron thick chromium layer deposited onto a WC-6% Co substrate, wherein FIG. 6A is an image at a ×20,000 magnification and FIG. 6B is an image at a magnification of ×50,000;

FIGS. 7A-B present SEM micrographs of a 1 micron thick chromium nitride layer deposited onto a WC-6% Co substrate, wherein FIG. 7A is an image at a ×20,000 magnification and FIG. 7B is an image at a magnification of ×50,000;

FIGS. 8A-B present SEM micrographs showing the microstructure and texture of a 1 micron thick chromium nitride carbide (CrNxC) layer deposited onto a WC-6% Co substrate, wherein FIG. 8A is an image at a ×20,000 magnification and FIG. 8B is an image at a magnification of ×50,000;

FIGS. 9A-B present XRD diffraction patterns of a 1 micron thick CrNxC layer, deposited onto a WC-6% Co substrate, wherein FIG. 9A shows the photon counts per second and FIG. 9B shows Log 10 of the counts;

FIGS. 10A-B present XRD diffraction patterns of a 2 microns thick CrNxC layer, deposited onto a WC-6% Co substrate, wherein FIG. 10A shows the photon counts per second and FIG. 10B shows Log 10 of the counts;

FIGS. 11A-B present XRD diffraction patterns of a 1 micron thick CrNxC layer, deposited onto a WC-10% Co substrate, wherein FIG. 11A shows the photon counts per second and FIG. 11B shows Log 10 of the counts;

FIGS. 12A-B present XRD diffraction patterns of a 2 microns thick CrNxC layer, deposited onto a WC-10% Co substrate, wherein FIG. 12A shows the photon counts per second and FIG. 12B shows Log 10 of the counts;

FIG. 13 presents an optical image at a magnification of ×200 of Sample 1 (diamond film deposited directly onto a WC-6% Co substrate without an interlayer, see Table 1) which has been subjected to a microhardness test at a load of 20 kg;

FIG. 14 presents an optical image at a magnification of ×200 of Sample 2 (diamond film deposited onto a 1 µm chromium nitride interlayer formed over a WC-6% Co substrate, see Table 1) which has been subjected to a microhardness test at a load of 20 kg;

FIG. 15 presents an optical image at a magnification of ×200, of Sample 3 (diamond film deposited onto a 1 µm carbidized chromium nitride interlayer formed over a WC-6% Co substrate, see Table 1) which has been subjected to a microhardness test at a load of 20 kg;

FIGS. 16A-B present optical images at a magnification of ×200, of Sample 4 (diamond film deposited onto a 2 µm chromium nitride interlayer formed over a WC-6% Co substrate, see Table 1) which has been subjected to a microhardness test at two points at a load of 20 kg;

FIG. 17 presents an optical image at a magnification of ×200, of Sample 5 (diamond film deposited onto a 2 µm carbidized chromium nitride interlayer formed over a WC-6% Co substrate, see Table 1) which has been subjected to a microhardness test at a load of 20 kg;

FIGS. 18A-C present optical images at a magnification of ×200 (FIG. 18A) and ×500 (FIG. 18B), of Sample 9 (diamond film deposited onto a 1 µm chromium nitride interlayer formed over a WC-10% Co substrate, see Table 1) which has been subjected to a microhardness test at a load of 20 kg, and FIG. 18C is a SEM image of the same diamond coating after indentation at a magnification of 2,000;

FIGS. 19A-B present optical images at a magnification of ×200 (FIG. 19A) and ×500 (FIG. 19B), of Sample 10 (diamond film deposited onto a 1 µm carbidized chromium nitride interlayer formed over a WC-10% Co substrate, see Table 1) which has been subjected to a microhardness test at a load of 20 kg;

FIGS. 20A-C present optical images at a magnification of ×200 (FIG. 20A), ×500 (FIG. 20B) and ×300 (FIG. 20C), of Sample 11 (diamond film deposited onto a 2 µm chromium nitride interlayer formed over a WC-10% Co substrate, see Table 1) which has been subjected to a microhardness test at two points, wherein point 1 (FIGS. 20A-B) was indented at a load of 20 kg, and point 2 (FIG. 20C) at a load of 50 kg;

FIGS. 21A-C present optical images at a magnification of ×200 (FIG. 21A), ×500 (FIG. 21B) and ×300 (FIG. 21C), of Sample 12 (diamond film deposited onto a 2 µm carbidized chromium nitride interlayer formed over a WC-10% Co substrate, see Table 1) which has been subjected to a microhardness test at two points, wherein point 1 (FIGS. 21A-B) was indented at a load of 20 kg, and point 2 (FIG. 21C) at a load of 50 kg;

FIGS. 22A-D present optical images at a magnification of ×200 (FIGS. 22A and 22C) and ×500 (FIGS. 22B and 22D), of two commercial samples by SP3 (FIGS. 22A-B) and two commercial samples by Cemecon (FIGS. 22C-D), which have been subjected to microhardness tests at a load of 20 kg;

FIG. 23 presents a SEM image of the fracture profile of Sample 1 (WC-6% Co substrate, coated with a diamond film without a chromium nitride interlayer, see Table 1), showing the edge of the sample at a magnification of 5,000;

FIGS. 24A-D present SEM images of the fracture of Sample 6 (slowly-cooled diamond film deposited onto a 1

µm chromium nitride interlayer formed over a WC-6% Co substrate, see Table 1), showing the edge of the sample at a magnification of 1,500 (FIG. 24A), the diamond surface of the sample at a magnification of 2,000 (FIG. 24B) and of the fracture profile of the sample near the edge at a magnification of 2,500 (FIG. 24C) and 10,000 (FIG. 24D);

FIGS. 25A-D present SEM images of the fracture for Sample 7 (slowly-cooled diamond film deposited onto a 1 µm carbidized chromium nitride interlayer formed over a WC-6% Co substrate, see Table 1), showing the edge of the sample at a magnification of 1,500 (FIG. 25A), the diamond surface of the sample at a magnification of 2,000 (FIG. 25B) and of the fracture profile of the sample at a magnification of 2,500 (FIG. 25C) and 10,000 (FIG. 25D);

FIGS. 26A-H present SEM images taken for a fracture of Sample 9 (diamond film deposited onto a 1 µm chromium nitride interlayer formed over a WC-10% Co substrate, see Table 1), showing the edge of the sample at a magnification of 1,000 (FIG. 26A), 10,000 (FIGS. 26B-C) and 30,000 (FIGS. 26D-E), the diamond surface of the sample at a magnification of 2,000 (FIG. 26F), and the fracture profile at an angle and a magnification of 5,000 and 5,500 (FIG. 26G and FIG. 26H respectively);

FIGS. 27A-E present SEM images taken for a fracture of Sample 10 (diamond film deposited onto a 1 µm carbidized chromium nitride interlayer formed over a WC-10% Co substrate, see Table 1), showing the edge of the sample at a magnification of 1,500 (FIG. 27A), the fracture profile of the sample at a magnification of 1,000, 2,500 and 10,000 (FIGS. 27B-D respectively), and the diamond surface of the sample at a magnification of 2,000 (FIG. 27E);

FIGS. 28A-D present SEM images taken for a fracture of Sample 11 (diamond film deposited onto a 2 µm chromium nitride interlayer formed over a WC-10% Co substrate, see Table 1), showing the edge of the sample at a magnification of 1,500 (FIG. 28A), the diamond surface of the sample at a magnification of 2,000 (FIG. 28B), and the fracture profile of the sample at a magnification of 2,500 and 10,000 (FIGS. 28C-D respectively);

FIGS. 29A-D present SEM images taken for a fracture of Sample 12 (diamond film deposited onto a 2 µm carbidized chromium nitride interlayer formed over a WC-10% Co substrate, see Table 1), showing the edge of the sample at a magnification of 850 (FIG. 29A) and the fracture profile of the sample at a magnification of 2,500, 10,000 and 30,000 (FIGS. 29B-D respectively);

FIGS. 30A-D present SEM images taken for a fracture of a diamond film deposited onto WC-6% Co, prepared by Cemecon, using a proprietary diamond-coating process, showing the fracture of the sample at a magnification of ×800 (FIG. 30A), at a magnification of ×12,000 (FIG. 30B), and the plain view of the diamond film surface, showing the Cemecon-made diamond film microstructure at a magnification of ×20,000 (FIG. 30C) and ×40,000 (FIG. 30D);

FIGS. 31A-D present SEM images taken for a fracture of a diamond film deposited onto WC-6% Co prepared by SP3 using a proprietary diamond-coating process, showing the fracture of the sample at a magnification of ×2,400 on two different areas of the fractured profile (FIGS. 31A-B) and the plain view of the diamond film surface, showing the SP3-made diamond film microstructure at a magnification of ×2,000 (FIG. 31C) and ×40,000 (FIG. 31D);

FIGS. 32A-I present an AFM imaging analysis of a sand blasted WC-10% Co sample surface before formation of an interlayer (FIGS. 32A-C), after the formation of a 1 micron thick chromium nitride interlayer (FIGS. 32D-F), and after a 6 hours CVD of a diamond film thereon (FIGS. 32G-I), showing an orthogonal representation of the height scan results (FIGS. 32A, 32D and 32G), an isometric representation of the height scan results (FIGS. 32B, 32E and 32H) and a graphical representation of the height measurements (FIGS. 32C, 32F and 32I), wherein the average roughness value $R_q$ is 190±10 nm for the sand blasted substrate, 170±7 nm for the CrN-coated substrate, and 165±5 nm for the diamond-coated/CrN-coated substrate;

FIGS. 33A-D present Raman spectra in the 1000-1850 cm-1 range, obtained for a diamond-coated WC—Co sample from SP3 (FIG. 33A), a similar sample from Cemecon (FIG. 33B), and samples referred to as coating A (FIG. 33C) and coating B (FIG. 33D), prepared according to some embodiments of the present invention;

FIGS. 34A-E present secondary ion mass spectrograms (SIMS) plotted as intensity as a function of distance from the surface (depth), obtained for various samples, wherein FIG. 34A is a SIMS of a 2 microns thick chromium nitride interlayer deposited onto a WC-10% Co substrate (Sample 11, see Table 1), FIG. 34B is a SIMS of a 1 micron thick chromium nitride interlayer deposited onto a WC-10% Co (Sample 9), FIG. 34C is a SIMS of a 1 micron thick carbidized chromium nitride interlayer deposited onto a WC-10% Co substrate (Sample 10, see Table 1), FIG. 34D is a SIMS of a diamond film (about 1.2 micron thick) deposited in a two hours CVD process onto a 1 micron thick chromium nitride interlayer (Sample 9, see Table 1), FIG. 34E is a SIMS of a diamond film (about 1.2 micron thick) deposited in a two hours CVD process onto a carbidized CrN interlayer (Sample 10, see Table 1);

FIGS. 35A-D present XRD patterns, showing counts per second (Cps)(FIGS. 35A and 35C) and $Log_{10}$ (FIGS. 35B and 35D) obtained for a WC-6% Co sample without an interlayer before diamond film formation (FIGS. 35A and 35B), and after diamond film deposition, constituting Sample 1 (FIGS. 35C and 35D);

FIGS. 36A-D present the XRD patterns, showing counts per second (FIGS. 36A and 36C) and $Log_{10}$ (FIGS. 36B and 36D) obtained for the interlayer (FIGS. 36A-B), and the diamond coating (FIGS. 36C-D) obtained for Sample 2, prepared according to some embodiments of the present invention;

FIGS. 37A-D present XRD patterns, showing counts per second (FIGS. 37A and 37C) and $Log_{10}$ (FIGS. 37B and 37D) obtained for the interlayer (FIGS. 37A-B), and the diamond coating (FIGS. 37C-D) obtained for Sample 3, prepared according to some embodiments of the present invention;

FIGS. 38A-D present XRD spectra obtained for the interlayer (FIGS. 38A-B) and the diamond coating (FIGS. 38C-D) obtained for Sample 4, prepared according to some embodiments of the present invention;

FIGS. 39A-D present XRD patterns, showing counts per second (FIGS. 39A and 39C) and $Log_{10}$ (FIGS. 39B and 39D) obtained for the interlayer (FIGS. 39A-B) and the diamond coating (FIGS. 39C-D) obtained for Sample 5, prepared according to some embodiments of the present invention;

FIGS. 40A-D present XRD patterns, showing counts per second (FIGS. 40A and 40C) and $Log_{10}$ (FIGS. 40B and 40D) obtained for the interlayer (FIGS. 40A-B), and the diamond coating (FIGS. 40C-D) obtained for Sample 9, prepared according to some embodiments of the present invention;

FIGS. 41A-D present XRD patterns, showing counts per second (FIGS. 41A and 41C) and $Log_{10}$ (FIGS. 41B and 41D) obtained for the interlayer (FIGS. 41A-B), and the diamond coating (FIGS. 41C-D) obtained for Sample 10, prepared according to some embodiments of the present invention;

FIGS. 42A-D present XRD patterns, showing counts per second (FIGS. 42A and 42C) and $\text{Log}_{10}$ (FIGS. 42B and 42D) obtained for the interlayer (FIGS. 42A-B), and the diamond coating (FIGS. 42C-D) obtained for Sample 11, prepared according to some embodiments of the present invention; and FIGS. 43A-D present XRD patterns, showing counts per second (FIGS. 43A and 43C) and $\text{Log}_{10}$ (FIGS. 43B and 43D) obtained for the interlayer (FIGS. 43A-B), and the diamond coating (FIGS. 43C-D) obtained for Sample 12, prepared according to some embodiments of the present invention.

DESCRIPTION OF SPECIFIC EMBODIMENTS OF THE INVENTION

The present invention, in some embodiments thereof, relates to material science and, more particularly, but not exclusively, to diamond-coated substrates and processes of preparing same and uses thereof.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As discussed hereinabove, cemented carbide substrates, such as WC—Co, are preferred substrates for diamond coating in many industrial applications, however, the presence of relatively high concentrations of the binder, such as cobalt, typically renders diamond coating challenging. For example, cobalt, which is found in the interface between the WC—Co substrate and the diamond film, is harmful to diamond deposition; namely, the cobalt binder suppresses the diamond nucleation and accelerates the formation of graphite, which is the more thermodynamically stable form of carbon. Some currently known methodologies practice removal of cobalt prior to deposition, yet, this practice adversely affects the properties of the substrate and reduces the quality of the deposited diamond coat.

In a search for an improved process of diamond coating, the present inventor has conducted extensive studies of a process in which chromium nitride (CrN) is utilized as a susceptible substance for diamond film formation, by acting as an interlayer between a substrate and the diamond film. These studies were aimed at forming a chromium nitride interlayer that would act a diffusion barrier between elements in the substrate and accumulating carbon on the surface. As discussed above, such an approach allowed diamond to be grown on steel, namely a thick enough chromium nitride interlayer was able to act as a diffusion barrier against uncontrolled iron/carbon reactivity, allowing some diamond to form on steel.

Hence, while reducing the present invention to practice, the present inventor has considered that in order to arrive at high quality diamond-coated substrates based on cemented carbide substrates using an interlayer, the interlayer should possess at least one of the following attributes:

exhibit mechanical properties that allow for its use in tribological and machining tool applications;

serve as a susceptible substance for diamond nucleation and growth;

exhibit high adhesion to the substrate;

exhibit high adhesion to the diamond film;

serve as an effective barrier for cobalt diffusion;

serve as an effective barrier for carbon diffusion; and exhibit diamond-compatible thermal expansion coefficient.

Based on the experience accumulated while working with steel and the attempts to deposit diamond thereon using a sufficiently thick chromium nitride interlayer, the present inventor has attempted to form a corresponding chromium nitride interlayer on a WC—Co substrate, with the aim of obtaining a cobalt/carbon diffusion barrier therewith. During these attempts it was surprisingly uncovered that the thickness of the chromium nitride interlayer, which had to be at least 20 microns thick in the case of steel, could be lowered substantially below 20 microns in the case of cemented carbides. Therefore, it was surprisingly uncovered that a relatively thin interlayer of chromium nitride could be made to exhibit and maintain high crystallinity and stoichiometric of chromium to nitrogen ratio during all stages of the process, such that this interlayer could serve as an effective diffusion barrier for cobalt and carbon, and could also provide a suitable adhesion layer between the substrate and the diamond film.

This surprising discovery opened the way to form cemented carbide substrates coated with a well adhered film of diamond, which still exhibits fine structural features, such as sharp corners and edges, which are highly required in the field.

Reducing the present invention to practice provided cemented carbide substrate samples coated with a durable and well identified layer of polycrystalline diamond, as presented in the Examples section that follows. As also demonstrated in the Examples section below, spectroscopic and diffraction signatures allow the unambiguous identification of the chromium nitride interlayer interposed between a cemented carbide substrate and the contiguous diamond film.

Hence, according to an aspect of some embodiments of the present invention, there is provided a composite structure which comprises a cemented carbide substrate, an interlayer disposed over the substrate and a contiguous diamond film disposed over the interlayer. The interlayer comprises chromium nitride.

Macroscopic Structure:

Broadly stating, the basic macroscopic structure of the composite structure provided herewith, is of a substrate made of a first substance, having essentially two layers of two different, second and third, substances sequentially disposed thereon (namely, the second substance is deposited on the first substance, the substrate, and the third substance is deposited on the second substance).

The terms lamina/laminae, stratum/strata, film/films and layer/layers are used herein interchangeably to refer to the second and third substances of the composite structure, wherein the term "interlayer" is used herein essentially to refer to the layer found between ("sandwiched") the substrate (bottom) and the outer (top) layer, namely the second substance.

As used herein the term "coat" refers to the combined layers disposed over the substrate, excluding the substrate, while the term "substrate" refers to the part of the composite structure supporting the disposed strata.

The chemistry and other properties of the following layers, disposed on top of the substrate, are discussed hereinbelow. In some embodiments, the terms "layer", "film" or "stratum", as used herein interchangeably, refer to a substantially uniform-thickness of a substantially homogeneous substance.

According to some embodiments of the present invention, the interlayer is a "single layer" having a substantially uniform-thickness of a substantially homogeneous substance with respect to a perpendicular axis of the interlayer. In some embodiments, this term also encompasses a single layer having a gradient of a certain chemical composition ranging from top to bottom of the layer. According to some embodiments of the present invention, such single layers having a gradient of nitride forms are also referred to herein as "gradiented single layer".

In some embodiments, a gradiented single layer may be formed when a single layer of a given substance is subjected to a chemical, mechanical or physical modification, which modifies the substance in the layer gradually with respect to the perpendicular axis of the layer (depth-wise), namely the modification is effected to a greater extent at the upper surface (top) of the layer (e.g., with respect to the base; that is, the part of the layer which is most distant from the base layer) and at shallow depths of the layer below the upper surface, compared to the deeper depths or the bottom of the layer (e.g., closer or near the base layer). In such cases of a gradient-wise chemical modification of a substance, the modified layer is regarded as a single layer according to embodiments of the present invention.

The base of the composite structure presented herein can be referred to as a layer by itself, and typically it is referred to as a "substrate". The substrate can be a monolithic and independent object, or form a part of a larger composite object, e.g., as a layer or an appendix.

The phrase "cemented carbide substrate", as used herein, refers to an object made of a metal matrix composite composed of carbide particles and a metallic binder that serves as the binding or cementing matrix, whereas carbides are compounds composed of carbon and a less electronegative element, and the binder metal has a much lower melting point compared to the carbide. Cemented carbide is typically obtained by sintering carbide particles with the binder in a process known as hot isostatic pressing, or HIP, wherein pressing and heating the mixture of carbide particles and the binder together causes the binder to melt and cement the carbide particles to thereby create the metal matrix composite with distinct material properties. The ductility of the metal binder balances the brittleness of the carbide to afford a family of hard and durable substances, known as cemented carbides. The properties of cemented carbide substrates can be manipulated by altering carbide chemical composition using alloys of different metals and carbon content, altering the carbide grain size and altering the choice of binder metal and/or content.

According to some embodiments of the present invention, the substrate of the diamond-coated substrate presented herein is substantially metallic and consists of a carbide-forming metal, a metalloid, a transition metal or a mixture thereof. Among others, Ca, Si, Fe, Cr, Ti, Zr, W and Ni are elements which are known to form carbides, and therefore a carbide thereof or of any mixture thereof, is contemplated as a substrate substance for the diamond-coated substrate presented herein. An exemplary carbide is tungsten carbide, and an exemplary cemented carbide substrate, suitable as a substrate according to some embodiments of the present invention, is tungsten carbide cemented with cobalt.

It is noted herein that for simplicity and readability, the following description may refer to the general concept of cemented carbide as "tungsten carbide". However, unless stated otherwise, it is to be understood that other carbides are contemplated as a cemented carbide substrate for any of the embodiments described herein. Similarly, the general concept of a cemented carbide substrate may be using the example of tungsten carbide, which is typically sintered (cemented) with cobalt to afford a durable substance known as "widia". However, unless stated otherwise, it is to be understood that other binders, such as iron, nickel and combination thereof, are contemplated for any of the embodiments described herein.

Binder Concentration in the Cemented Carbide Substrate:

As discussed hereinabove, the presence of a binder, such as cobalt, nickel or iron, is detrimental to an effective diamond film deposition process, since elements such as cobalt, nickel or iron inhibit diamond formation by promoting graphite formation, which also weakens the adhesion of the diamond film to the substrate. On the other hand, the binder is essential in composite materials, e.g., cobalt in WC—Co, and its presence in sufficient concentrations is necessary.

According to some embodiments of the present invention, and as opposed to methodologies known heretofore, a high binder concentration in the cemented carbide substrate is not a limiting factor in the formation of high quality and well adhered diamond films, especially on cemented WC substrates containing cobalt (WC—Co) at relatively high concentrations thereof. According to some embodiments of the present invention, the binder concentration can be relatively high, without adversely affecting the production of diamond-coated substrates, since the chromium nitride interlayer acts as a diffusion barrier, essentially blocking cobalt diffusion from of the substrate towards the carbon receiving interface. The interlayer also retards tungsten diffusion from the substrate, and as discussed hereinbelow, retards carbon diffusion from the carbon receiving interface towards the substrate.

According to some embodiments of the present invention, the binder in the cemented carbide substrate comprises one or more of cobalt, nickel and iron and any combination thereof. In some embodiments, the binder in the cemented WC substrate is cobalt.

According to some embodiments of the present invention, the cemented carbide substrate used for the composite structure, or diamond-coated substrate presented herein, is characterized at least by a binder concentration in the substrate of at least 2 percents by weight of the total weight of the substrate. In some embodiments, the binder concentration in the substrate is at least 4%, 6%, 8%, 10%, 15% or 20% of the total weight of the substrate, or higher. For example, in some embodiments, the binder of the cemented carbide substrate is cobalt and the cobalt concentration in the substrate is more than 2%, more than 4%, more than 6%, more than 8%, more than 10%, more than 15% or more than 20% of the total weight of the substrate, or higher.

According to some embodiments of the present invention, the substrate is substantially devoid of iron, or contains less than 5%, less than 2% or less than 1% of iron.

It is noted herein that the binder, which is known to adversely affect diamond deposition, is not depleted from the substrate at any depth thereof. In other words, in some embodiments of the present invention, the concentration of the binder in the cemented carbide substrate remains substantially the same before and after the interlayer/diamond deposition thereon.

As can be seen in the SIMS analysis presented hereinbelow, even after correcting the heightened sensitivity of the SIMS recorder to cobalt, it has been determined that the concentration of cobalt is not lower than it is anywhere else in the substrate (deeper regions), and it may even be higher at the interface due to matrix effects. Hence, according to some embodiments of the present invention, the concentration of the binder in the substrate substantially at the interface of the substrate with the interlayer, or proximal thereto, is at least 90 percents of its concentration in the bulk of the substrate (deeper regions). Alternatively, the concentration of the binder at the interface is 95%, 99%, 100% and higher than 100% of its concentration in the bulk of the substrate.

According to some embodiments of the present invention, the concentration of the binder in the substrate, forming a part of the composite structure presented herein, is at least 90 percents of its concentration in the original/intact substrate. In some embodiments, the binder concentration after forming the diamond film on the substrate, according to some embodiments of the present invention, is at least 95% or at least 99% of its concentration before any manipulation or layers are applied thereon.

Interlayer Thickness:

As discussed hereinabove, the interlayer serves as a diffusion barrier as well as a mean of adhesion, hence a requirement of the interlayer is to consist of a hard and dense substance. Stoichiometric chromium nitride (CrN) is harder and denser than $Cr_2N$. $Cr_2N$ is formed to a greater extent when applying nitridation on thicker metallic chromium layers. In other words, when nitridizing a thick layer of metallic chromium, the ratio of Cr to N is higher, namely more $Cr_2N$ is formed compared to CrN formation. As a result, the thicker a chromium nitride interlayer is, the softer, hence weaker, it is, lowering adhesion and causing delamination of the subsequent diamond layer, compared to a thin interlayer. Moreover, $Cr_2N$ being softer and less dense than CrN, is a poorer diffusion barrier, hence although a thick barrier may seem to be more effective than a thin barrier, the process and composition of the interlayer, according to some embodiments of the present invention, suggest the use of an interlayer thinner than 20 microns, or alternatively thinner than 10 microns. It is noted herein that one possible way to increase the amount of CrN and reduce the amount of $Cr_2N$ during the nitridation of relatively thick chromium layers, is to allow the nitridation step to run for a longer period of time.

According to further embodiments of the present invention, the chromium nitride interlayer thickness in the composite structure presented herein ranges from 0.5 to 20 microns. Alternatively, the interlayer thickness ranges from 0.5 to 10 micron, or from 1 to 5 microns, or from 1 to 2 microns.

It is noted herein that in previously published studies of diamond film deposition on steel substrates using chromium nitride interlayer, it was found that in substrate substances containing iron, the iron readily diffuses through a CrN interlayer during the nitridation and diamond deposition step, causing the formation of amorphous carbon and graphite. In these studies it was found that in order to reduce this detrimental iron diffusion from the steel substrate, the interlayer had to be formed at a thickness of 20 microns in order to serve as an affective diffusion barrier. It is further noted that if such methodology would be applied to WC—Co substrates, a 20 and even a 10 microns thick interlayer would be too thick, leading to extensive formation of the softer $Cr_2N$ which would lower adhesion and lead to delamination of the interlayer and/or the diamond film.

Chemical Composition and Microstructure of the Interlayer:

While studying the characteristics of a well-formed and useful diamond-coated substrate according to some embodiments of the present invention, it was found that the chemical composition and the microstructure of the interlayer is substantially homogenous depth-wise, namely with respect to the perpendicular axis of the interlayer. This finding substantiated that the interlayer is substantially a single layer, as defined herein, as can be seen in scanning electronmicrographs taken for fractured samples of exemplary diamond-coated substrates according to some embodiments of the present invention, and further exhibiting predominantly a homogeneous chemical composition and crystallinity, as supported by spectroscopic analyses such as XPS, SIMS and XRD; all of which are presented and discussed in the Examples section that follows.

It is noted herein that when discussing the chemical composition of the interlayer or any other stratum in the composite structure, according to some embodiments of the present invention, the interlayer is taken and referred to as a unified entity, without addressing unique regions proximal to the interfaces on each side thereof, namely the regions near interface with the substrate and the regions near the interface with the diamond film. For example, the XRD analysis of the interlayer, conducted for exemplary diamond-coated WC—Co samples according to some embodiments of the present invention, showed a minor diffraction peak corresponding to minute amounts of crystalline chromium carbide near the interface of the diamond film and the interlayer. Since these interfacial regions constitute a minor part of the interlayer relative to the thickness of the interlayer, each interfacial region is estimated as less than about 0.2 micron thick), it is noted herein that when referring to properties of the interlayer, the interfacial regions are regarded as part of the interlayer, unless referred to specifically. As discussed hereinbelow, the unique chemical composition of each of the interfacial regions contributes to the adhesion at the interfaces.

According to some embodiments of the present invention, the composite structure, or diamond-coated substrate presented herein, is further characterized at least by a substantially stoichiometric ratio of chromium to nitrogen in the interlayer. The phrase "stoichiometric ratio", as used herein, refers to a ratio of elements in an atomic composition at which none of the elements is found in excess with respect to the other elements of the composition. Alternatively, the Cr:N ratio in the interlayer ranges from 0.90 to 1.50, as determined by SIMS and XRD analyses. It is noted herein that an interlayer that comprises predominantly CrN, and is substantially devoid of $Cr_2N$, is suitable to promote adhesion of the laminar composite structure, hence, according to some embodiments of the present invention, the interlayer comprises CrN and is substantially devoid of $Cr_2N$, or, alternatively, is devoid of any non-stoichiometric CrN ratio species. In some embodiments, the interlayer comprises less than 5% $Cr_2N$ by weight, less than 10%, less than 20%, or less than 50% $Cr_2N$ by weight of the total weight of the interlayer.

Further alternatively, the interlayer may be a single layer, which is characterized by a chemical gradient of CrN to $Cr_2N$, going from top to bottom of the interlayer. Thus, in some embodiments of the present invention, the chemical composition of the interlayer is a gradient going from crystalline CrN at the top side of the interlayer to CrN where X, the ratio of chromium to nitrogen, is 2 or more at the bottom of the interlayer. In such cases it can be said that the single interlayer, according to some embodiments of the present invention, is characterized by a gradient of the ratio of crystalline CrN at the "top" to CrN at the "bottom" of the perpendicular axis of the interlayer.

As discussed hereinabove, the capacity of the chromium nitride interlayer to retard diffusion is linked to its density, or in other words, to its degree of crystallinity. Hence, according to some embodiments of the present invention, the composite structure presented herein is further characterized at least by a chromium nitride interlayer, wherein the chromium nitride is characterized by a high degree of crystallinity, as can be assessed by, for example, XRD analysis. In some embodiments, the crystalline morphology of the chromium nitride interlayer is determined by means of comparative SIMS and XRD data, before and after carbon CVD, as presented and discussed in the Examples section that follows, for exemplary composite structures according to some embodiments of the present invention.

A crystalline substance can be characterized as such by observing sharp diffraction peaks in an X-ray diffraction pattern, and a diffraction pattern of a particular crystalline substance would be characterized by peaks at certain diffraction angle(s), given in values of 2θ.

As demonstrated in the Examples section below, XRD data has been collected from exemplary diamond-coated substrates, prepared according to some embodiments of the present invention, showing diffraction patters which are unique and characteristics of the composite structures presented herein.

Hence, in some embodiments, the exemplary composite structures made with tungsten carbide substrate, cemented with cobalt and coated with an interlayer of crystalline chromium nitride followed by a film of diamond, are characterized by exhibiting at least 3 of the peaks seen in one or more of the X-Ray diffraction patterns presented herein, which include the X-Ray diffraction patterns as presented in FIG. 36C, FIG. 37C, FIG. 38C, FIG. 39C, FIG. 40C, FIG. 41C, FIG. 42C and FIG. 43C. Specifically, characteristic are the peaks of crystalline stoichiometric chromium nitride (CrN) at 2θ (2-theta) values of about 63.5°, 43.7°, 37.7°, the peaks of tungsten carbide (WC) at 2-theta values of about 66°, 64°, 35.8° and 31.6°, and the peaks of diamond at 2-theta values of about 44.1°. It is further noted that peaks of other forms of non-stoichiometric chromium nitride and/or chromium carbide species appear in the XRD patterns as broader (less ordered, less crystalline) and lower intensity (smaller relative amount).

In some embodiments, a composite structure as described herein exhibits at least 5 of the peaks seen in one or more of the X-Ray diffraction patterns indicated hereinabove, and, in some embodiments, the composite structure exhibits an X-Ray diffraction pattern substantially identical to one or more of the X-Ray diffraction patterns indicated hereinabove.

In some embodiments, a composite structure as described herein exhibits at least 3, at least 5, or at least seven of the peaks of the X-Ray diffraction pattern presented in FIG. 41C, or is substantially the same as the X-Ray diffraction pattern presented in FIG. 41C.

As discussed hereinabove, being a diffusion barrier, the interlayer is essentially devoid of a binder material. Alternatively, according to some embodiments of the present invention, the composite structure presented herein is further characterized at least by a concentration of the binder in the interlayer being lower than 0.5 percents by weight; whereas the interlayer is seen as a unified lamina. Alternatively, the concentration of the binder in the interlayer is less than 0.4%, less than 0.3%, less than 0.2 or less than 0.1% of the total weight of the interface.

As discussed herein, while the concentration of the binder in the interlayer as a bulk is low or null, near the substrate/interlayer interface the concentration is beneficially higher due to matrix effect and some limited diffusion; this limited presence of the binder in this interfacial region contributes to the adhesion of the interlayer to the substrate without coming in contact with carbon during carbon CVD and without forming amorphous carbon species. Hence, as can be seen in the experimental SIMS results presented in the Examples section that follows, when the binder is cobalt, some cobalt does diffuse into the interlayer, but only to very shallow depths. As verified by SIMS, small amounts of cobalt diffuse into the chromium nitride layer during the nitridation process to a depth proximal to the substrate-interlayer interface, yet cobalt does not diffuse deep into the interlayer so as to reach the inner regions or the outer surface of the interlayer. This limited cobalt diffusion/penetration confers the strong adhesion between the substrate and the interlayer, which has been observed during the microhardness and fraction tests, as discussed hereinbelow. At the same time, the substantial lack of cobalt in the inner regions or outer surface of the interlayer, contributes to the formation of polycrystalline diamond rather than graphite and other amorphous graphite-like carbon species.

Similarly, the interlayer is essentially devoid of graphitic and/or amorphous carbon species, namely devoid of non-diamond (non-sp3) forms of carbon, collectively referred to herein as amorphous carbon. It is noted herein that according to some embodiments of the present invention, stoichiometric carbide species, such as chromium carbide or tungsten carbide, are not regarded as a form of carbon, and similarly not regarded as graphitic and/or amorphous carbon species. Alternatively, according to some embodiments of the present invention, the composite structure presented herein is further characterized at least by an amount of amorphous carbon in the interlayer being lower than 0.5 percents by weight; whereas the interlayer is taken as a unified lamina. Alternatively, the concentration of amorphous carbon in the interlayer is less than 0.4%, less than 0.3%, less than 0.2 or less than 0.1% of the total weight of the interface.

As discussed herein, while the concentration of amorphous carbon in the interlayer as a bulk is low or null, near the diamond/interlayer interface (the interfacial region) the presence of some excess of carbon is beneficial to the adhesion of the diamond film to the interlayer.

The Diamond Film:

As presented in the Examples section that follows, the diamond film readily forms over the chromium nitride layer as a contiguous film exhibiting the characteristics of a polycrystalline diamond phase. The term "contiguous", as used herein, refers to a macro-morphological trait of the film, being disposed over the substrate in a substantially uniform thickness and spread, essentially without breaks, holes, dips and bulges. The term "polycrystalline", as used herein, refers to a micro-morphological trait of a solid substance, which is composed of a plurality of crystallites of varying size and orientation and further substantially devoid of the substance in an amorphous form. While the variation in direction of the crystallites may be random (powder-like), an X-ray diffraction pattern in an XRD analysis of a polycrystalline substance is characterized by sharp peaks at 2θ values characteristic to diamond.

Hence, according to some embodiments of the present invention, the diamond film disposed over the interlayer is contiguous, and further the diamond film is characterized by high polycrystallinity, and substantially devoid of amorphous (non-diamond, non-sp3) carbon species.

As presented hereinbelow in the Examples section, the composition of the diamond film is essentially devoid of non-carbon elements. The presence of non-carbon elements can be determined, for example, by SIMS measurements. For example, based on SIMS machine setting and manufacturer's guidelines for SIMS analysis, stressing the high sensitivity of the detector to cobalt, the concentration of cobalt was estimated at 3-10 ppm, which is below the sensitivity of most other solid state analytical methods.

The thickness of the diamond film is essentially a function of the amount of carbon deposited on the surface, namely the concentration of carbon in the CVD gas, the flow rate and the time by which the CVD process is effected; the more carbon is deposited on the surface, the thicker the diamond film will be.

The minimal thickness of a contiguous diamond film is limited by the diamond grain size and the uniformity of their growth, wherein large and non-uniformly growing diamond grains will coalesce to a contiguous film only at a thicker film while finer diamond grain sizes will coalesce into a thinner contiguous film. Hence, according to some embodiments of the present invention, the contiguous diamond film is 0.2 micron thick or more. Alternatively, the thickness of the contiguous diamond film is 0.3 micron or higher, 0.4 micron or higher, or 0.5 micron or higher.

It is noted herein that the thickness of the diamond film that can be disposed over the interlayer, according to some embodiments of the present invention, is not limited to any particular thickness, at least not from the contiguousness and polycrystallinity aspects. A possible limitation may be imposed by the intended use of the product based on the composite structures presented herein; a limitation which is not related to the characteristics of the product or its process of manufacturing, presented hereinbelow. Thus, the thickness of the contiguous diamond film disposed over the interlayer, according to some embodiments of the present invention, is at least 0.5 microns, at least 1 micron, at least 5 microns, at least 10 microns, at least 15 microns, at least 20 microns, at least 25 microns, at least 30 microns, at least 40 microns, or at least 50 microns and thicker still.

Chemical Signature of the Composite Structure:

The composite structure presented herein can be identified by its chemical signature, or fingerprint, as demonstrated in the Examples section that follows. For example, a secondary ion mass spectrogram (SIMS) analysis, obtained for exemplary composite structures according to some embodiments of the present invention, exhibited a characteristic chemical composition as a function of depth of penetration of the ion beam, as can be seen in FIG. 34D or FIG. 34E.

Hence, according to some embodiments of the present invention using tungsten carbide cemented with cobalt and having a diamond film of about 1-1.2 micron deposited on a chromium nitride interlayer of about 1 micron, the composite structure is characterized by at least one of: a concentration of carbon; a concentration of chromium nitride; a concentration of cobalt; and a concentration of tungsten as determined by SIMS spectrum in FIG. 34D or FIG. 34E. In some embodiments the composite structure is characterized by at least two of: a concentration of carbon; a concentration of chromium nitride; a concentration of cobalt; and a concentration of tungsten as determined by SIMS spectrum in FIG. 34D or FIG. 34E. In some embodiments the composite structure is characterized by at least three of: a concentration of carbon; a concentration of chromium nitride; a concentration of cobalt; and a concentration of tungsten as determined by SIMS spectrum in FIG. 34D or FIG. 34E.

In some embodiments the composite structure is characterized by any of: a concentration of carbon; a concentration of chromium nitride; a concentration of cobalt; and a concentration of tungsten, as determined by SIMS spectrum in FIG. 34D or FIG. 34E.

In some embodiments, the SIMS spectrum is as presented in FIG. 34D.

Co-Adhesion and Hardness:

Stemming from the chemical composition, morphology and mechanical properties of the various laminae of the composite structure presented herein, products based on this composite structure are characterized by high adhesion of the coat (interlayer plus diamond film) to the substrate, such that these three chemically distinct strata respond to external forces in unity as if fused into a single stratum. A well established method to estimate the adhesion of laminae disposed over a surface of a substrate is known as a microhardness test (also known as Vickers hardness test), wherein a laminated (coated) substrate is subjected to an impact by a pyramidal-shaped diamond indenter operated under a given load (mass, typically measured in kilograms). The point of indentation is thereafter observed and examined for delamination, fractures and cracks, and the highest load at which the sample shows delamination is regarded as the Vickers hardness value for that given sample.

Exemplary samples of diamond-coated substrates, or composite structures, where subjected to microhardness tests, as discussed and presented in the Examples section that follows below. The microhardness, or Vickers hardness values obtained for these samples further characterize the composite structures presented herein. Hence, according to some embodiments of the present invention, the composite structure is characterized by at least a co-adhesion of the diamond film to the interlayer and of the interlayer to said substrate, as determined by a microhardness test at a load of at least 10 kg. In some embodiments, the composite structure exhibits a co-adhesion at a load of 15 kg, 20 kg, 25 kg, 50 kg or heavier, as determined by a microhardness test. In some embodiments, the composite structure presented herein is characterized by a co-adhesion of the diamond film to the interlayer and of the interlayer to the substrate, which is exhibited by a microhardness test at a load of at least 20 kg.

General Characterization of the Composite Structure:

According to some embodiments of the present invention, the composite structures presented herein, are based on a cemented carbide substrate, an interlayer disposed over the substrate and a contiguous diamond film disposed over the interlayer, wherein the carbide substrate is cemented by a binder, and the interlayer is substantially chromium nitride, the composite structure is characterized by at least one of the following unique characteristics:

the thickness of the interlayer is no more than 20 microns;

the concentration of the binder in the interlayer no more than 0.5 percents by weight;

the concentration of carbon in the interlayer is no more than 0.5 percents by weight; and the co-adhesion of the diamond film to the interlayer and of the interlayer to the substrate, is exhibited by a microhardness test at a load of at least 20 kg.

In some embodiments, the composite structure presented herein is characterized by, for example, a tungsten carbide substrate cemented with 6% cobalt before and after fabrication as well as in the interface with the interlayer, an interlayer of chromium nitride of about 1-2 micron thick having less than 0.1 percents carbon and less than 0.1 percents cobalt therein, and having a 1-2 microns thick diamond film deposited thereon, and further characterized by a coat co-adhesion demonstrated by a microhardness test at a load of 50 kg, wherein an XRD pattern obtained thereto exhibits essentially 8 peaks corresponding with crystalline chromium nitride, tungsten carbide and diamond with no substantial peaks for non-stoichiometric chromium nitride or other species in a notable amount as seen in any one of FIG. 36C, FIG. 37C, FIG. 38C, FIG. 39C, FIG. 40C, FIG. 41C, FIG. 42C or FIG. 43C, and a SIMS spectrum obtained thereto exhibits substance separation by layer as seen in FIG. 34D or FIG. 34E.

In some embodiments, the composite structure presented herein is characterized by, for example, a tungsten carbide substrate cemented with 10% cobalt before and after fabrication as well as in the interface with the interlayer, an interlayer of chromium nitride of about 5 microns thick having less than 0.3 percents carbon and less than 0.3 percents cobalt therein, having a 10 microns thick diamond film deposited thereon, and further characterized by a coat co-adhesion demonstrated by a microhardness test at a load of 20 kg, wherein an XRD pattern obtained thereto exhibits essentially 8 peaks corresponding with crystalline chromium nitride, tungsten carbide and diamond with no substantial peaks for non-stoichiometric chromium nitride or other species in a notable amount as seen in any one of FIG. 36C, FIG. 37C, FIG. 38C, FIG. 39C, FIG. 40C, FIG. 41C, FIG. 42C or FIG. 43C, and a SIMS spectrum obtained thereto exhibits substance separation by layer as seen in FIG. 34D or FIG. 34E.

In some embodiments, the composite structure presented herein is characterized by, for example, a tungsten carbide substrate cemented with 8% cobalt before and after fabrication as well as in the interface with the interlayer, an interlayer of chromium nitride of about 4 microns thick having less than 0.4 percents carbon and less than 0.2 percents cobalt therein, having a 5 microns thick diamond film deposited thereon, and further characterized by a coat co-adhesion demonstrated by a microhardness test at a load of 40 kg, wherein an XRD pattern obtained thereto exhibits essentially 8 peaks corresponding with crystalline chromium nitride, tungsten carbide and diamond with no substantial peaks for non-stoichiometric chromium nitride or other species in a notable amount as seen in any one of FIG. 36C, FIG. 37C, FIG. 38C, FIG. 39C, FIG. 40C, FIG. 41C, FIG. 42C or FIG. 43C, and a SIMS spectrum obtained thereto exhibits substance separation by layer as seen in FIG. 34D or FIG. 34E.

Preparation of the Composite Structure:

As presented hereinbelow, composite structures, according to some embodiments of the present invention, have been successfully prepared reproducibly using a step-wise process as presented herein.

Thus, according to an aspect of some embodiments of the present invention, there is provided a process of preparing a composite structure, which comprises a carbide substrate cemented by a binder, an interlayer disposed over the substrate and a contiguous diamond film disposed over the interlayer, wherein the interlayer is made essentially of crystalline chromium nitride, as presented hereinabove.

According to some embodiments, the process is effected by:

depositing a layer of metallic chromium on to a surface of a cemented tungsten carbide substrate;

nitiridizing the metallic chromium by exposing the metallic chromium deposited on the surface of the substrate to gaseous ammonia at a temperature higher than about 700° C.; and depositing a contiguous diamond film onto the chromium nitride, thereby preparing the composite structure presented herein.

Substrate Preparation:

In the first step of the process, a cemented carbide substrate is provided essentially in a pristine form, clean and ready for further chemical manipulations. An optional cleaning step may be required, depending on the state of the substrate and other conditions. Pre-cleaning may be effected by any known method, including, without limitation, sand blasting, ultrasound in a cleaning solution or slurry, scrubbing, air blowing and the likes. According to some embodiments of the present invention, a pre-cleaning step is effected by sand blasting.

Deposition of a Layer of Metallic Chromium:

The next step includes forming a layer of metallic chromium over the substrate by physical means, as opposed to chemical means. According to some embodiments, deposition is effected by physical vapor deposition (PVD).

According to some embodiments of the present invention, various physical vapor deposition methods can be employed, including, but not limited to, magnetron sputtering, cathodic arc and the likes, including ion-beam sputtering, reactive sputtering, ion-assisted deposition, high-target-utilization sputtering, high-power impulse magnetron sputtering and gas flow sputtering. Such methods are beneficial according to some embodiments of the present invention, since the resulting layer is uniform, thin, dense and generally high-quality layer of metallic chromium. It is noted herein that chemical methods, such as electrolytic deposition, afford layers of weaker adhesion and lower density, and require thicker layering if considered for subsequent diamond coating. It is also noted herein that some chemical depositions would render the resulting article substandard or unacceptable for many industrial applications, due to industrial requirements and regulations.

PVD in general, inclusive of magnetron sputtering, is typically effected at a relatively low substrate temperature, allowing a wide range of substances to be coated by a thin and homogeneous layer of metal. According to some embodiments of the present invention, PVD is effected on the cemented carbide substrate when it is heated to 130-170° C., or alternatively to 150° C.

The rate of forming the layer of metallic chromium affects the uniformity and overall quality thereof. According to some embodiments of the present invention, the PVD process is effected at a rate that ranges from 0.5 micron/hour to 2 microns/hour, or alternatively, at a rate of 1 micron/hour.

At such conditions, the layer of metallic chromium can be formed at high uniformity to a thickness of 0.5 microns and higher. It is noted herein that the thickness of the metallic chromium layer is a function of the conditions and duration of the PVD process, and can be as thick as a few tens of microns, or a few hundreds of microns thick. Since the metallic chromium constitute the chemical and physical basis for the chromium nitride interlayer discussed herein, the thickness of the metallic chromium corresponds to the thickness of the interlayer. Hence, according to some embodiments of the present invention, the layer of metallic chromium is grown to a thickness lower than 20 microns, or alternatively to a thickness lower than 10 microns. According to some embodiments of the present invention, the thickness of the layer of metallic chromium ranges from 1 micron to 2 microns.

Nitridation of the Metallic Chromium:

Once the metallic chromium layer is formed on the substrate, it is turned into chromium nitride in a chemical reaction referred to herein and in the art as nitridation. Like carbides, nitrides are often refractory materials owing to their high lattice energy which reflects the strong attraction of the $N^{3-}$ species for the metal cation. Metallic nitrides can be obtained via ammonia cracking, which is similar to hydrocarbon cracking. In ammonia cracking, gaseous anhydrous ammonia ($NH_3$) is dissociated into hydrogen and nitrogen. The process is typically performed at an elevated temperature within the range 850-950° C. in the presence of the metal.

The formation of highly crystalline chromium nitride promotes the qualities required from an effective interlayer, as these are presented hereinabove. Hence, the nitridation of the layer of metallic chromium is carried out such that the chromium nitride layer is formed with a uniform and high degree of crystallinity throughout the layer, namely balancing speed of cracking to rate of lamina growth. This can be achieved by a careful balance of nitridation conditions, including ammonia flow rate and pressure, as well as substrate temperature.

According to some embodiments of the present invention, the nitridation step is performed at an ammonia flow rate the ranges from about 200 sccm (standard cubic centimeter per minute) to about 500 sccm, or from 300 to 400 sccm. Alternatively, the ammonia flow rate is 350 sccm.

According to some embodiments of the present invention, the nitridation step is performed under a pressure that ranges from about 100 Torr to about 300 Torr, or from 150-250 Torr. Alternatively, the nitridation is effected at about 200 Torr.

According to some embodiments of the present invention, the substrate temperature during the nitridation step ranges from about 600° C. to about 1000° C., or from about 700° C. to about 900° C. Alternatively, nitridation is performed at about 800-850° C.

It is noted herein that the use of a relatively high temperature at which ammonia cracking is performed during the of nitridation step, is not trivial considering the relatively low melting point of the binder in the substrate (for example, melting point of cobalt is 1495° C.), and the effect of the elevated temperature on the substrate. As demonstrated in the Examples section that follows, the present inventor has performed the nitridation process substantially without altering the substrate's composition, at least with respect to the binder's concentration.

The duration of the nitridation reaction is proportional to the parameters presented hereinabove and to the thickness of the metallic chromium layer. Under the aforementioned conditions, a layer of 1-2 microns metallic chromium is nitridized during about 30-90 minutes, or during about 40-80 minutes. Alternatively, nitridation is performed over a time period of about 60 minutes. Longer durations of the nitridation step described herein, up to 2-4 hours, are also contemplated in some embodiment of the present invention, inter alia in order to increase the CrN to $Cr_2N$ ratio in the interlayer. This approach of extending the duration of the nitridation step of the process is suitable also for embodiments of the present invention in which the interlayer is relatively thick. For example, in embodiments where the chromium layer is deposited to a thickness of 2 microns and more, the nitridation process may be extended so as to allow nitride to form deeper into the chromium layer, forming a CrN to $Cr_2N$ gradient; the longer the nitridation process is performed, the more dominant will be the CrN portion in the gradient, up-to a complete transformation of the chromium layer into CrN.

It is noted herein that according to some embodiments of the present invention, in the process of fabricating the composite structures presented herein, the chromium nitride interlayer is formed in two sequential steps of chromium deposition followed by nitridation at high temperature which results in a desired highly crystalline CrN layer, rather than a combined deposition of chromium and nitrogen, which may result in a less crystalline and less stoichiometric chromium nitride layer. Without being bound by any particular theory, it is assumed that the physical deposition of chromium affords a more ordered layer of metallic chromium on the substrate, while heating the chromium-coated substrate to substantially elevated temperatures required for nitrogen cracking, further contributes to the ordering and crystallinity of the resulting chromium nitride layer.

Pre-Carbidization of the Chromium Nitride Layer:

As discussed herein, if carbon diffuses too rapidly into the interlayer, spontaneously-formed diamond nano-seeds are smothered, causing inhibition of diamond film growth. In an attempt to slow the process of carbon diffusion during chemical vapor deposition (CVD) of carbon, which is effected after a seeding process discussed below, carbon may be introduced into the interlayer in limited carbidization reaction, namely the interlayer is exposed to carbon under CVD conditions so as to form a carbide-nitride chromium layer prior to the seeding step. This step is referred to herein as a pre-carbidization process. The pre-carbidization is effected in a CVD process similar to that used for forming the diamond film, as presented in details in the Examples section that follows below, but to a short time.

According to some embodiments of the present invention, the pre-carbidization step is effected by carbidizing the layer of chromium nitride at a temperature that ranges from 500° C. to 800° C., or 600-700° C.

According to some embodiments of the present invention, the pre-carbidization by carbon CVD is effected by exposing the substrate to a mixture of methane and hydrogen at a volume ratio that ranges from 1:90 to 1:99 for a time period that ranges from 10 minutes to 20 minutes.

While reducing the present invention to practice, it has been found that during extended exposure to carbon of the seeded chromium nitride layer under CVD conditions, which was performed so as to afford diamond deposition, the chromium nitride layer underwent carbidization to some extent, but the balance between crystal growth and carbidization was maintained so as not to inhibit seed growth and diamond film formation. Hence, it was concluded that the pre-carbidization process is optional for most cases based on thin interlayers, while in other cases the pre-carbidization step may confer desirable and improved interlayer and strata adhesion properties. As discussed herein, when growing a diamond film on a surface, mild carbidization which occurs at the surface increases adhesion of the diamond film. Hence, it has been concluded that pre-carbidization of the interlayer is optional, and may be subtracted from the process presented herein in some embodiments of the present invention.

Diamond Seeding:

Seeding is a known process in diamond film deposition, which facilitates the formation of the diamond film by diverting the equilibrium between formation of amorphous carbon species and deposition of polycrystalline diamond.

While studying the various stages of diamond film formation, the present inventor has noted that during the first stage of diamond deposition, nanoscale seeds of diamond nucleate spontaneously, and in later stages these seeds grow until they coalesce into a contiguous film which uptake substantially all the deposited carbon as polycrystalline diamond with little influence of the substrate. At that initial stage the activated carbon-containing gas interacts with the substrate material, and diamond formation may be hindered due to competing carbon and hydrogen adsorption and absorption processes, which divert carbon onto and into the substrate in a process known as carbidization (the formation of carbides). The present inventor has further noted that for diamond film formation to take place at the initial seed formation stage, the process of diamond nucleation should balance the competing carbon depleting interactions so as to allow small diamond seeds to grow. It is noted herein that such a delicate balance cannot be achieved on any substance, as some materials favor, and to even catalyze, carbon absorption and graphite formation. For example, diamond film formation is impractical when attempted on pure metallic chromium, iron and/or cobalt due to a fast formation of carbides that reduces the amount of available carbon and results in etching (blocking) of the microscopic diamond particles. Nonetheless, the present inventor has noted that if the carbon-receiving surface does not react with carbon to some extent, the diamond particles exhibit poor adhesion to the surface. As stated herein, chromium nitride possesses these required qualities. The present inventor has therefore contemplated that a thin layer of chromium nitride interlayer may hinder the activity of cobalt towards the diamond film while improving adhesion between the cemented carbide substrate and the diamond film.

Hence, another function of the chromium nitride interlayer, or a layer of chromium nitride, is to serve as suitable bedding capable of retaining microscopic diamond seeds in the seeding step of the process. It is noted herein that a highly crystalline chromium nitride layer is particularly suitable to embed diamond seeds while allowing these seeds to grow during the subsequent carbon CVD process.

According to some embodiments of the present invention, the seeding process is effected by subjecting the substrate having a chromium nitride layer disposed thereon to an abrasive slurry containing small diamond particles, under ultrasound condition. According to some embodiments, the diamond particles are less than 0.25 µm in diameter. Details of an exemplary typical diamond seeding process are presented in Akhvlediani, R. et al., *Diamond Relat. Mat.*, 11 (2002), p. 545, which is incorporated herein by reference.

Diamond Film Deposition:

It is well known that CVD can be used to produce synthetic diamond by creating the circumstances necessary for carbon atoms in a gas to settle on a substrate in a polycrystalline form. According to some embodiments of the present invention, polycrystalline diamond consisting of grain sizes from several nanometers to several micrometers can be grown. While some polycrystalline diamond grains may be formed having a thin, non-diamond or amorphous carbon coat, the polycrystalline diamond film, according to some embodiments of the present invention, do not exhibit a notable coat of amorphous carbon.

CVD of diamond is typically effected under low pressure of about 10 to 200 Torr, and involves feeding a mixture of gases into a chamber, including primarily a carbon source such as methane and typically including hydrogen gas as well, energizing the gas mixture by heat and providing conditions for diamond growth by heating the substrate. The energy source is typically a hot filament, but may also be based on microwave power and arc discharges, among others. The energy source is intended to generate plasma in which the gases are broken down and their elements become available for further reactions. Carbon CVD allows to grow diamond over large areas on a substrate, and to control the properties of the produced diamond in terms of grain size, crystallinity, thickness and the likes.

According to some embodiments of the present invention, a diamond film is grown directly on the substrate having a chromium nitride (CrN) layer disposed thereon. As discussed herein, the relative compatibility between the heat expansion coefficients of diamond and CrN, such direct deposition still allows good adhesion of the two strata to each other after the sample has been cooled.

Hence, according to some embodiments of the present invention, the diamond film is formed on the layer of chromium nitride, after a seeding treatment, as follows:

the cemented tungsten carbide substrate, having a layer of chromium nitride deposited on its surface that undergone diamond-seeding treatment, is heated to a temperature that ranges from 500° C. to 800° C.; and the substrate is exposed to a gaseous mixture of methane and hydrogen at a volume ratio that ranges from 1:90 to 1:99, which is thermally activated by a hot filament.

According to some embodiments, the pressure of the gas mixture containing a carbon source, ranges from 40 Torr to 60 Torr.

Depending on the desired thickness of the diamond film, the carbon CVD is performed for a time period that ranges from 30 minutes to 10 hours.

It is noted herein that XRD analysis conducted for exemplary composite structures prepared according to some embodiments of the present invention, showed that the CrN interlayer did not change substantially with respect to its chemical composition or its degree of crystallinity during the CVD process. It is noted that a small peak corresponding to crystalline chromium carbide (CrC) appears in the XRD data after diamond deposition, however, as a bulk, the interlayer is substantially unchanged.

Accordingly, there is provided a composite structure based on a cemented carbide substrate and a chromium nitride interlayer having a diamond film deposited thereon, as presented herein, produced by the process presented herein.

In some embodiments, the composite structure produced by the herein disclosed process is characterized by at least one of: a thickness of the interlayer is no more than 20 microns; a concentration of the binder in the interlayer no more than 0.5 percents by weight; a concentration of carbon in the interlayer is no more than 0.5 percents by weight; and a co-adhesion of the diamond film to the interlayer and of the interlayer to the substrate, is exhibited by a microhardness test at a load of at least 20 kg, as discussed hereinabove.

In some embodiments, the composite structure prepared by the herein disclosed process is characterized by any of the features as described hereinabove.

Applications:

Since diamond has the highest hardness and thermal conductivity of any bulk material, layering diamond onto high performance hard substance such as cemented carbide substrate, allows the resulting composite structure to be used in a wide range of applications. The composite structures, and the process for affording the same presented herein, which are based on the surprisingly found methodology for forming well adhered diamond film on cemented carbide substrates without losing fine structural features of the substrate due to a too-thick diffusion barrier interlayer, open the way to a wide range of highly desired applications where diamond coating is necessary.

Without limitation, the composite structures presented herein, comprising a diamond coated cemented carbide substrates, can be used to produce a wide variety of tools and other objects and articles of manufacture that benefit from diamonds extreme hardness, exceedingly low wear rate, very high scratch resistance, strong lipophilicity, low friction coefficient (close to that of polytetrafluoroethylene), low thermal expansion coefficient and high thermal conductance.

According to some embodiments of the present invention, the substrate itself may be in a form of a layer or coating over another substance, and the composite structure presented herein can form a part of a higher-level composite structure, constituting a top coating of a higher-level substrate. For example, the higher-level substrate is a steel object having a coating of cemented tungsten carbide disposed thereon, wherein the cemented tungsten carbide is the cemented carbide substrate in the composite structure provided herein.

Hence, according to an aspect of embodiments of the present invention, there is provided an article of manufacture comprising the composite structure presented herein. Such article of manufacture may include, without limitation, a cutting tool, a valve, a ring, a drill bit, an end mill, a router, a thread mill, a tap, a polishing pad, a blade, a punch head, and a wide range of machining tools and diamond coated surfaces for various tribological applications.

It is noted that previously known methodologies of diamond film formation which required a thick interlayer of 20 microns, would be disadvantageous when applied to substrates exhibiting fine structural features. Hence, it is noted herein that the cemented carbide based substrates, coated with a diamond film according to some embodiments of the present invention, may exhibit structural features, such as slits, holes, bulges, protrusions, projections, grooves, corners and edges, which are substantially maintained during the diamond deposition, and are not lost due to the coating of chromium nitride and diamond. Such features may be as small and fine as 1-5 microns, or 1-10 microns, or 1-20 microns and larger, or measure 5-10 microns or 5-20 microns and larger.

The presently provided composite structures and the methodology for affording the same are useful in obtaining objects with low corner radii. The term "corner radius" describes how rounded the corners are on a substantially rectangular object, and refers to the radius of the circle created by extending the corner's arc to form a complete circle. A rounded corner rectangle object describes a rectangular object with at least one corner radius greater than 0.0 (the radius of a square corner). Hence, according to some embodiments of the present invention, the corner radius attainable in a diamond-coated cemented carbide composite structure, as provided herein, can be as low as 2 microns, 5 microns, 10 microns, 15 microns, 20 microns, 25 microns, 40 microns, 50 microns, 100 microns, 150 microns or as low as 200 microns. In other words, an article of manufacture based on the composite structure presented herein, may be characterized, according to some embodiments of the present invention, by at least one corner having a corner radius lower than 2 microns, lower than 5 microns, lower than 10 microns, lower than 15 microns, lower than 20 microns, lower than 25 microns, lower than 40 microns, lower than 50 microns, lower than 100 microns, lower than 150 microns or lower than 200 microns. According to some embodiments of the present invention, the article of manufacture is characterized by at least one corner having a corner radius lower than 100 microns.

It is expected that during the life of a patent maturing from this application many relevant methodologies and techniques for diamond coating of tungsten carbide will be developed and the scope of the term diamond-coated tungsten carbide is intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Materials and Methods

Materials

Sintered tungsten carbide cobalt alloy (WC—Co) samples were provided by ISCAR Metalworking, Israel. All experimental results presented herein have been performed using industrial grade WC—Co alloy substrates having 6% cobalt (WC-6% Co, commercial name CNMA432/IC07) and 10% cobalt (WC-10% Co, commercial name CNMA432/IC08) content.

Chromium source was purchased from Mark Technologies Ltd, Israel.

Ammonia (99.8% grade) used in nitridation was purchased from Maxima Ltd, Israel.

$CH_4/H_2$ gas mixture, exhibiting 99 percents methane and 1 percent hydrogen by volume was formed from commercially available $CH_4$ and $H_2$ purchased from Maxima Ltd, Israel.

Experimental Methods:

Sand blasting was effected using 50 micron size alumina particles for surface cleaning at standard conditions. The process was carried out using an Airbrasive model K operated at a pressure of 75 psi.

Deposition of metallic chromium was performed using an LS-320S DC magnetron sputtering system operated at 200 W, 20 sccm (standard cubic centimeter per minute) Ar flow, system pressure of 9 mTorr, sample rotation of 2.5 rpm and sample temperature of about 150° C. at a deposition rate of about 1 micron/hour.

Nitridation was performed using a house-made flow oven operable in a 500-1000° C. temperature range, 1-500 Torr pressure range and flow range 1-400 sccm.

Ultrasonic abrasion in slurry was performed using an ultrasonic cleaner provided by MRC, following the ultrasonic methodology for the enhancements of diamond nucleation described in the art [Akhvalediani, R. et al., *Diam. Rel. Mat.*, 11(3-6), 2002, 545-549].

Diamond deposition was performed using a house made hot filament chemical vapor deposition (HF-CVD) system. The HF-CVD system was operated at substrate temperature of about 650° C., gaseous mixture of $CH_4/H_2$ (methane to hydrogen) at a volume ratio of 1:99, system pressure of 50 Torr, and gas flow of 100 sccm, activation filament (Re) temperature of 2000° C. for a varying deposition time according to the required film thickness.

Raman spectroscopy was performed using a Dilor system in the 1000-1800 cm-1 wavenumber range using an incident laser power of 10 MW and incident laser wavelength of 514.5 nm.

Secondary ion mass spectrometry (SIMS) was performed using a dual-beam mode using an IonTOF-5 apparatus at a basic chamber pressure of $10^{-10}$ Torr. A $Cs^+$ ion beam (2 kV), pulsed at frequency of 50 Hz and rastered over a sampling area of 75 $\mu m^2$ was applied to sputter the samples, while a $Bi^+$ ion beam (25 kV) was used as the analysis probe for secondary negative ions. Alternatively, a $Bi_3^{++}$ ion beam (25 kV) was used as the analysis probe for secondary $MCS^+$ cluster ions, which are known to be less subjective by the matrix effect.

X-ray photoelectron spectroscopy (XPS) was performed using an Al Ka X-ray source (XR50) and Hemispherical Energy Analyzer PHOIBOS 150 MCD operated in a small area mode. Both systems were supplied by SPECS, Germany.

The interlayer phases were identified and characterized by X-ray diffraction (XRD) using Cu—K radiation. XRD patterns have been recorded using a Rigaku MiniFlex X-ray diffractometer equipped with a Cu X-ray tube (CuKα radiation of a 1.54 Å wavelength) operated at 30 kV and 15 mA. Spectra were collected in the range of 30-70° 2θ, using an integrating time of 2.5 sec per step and a step size of 0.01° 2θ.

Microhardness tests were performed using a commercial Vickers Hardness tests system. The indentation measurements were carried out using a single crystal diamond pyramid and a 10 kg, 20 kg or 50 kg load.

SEM images were obtained using FEI (USA) Quanta 200 scanning electron microscope in secondary electrons (SE) mode at 25 keV energy of primary electrons.

AFM measurements were performed using a commercial scanning probe microscope DI 3100 NANOSCOPE IIIa system produced by Digital Instruments, Veeco, images were obtained in the non-contact mode using ultra sharp Si3N4 tips.

Example 1

Diamond Film Formation on a WC—Co Substrate

Formation of a CrNx Interlayer:

A set of 12 samples consisting of 3-5 diamond films deposited onto sintered tungsten carbide cobalt alloy (WC-6% Co and WC-10% Co), using an interlayer comprising chromium nitride (CrNx), according to some embodiments of the present invention, were prepared as follows.

A CrNx interlayer was deposited on each of the WC—Co samples in the following sequential steps:

Sample Preparation:

The WC—Co substrate was subjected to a cleaning procedure, effected by sand blasting the substrate samples for about 5 minutes per sample as described hereinabove (see, Materials and Methods), using alumina particles in order to remove contaminations. This process is assumed not alter or modify the WC—Co sample's compositional, morphological and mechanical properties of the WC—Co substrate surface but predominantly cleaning its surface from environmental contaminants. Following sand blasting the samples were subjected to ultrasonic cleaning for 10 minutes in acetone for removal residues sand particles after the blasting procedure and rapid drying.

Chromium Coating:

Thereafter, a layer of metallic chromium films (typically being of a thickness of 1 or 2 microns) were deposited on the cleaned substrate (WC-6% Co and WC-10% Co) samples by magnetron sputtering as presented hereinabove (see, Materials and Methods). Samples coated with a layer of chromium, of 2 microns or more, were also prepared.

Chromium Nitride Layer:

Nitridation of the metallic Cr layer deposited on the substrates was thereafter performed by exposure of the samples as described hereinabove (see, Materials and Methods) to ammonia at a constant flow of 350 sccm (standard cubic centimeter per minute) under a pressure of about 200 Torr and a substrate temperature of 800° C. for about 60 minutes or more (e.g., 2 hours). Some of the samples having 2 microns chromium layers deposited thereon were exposed for longer periods of time, e.g. for 2 hours, so as to form crystalline CrN deeper into the single layer of chromium, which thereby constituted a "gradiented single layer". As discussed hereinabove, the penetration of nitrogen into the thicker single chromium layer formed a gradient of CrN to $Cr_2N$, wherein the longer the nitridation was effected, the deeper the CrN portion was observed.

Prior to deposition of a diamond film thereon, the deposited chromium film and the formed chromium nitride layer were characterized by XPS, XRD, SEM and SIMS methods.

FIGS. 1A-C present XPS spectra measured for a 1 micron thick chromium to layer deposited on a WC-10% Co substrate by magnetron sputtering (FIG. 1A), a chromium nitride layer obtained by nitridation of a chromium layer (FIG. 1B), and a chromium nitride-carbide layer obtained by carbidization of a chromium nitride layer (FIG. 1C).

As XPS is a surface chemical analysis technique, it is used in the context of the preset embodiments to analyze the surface chemistry of the sample in its "as received" state, or after some treatment, for example, fracturing, exposure to ultrasound or sand blasting to clean off some of the surface contamination, and the likes.

As can be seen in FIGS. 1A-B, following nitridation, the spectra exhibits a characteristic N(1s) peak which is absent in the spectrogram of the pristine chromium layer. Analysis of the spectrum shows that the nitride layer is nearly stoichiometric, namely a 1:1 Cr:N ratio near the surface of the nitride interlayer. Similar XPS results were obtained for the chromium nitride interlayer obtained for a 2 micron thick layer. FIG. 1C is discussed hereinbelow.

FIGS. 2A-B present XRD patterns obtained for a 1 micron thick chromium nitride, formed onto a WC-6% Co substrate, wherein FIG. 2A shows the photon count per second and FIG. 2B shows Log 10 of the counts.

FIGS. 3A-B present XRD patterns obtained for a 2 microns thick chromium nitride, formed onto a WC-6% Co substrate (counts per second in FIG. 3A and Log 10 of the counts in FIG. 3B).

FIGS. 4A-B present XRD patterns obtained for a 1 micron thick chromium nitride, formed onto a WC-10% Co substrate (counts per second in FIG. 4A and Log 10 of the counts in FIG. 4B).

FIGS. 5A-B present XRD patterns obtained for a 2 microns thick chromium nitride, formed onto a WC-10% Co substrate (counts per second in FIG. 5A and Log 10 of the counts in FIG. 5B).

As can be seen in the diffraction patterns presented in FIGS. 2A-5B, nitridation of a 1 micron chromium layer, deposited on both the 6% and the 10% cobalt content substrates resulted in the formation of a nitride layer predominantly composed of the CrN phase. However nitridation of the 2 microns thick chromium layer resulted in the formation of a complex nitride interlayer of CrN and $Cr_2N$ phase composition. This phase composition is referred to hereinabove as a "gradiented single layer" characterized by a gradient of CrN to CrxN, wherein x is typically 2. It should be mentioned that the XRD patterns shown in FIGS. 2A-5B, show that the chromium nitride layers, formed by nitridation of the metallic chromium layers by the procedure described above, display a high degree of crystallinity, as can be discerned by the intensity and sharpness of the diffraction peaks. Samples having thicker layers of chromium also displayed diffraction patterns typical to crystalline chromium nitride dominating the CrN to $Cr_2N$ gradient (data not shown).

The results presented hereinabove, showing sharp X-ray reflection peaks in an XRD pattern obtained for the chromium nitride layer according to some embodiments of the present invention, are in contrast to the results expected by direct deposition of stoichiometric CrN using magnetron sputtering (MS) at 200-400° C., for which much broader diffraction peaks are typically obtained. Without being bound by any particular theory, it is assumed that chromium nitride, deposited by magnetron sputtering at the 200-400° C. temperature range, is composed mainly of an amorphous form, whereas thermal cracking of ammonia over metallic chromium, as carried out according to some embodiments of the present invention, results predominantly with microcrystalline chromium nitride (an CrN interlayer).

FIGS. 6A-B present SEM micrographs of a 1 micron thick chromium layer deposited onto a WC-6% Co substrate, wherein FIG. 6A is an image at a ×20,000 magnification and FIG. 6B is an image at a magnification of ×50,000.

FIGS. 7A-B present SEM micrographs of a 1 micron thick chromium nitride layer deposited onto a WC-6% Co substrate (×20,000 in FIG. 7A and ×50,000 FIG. 7B).

As can be seen in FIGS. 6A-B and FIGS. 7A-B, the morphology of the chromium film consists of a net of "star-like" microstructure assumed to be associated with a stress relaxation effect. Following nitridation, the morphology of the layer becomes smoother and displays a "net-like" morphology. The texture and microstructure of the chromium and chromium nitride layers, as deposited to a thickness of 2 microns, displayed a similar morphology (data not shown). Similar SEM pictures were obtained upon deposition of the films onto the WC-10% Co substrate (data not shown).

Pre-Carbidization Alternative:

In order to study alternative processes for promoting adhesion of a diamond film on top of the chromium nitride interlayer according to some embodiments of the present invention, the interlayer was prepared in a process comprising a pre-carbidization step. This was performed by exposing a chromium nitride layer to CVD conditions similar to those used for diamond film deposition for 15 minutes, namely exposure to a 1:99 vol % $CH_4:H_2$ gas mixture, at a gas flow of 100 sccm, system static pressure of 50 torr, substrate temperature of 650° C. and activation filament temperature of 2,000° C.

FIG. 1C presents an XPS spectogram measured for a 1 micron thick chromium layer deposited on a WC-6% Co substrate by magnetron sputtering, which has been subjected to nitridation as described hereinabove to obtain a chromium nitride layer, followed by carbidization of the chromium nitride layer (FIG. 1C).

As can be seen in FIG. 1C, carbidization reduced the intensity associated with nitrogen (N(1s)) and appearance of a pronounced line at 285 eV (BE) associated with the C(1s), comparison with those obtained for the chromium nitride layer without carbidization. Similar results were obtained for a 2 microns thick layers and for 1 micron and 2 microns layers deposited on a WC-10% Co substrate (data not shown).

FIGS. 8A-B present SEM micrographs showing the microstructure and texture of a 1 micron thick chromium nitride carbide (CrNxC) layer deposited onto a WC-6% Co substrate (×20,000 in FIG. 8A and ×50,000 FIG. 8B).

As can be seen in FIGS. 8A-B, the microstructure of the CrNxC layer is very similar to that observed for the chromium nitride (CrN) layer (see, FIGS. 7A-B). Similar results were obtained for the 2 microns thick layers and for samples prepared on a WC-10% Co substrate (data not shown).

FIGS. 9A-B present XRD diffraction patterns of a 1 micron thick CrNxC layer, deposited onto a WC-6% Co substrate (counts per second in FIG. 9A and Log 10 of the counts in FIG. 9B).

FIGS. 10A-B present XRD diffraction patterns of a 2 microns thick CrNxC layer, deposited onto a WC-6% Co substrate (counts per second in FIG. 10A and Log 10 of the counts in FIG. 10B).

FIGS. 11A-B present XRD diffraction patterns of a 1 micron thick CrNxC layer, deposited onto a WC-10% Co substrate (counts per second in FIG. 11A and Log 10 of the counts in FIG. 11B).

FIGS. 12A-B present XRD diffraction patterns of a 2 microns thick CrNxC layer, deposited onto a WC-10% Co substrate (counts per second in FIG. 12A and Log 10 of the counts in FIG. 12B).

As can be seen in FIGS. 9A-B and 10A-B, when compared to the XRD obtained for the chromium nitride layers (see, FIGS. 2A-B and FIGS. 3A-B, respectively), the effect of carbidization is hardly noticeable. However, small peaks associated with $Cr_7C_3$ were observed in the XRD pattern of the carbidized 2 microns thick chromium nitride layer deposited onto the WC-10% Co. As can be seen in FIGS. 11A-13 and 12A-B, similar diffraction peaks were obtained for the carbidization of the 1 micron and 2 microns thick chromium nitride layer deposited onto the WC-10% Co substrate, respectively.

By comparing the XPS and XRD results shown above it can be determined that the effect of carbidization of the chromium nitride interlayer is the formation of a thin chromium carbide layer and complete desorption of nitrogen from the near surface region. It is estimated that the thickness of this chemically modified near surface region is in the 30-60 Å range.

Hereinafter, substrates having an uncarbidized chromium nitride (CrN) layer thereon are referred to herein as undergone "pretreatment A" (see, Table 1 hereinbelow), and substrates having a carbidized chromium nitride ($Cr_xNC$) layer thereon are referred to herein as undergone "pretreatment B".

Pre-Treatment for Enhancement of Diamond Nucleation and Formation:

In order to deposit smooth polycrystalline diamond films, the surface of the chromium nitride interlayer, prepared and characterized as described hereinabove, was subjected to a pre-treatment and seeding procedure, as previously described for other substrates [Akhvlediani, R. et al., *Diamond Relat. Mat.*, 11 (2002), p. 545]. Briefly, the seeding procedure involved exposure of the WC—Co/interlayer stack to ultrasonic abrasion in slurry of metal or alumina particles (40-100 μm in diameter) and diamond (less than 0.25 μm in diameter) particles dispersed/suspended in acetone.

The ultrasound energy was set to 120 W, frequency 40 kHz for 40 minutes, and thereafter the samples were washed in acetone and dried in nitrogen flow. This treatment afforded diamond nucleation centers at a high density (up to $5 \times 10^{10}$ cm$^{-2}$, as measured by AFM) over the chromium nitride layer, which allowed the deposition of a continuous diamond film from a minimal thickness of about 100 nm and exhibiting average areal grain sizes of about 50 nm.

Diamond Film Formation by Chemical Vapor Deposition:

The diamond film deposition was carried out on pre-treated (seeded) surfaces using the following deposition conditions: substrate temperature was about 650° C., gaseous mixture of $CH_4/H_2$ (methane to hydrogen) at a ratio of 1:99% by volume, was flowed at a pressure of 50 Torr, and gas flow of 100 sccm, for a varying deposition time according to the required film thickness. Continuous high-quality diamond films having a thickness of about 3 microns and a final areal grain size of 1.5-2 microns have been obtained upon a deposition time of 6 hours under the aforementioned deposition conditions. It is noted that the diamond film can be grown thicker than 3 microns as a function of carbon supply rate and duration of exposure thereto. It is also noted that at the methodology presented herein, a contiguous and homogeneous diamond film can be grown as thin as half a micron without gaps or breaks, presumably due to the seeding procedure and the small initial grain size at the initial stages of the carbon deposition process.

The diamond-coated WC—Co samples, each prepared by performing CVD of carbon for 6 hours as described herein, are presented in Table 1.

TABLE 1

| Sample Name | Interlayer | Substrate type | Remark |
|---|---|---|---|
| Sample 1 | None | WC—6%Co | Reference control |
| Sample 2 | 1 μm $Cr_xN$ | WC—6%Co | pretreatment A |
| Sample 3 | 1 μm $Cr_xNC$ | WC—6%Co | pretreatment B |
| Sample 4 | 2 μm $Cr_xN$ | WC—6%Co | pretreatment A |
| Sample 5 | 2 μm $Cr_xNC$ | WC—6%Co | pretreatment B |
| Sample 6 | 1 μm $Cr_xN$ | WC—6%Co | pretreatment A and slow cooling |
| Sample 7 | 1 μm $Cr_xNC$ | WC—6%Co | pretreatment B and slow cooling |
| Sample 8 | None | WC—10%Co | Reference control |
| Sample 9 | 1 μm $Cr_xN$ | WC—10%Co | pretreatment A |
| Sample 10 | 1 μm $Cr_xNC$ | WC—10%Co | pretreatment B |
| Sample 11 | 2 μm $Cr_xN$ | WC—10%Co | pretreatment A |
| Sample 12 | 2 μm $Cr_xNC$ | WC—10%Co | pretreatment B |

In general, the diamond films deposited on WC—Co via an interlayer of chromium nitride, according to some embodiments of the present invention, were found to display an excellent adhesion to the WC—Co substrates. The degree of adhesion was estimated by microhardness (indentation) tests, as presented hereinbelow, wherein the substrate, the interlayer and the diamond film co-indented when the samples were subjected to increasing indenter loads.

These microhardness tests and other analyses and characterization tests are to discussed in the following examples.

Example 2

Mechanical Evaluation of Diamond-Coat WC—Co Substrates

Tribological Tests:

Tribological measurements (microhardness and fracture analysis) and evaluation of all samples were carried out at the ISCAR Metalworking research and development unit, Tefen, Israel. For comparison purposes, similar tribological measurements were carried out on diamond films deposited on WC—Co substrates by the commercial diamond-coated WC—Co vendors SP3 Diamond Technologies (California, USA, hereinafter SP3) and CemeCon AG (Germany, hereinafter Cemecon).

The tribological evaluation consisted of microhardness and fracture experiments followed by optical and SEM examination of the samples.

Microhardness Tests:

Adhesion of the diamond films to the WC—Co substrate was evaluated by the microhardness (indentation) technique using a pyramid-shaped diamond indenter. The adhesion strength of this film could be evaluated by correlation to the load, applied to the diamond indenter, necessary to induce delamination and fracture of the deposited to diamond film. In these microhardenss measurements the load was 20 kg or 50 kg.

Following the indentation tests, the samples were cleaned by ultrasound to remove any debris produced by the indentation process. The results were obtained by visual inspection and qualitative evaluation of visible delamination or lack thereof.

For example, a high-quality diamond film which is well adhered to the substrate would be indented with the substrate and the interlayer (co-indented) without separating therefrom and without showing fractures and cracks. This co-indentation of all layers during a microhardness test at increasing loads is regarded as an indication for strong adhesion of the diamond film to the substrate via the interlayer. The adhesion strength of this film was therefore evaluated by measuring the load, applied to the diamond indenter, necessary to induce delamination and fracture of the deposited diamond film.

The morphology of the substrate surface and of the deposited films was examined by optical microscopy following the indentation process and ultrasonic cleaning. The optical pictures of the samples after indentation have been obtained using an optical microscope operated at a magnification of ×200, ×300 or ×500.

FIG. 13 presents an optical image at a magnification of ×200 of Sample 1 (direct diamond deposition without an interlayer on a WC-6% Co substrate) which has been subjected to a microhardness test at a load of 20 kg.

As can be seen in FIG. 13, indentation of Sample 1 caused extensive delamination of the diamond film at a radius of about 10 microns, which is indicative of poor adhesion of the films to the substrate.

FIG. 14 presents an optical image at a magnification of ×200 of Sample 2 which has been subjected to a microhardness test at a load of 20 kg.

As can be seen in FIG. 14, indentation of Sample 2 caused no delamination of the diamond film, but resulted in fractures of the coat, which is indicative of an improvement conferred by the interlayer in the adhesion the diamond film to the substrate.

FIG. 15 presents an optical image at a magnification of ×200 of Sample 3 which has been subjected to a microhardness test at a load of 20 kg.

As can be seen in FIG. 15, indentation of Sample 3 caused no delamination of the diamond film, but resulted in fractures of the coat. This result is also indicative of the fact that the interlayer resulted in an improvement of the adhesion of the diamond to film to the substrate.

FIGS. 16A-B present optical images at a magnification of ×200 of Sample 4 which has been subjected to a microhardness test at two points at a load of 20 kg.

As can be seen in FIGS. 16A-B, indentation of Sample 4 caused no delamination of the diamond film, and only to fracture of the interlayer/film coat.

FIG. 17 presents an optical image at a magnification of ×200 of Sample 5 which has been subjected to a microhardness test at a load of 20 kg.

As can be seen in FIG. 17, indentation of Sample 5 caused no delamination of the diamond layer, but only to the fractures of the coat.

Direct diamond film deposition onto WC-10% Co without interlayer (Sample 1) resulted in delamination of the film during the cooling down upon termination of the deposition process, therefore no film was obtained upon direct deposition onto this sample.

FIGS. 18A-B present optical images at a magnification of ×200 (FIG. 18A) and ×500 (FIG. 18B) of Sample 9 which has been subjected to a microhardness test at a load of 20 kg, and FIG. 18C is a SEM image of the same diamond coating after indentation at a magnification of 2,000.

As can be seen in FIGS. 18A-C, indentation of Sample 9 caused no delamination of the diamond layer, but only to small cracks in the films surface. These result are indicative of the good adhesion of the films to the substrate.

FIGS. 19A-B present optical images at a magnification of ×200 (FIG. 19A) and ×500 (FIG. 19B) of Sample 10 which has been subjected to a microhardness test at a load of 20 kg.

As can be seen in FIGS. 19A-B, indentation of Sample 10 caused no delamination of the diamond layer, but only to cracks in the films, indicating very good adhesion.

FIGS. 20A-C present optical images at a magnification of ×200 (FIG. 20A), ×500 (FIG. 20B) and ×300 (FIG. 20C) of Sample 11 which has been subjected to a microhardness test at two points, wherein point 1 (FIGS. 20A-B) were indented at a load of 20 kg, and point 2 (FIG. 20C) at a load of 50 kg, respectively.

As can be seen in FIGS. 20A-C, indentation of Sample 11 caused no delamination of the diamond layer, but only to cracks in the films, indicating excellent to adhesion of the films to the substrate.

FIGS. 21A-C present optical images at a magnification of ×200 (FIG. 21A), ×500 (FIG. 21B) and ×300 (FIG. 21C) of Sample 12 which has been subjected to a microhardness test at two points, wherein point 1 (FIGS. 21A-B) were indented at a load of 20 kg, and point 2 (FIG. 21C) at a load of 50 kg, respectively.

As can be seen in FIGS. 21A-C, indentation of Sample 12 caused no delamination of the diamond layer, but only to cracks, indicating excellent adhesion of the films to the substrate.

FIGS. 22A-D present optical images at a magnification of ×200 (FIGS. 22A and 22C) and ×500 (FIGS. 22B and 22D), taken for two commercial samples by SP3 (FIGS. 22A-B) and two commercial samples by Cemecon (FIGS. 22C-D), which have been subjected to microhardness tests at a load of 20 kg.

As can be seen in FIGS. 22A-D, indentation of the commercial samples caused noticeable delamination of the diamond film along side with cracks in the coat, indicating a poor adhesion of the films to the substrate.

In conclusion, the results of the microhardness tests presented herein clearly demonstrate that no delamination events occurred up to a load at least of 20 kg for samples prepared with an interlayer as described herein. Microhardness measurement carried out for some samples at a load of 50 kg also exhibited no delamination of the diamond films but only some cracks in the coat. All these microhardness measurements show that the chromium nitride interlayer, with or without carbidization (pretreatment), results in very good adhesion of the films to the substrate.

Fracture Electron Microscopy:

The chemical and mechanical properties of the composite structure presented herein were investigated by fracture analysis. In these experiments, the diamond film, the chromium nitride/carbide interlayer and the WC—Co substrate are fractured and the fracture was thereafter examined by SEM.

FIG. 23 presents a SEM image of the fracture profile of Sample 1 (WC-6% Co substrate, coated with a diamond film without a chromium nitride interlayer), showing the edge of the sample at a magnification of 5,000.

As can be seen in FIG. 23, the diamond film exhibited delamination near the to fracture, indicating poor adhesion. This result is in agreement with the microhardness measurements described above.

FIGS. 24A-D present SEM images of the fracture of Sample 6, showing the edge of the sample at a magnification of 1,500 (FIG. 24A), the diamond surface of the sample at a magnification of 2,000 (FIG. 24B) and of the fracture profile of the sample near the edge at a magnification of 2,500 (FIG. 24C) and 10,000 (FIG. 24D).

As can be seen in FIGS. 24A-D, the diamond film and interlayer look homogeneous, the fracture lead to some delamination only at the edge of the sample, while excellent adhesion is observed between the diamond film and interlayer and between interlayer and the substrate in the major part of the sample. This result demonstrates excellent adhesion of the entire complex, namely the substrate\interlayer interface and the interlayer\diamond film interface, as well as demonstrates that the adhesion forces between the layers are larger than the combined cohesion forces.

FIGS. 25A-D present SEM images of the fracture for Sample 7, showing the edge of the sample at a magnification of 1,500 (FIG. 25A), the diamond surface of the sample at a magnification of 2,000 (FIG. 25B) and of the fracture profile of the sample at a magnification of 2,500 (FIG. 25C) and 10,000 (FIG. 25D).

As can be seen in FIGS. 25A-D, the fractured surfaces do not show any delamination at the different interfaces, demonstrating excellent adhesion therebetween.

FIGS. 26A-H present SEM images taken for a fracture of Sample 9, showing the edge of the sample at a magnification of 1,000 (FIG. 26A), 10,000 (FIGS. 26B-C) and 30,000 (FIGS. 26D-E), the diamond surface of the sample at a magnification of 2,000 (FIG. 26F), and the fracture profile at an angle and a magnification of 5,000 and 5,500 (FIG. 26G and FIG. 26H respectively).

As can be seen in FIGS. 26A-H, the results are consistent with high adhesion of the various layers deposited on the substrate.

FIGS. 27A-E present SEM images taken for a fracture of Sample 10, showing the edge of the sample at a magnification of 1,500 (FIG. 27A), the fracture profile of the sample at a magnification of 1,000, 2,500 and 10,000 (FIGS. 27B-D respectively), and the diamond surface of the sample at a magnification of 2,000 (FIG. 27E).

As can be seen in FIGS. 27A-E, Sample 10 shows not only a uniform coating, to but also excellent adhesion at the edge of the sample.

FIGS. 28A-D present SEM images taken for a fracture of Sample 11, showing the edge of the sample at a magnification of 1,500 (FIG. 28A), the diamond surface of the sample at a magnification of 2,000 (FIG. 28B), and the fracture profile of the sample at a magnification of 2,500 and 10,000 (FIGS. 28C-D respectively).

As can be seen in FIGS. 28A-D, the results are consistent with high adhesion, uniformity and reproducibility of the various layers coating the substrate.

FIGS. 29A-D present SEM images taken for a fracture of Sample 12, showing the edge of the sample at a magnification of 850 (FIG. 29A) and the fracture profile of the sample at a magnification of 2,500, 10,000 and 30,000 (FIGS. 29B-D respectively).

As can be seen in FIGS. 29A-D, the results are consistent with high adhesion, uniformity and reproducibility of the various layers coating the substrate.

The results presented herein indicate that the interlayer and pretreatment for the enhancement of diamond nucleation, according to some embodiments of the present invention, confer excellent adhesion of the diamond film deposited onto the WC—Co for the sample of 6% Co and 10% Co, as well as high degree of reproducibility.

For comparison purposes, similar fracture analysis measurements were carried out on commercially available diamond-coated WC—Co substrates, produced according to known methodologies by the commercial vendors SP3 and Cemecon. The thickness of the Cemecon-made diamond-coated substrate was in the 5-10 micron range, varying non-homogeneously across the surface, and the non-homogeneous thickness of the diamond film of the SP3-made sample was in the 20-30 micron range.

FIGS. 30A-D present SEM images taken for a fracture of a diamond film deposited onto WC-6% Co, prepared by Cemecon, using a proprietary diamond-coating process, showing the fracture of the sample at a magnification of ×800 (FIG. 30A), at a magnification of ×12,000 (FIG. 30B), and the plain view of the diamond film surface, showing the Cemecon-made diamond film microstructure at a magnification of ×20,000 (FIG. 30C) and ×40,000 (FIG. 30D).

Figure 30C:
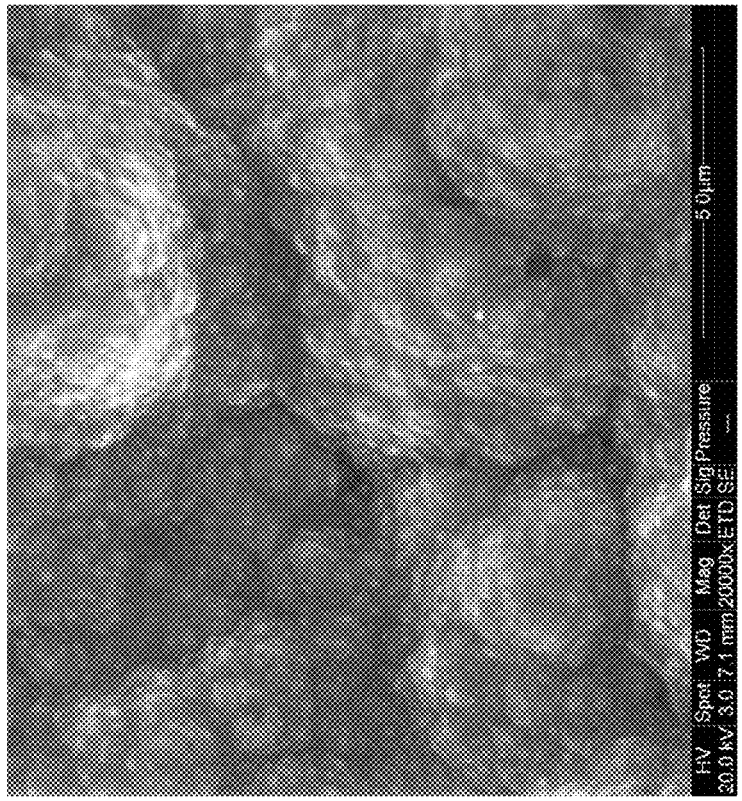

As can be seen in FIGS. 30A-B, the fracture profile exhibits clear step-shaped breakage morphology, marked by arrows in both images, indicating poor adhesion of the diamond film to the substrate which causes the diamond film to separate from the substrate upon impact/fracture. As can be seen in FIGS. 30C-D, the Cemecon-made diamond film microstructure is characterized by small crystalline grain size.

FIGS. 31A-D present SEM images taken for a fracture of a diamond film deposited onto WC-6% Co prepared by SP3 using a proprietary diamond-coating process, showing the fracture of the sample at a magnification of ×2,400 on two different areas of the fractured profile (FIGS. 31A-B) and the plain view of the diamond film surface, showing the SP3-made diamond film microstructure at a magnification of ×2,000 (FIG. 31C) and ×40,000 (FIG. 31D).

Figure 31C:
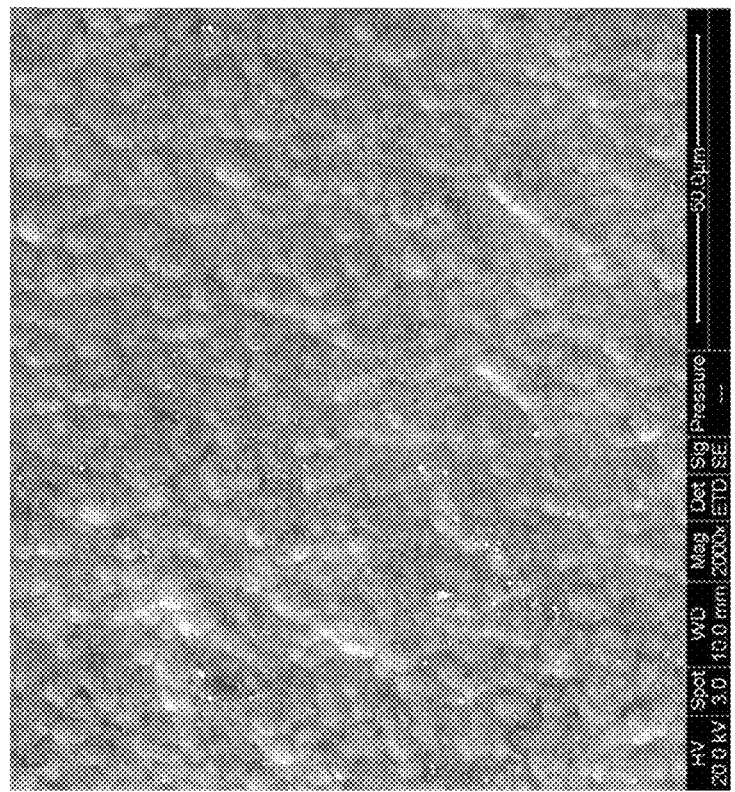
Figure 32B:
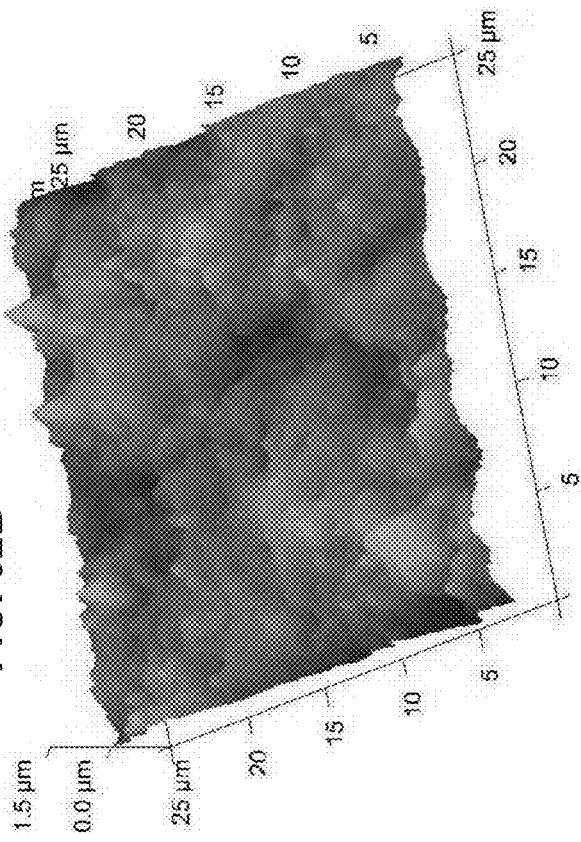
Figure 32C:
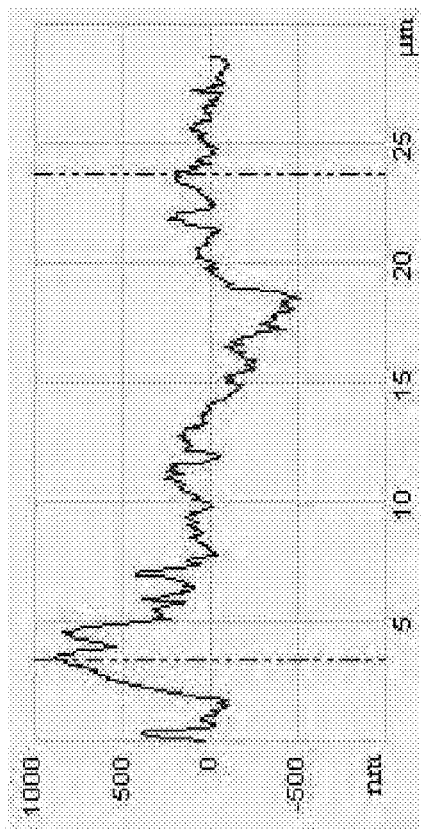
Figure 32A:
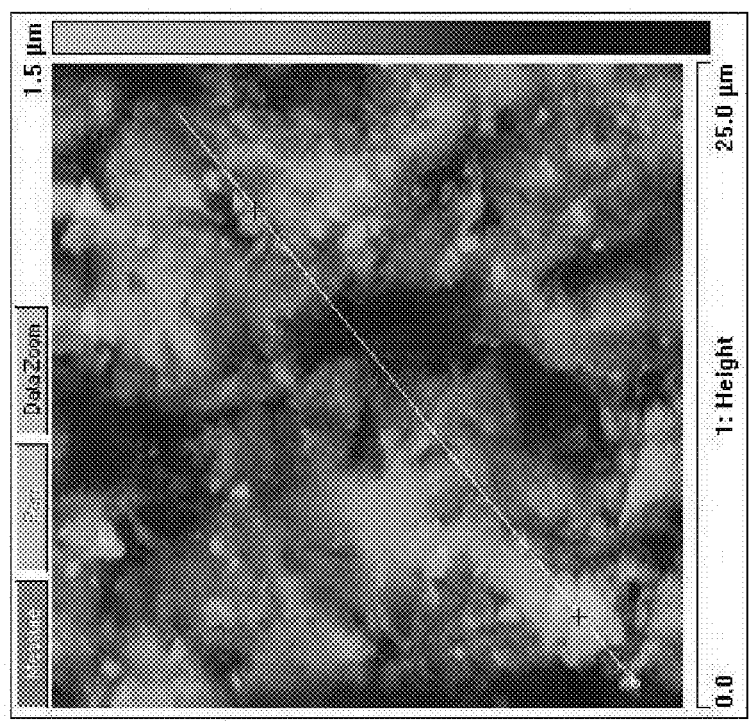
Figure 32E:
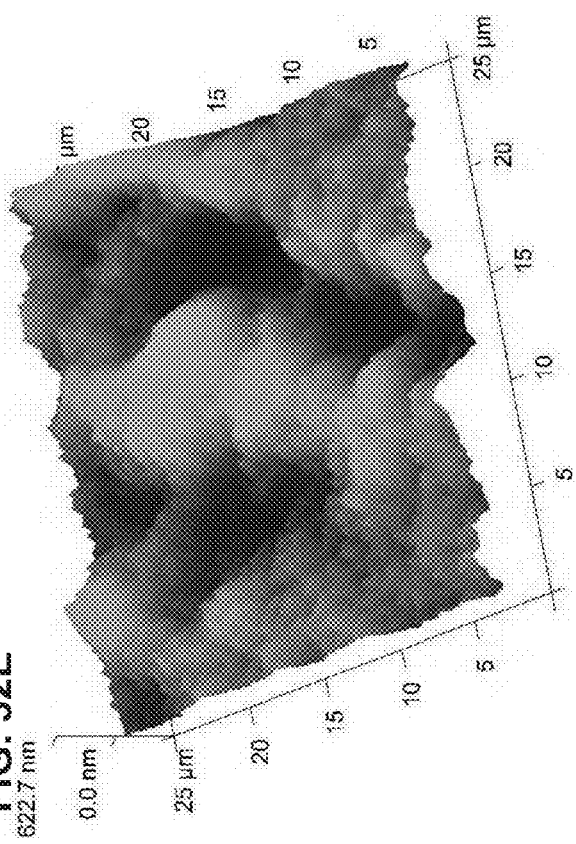
Figure 32F:
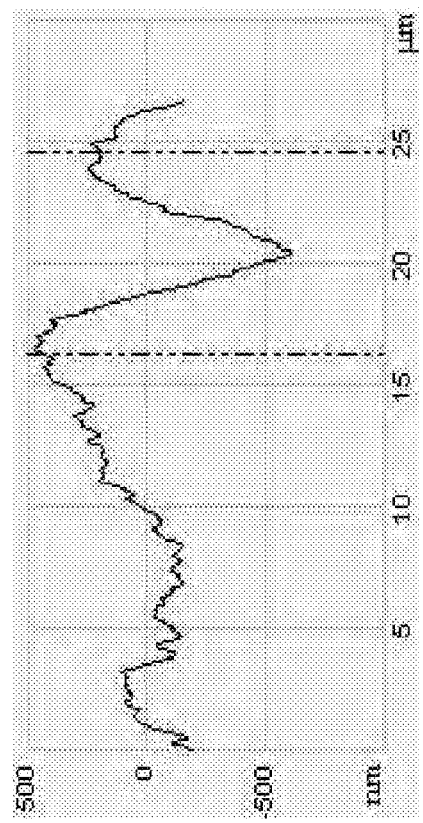
Figure 32D:
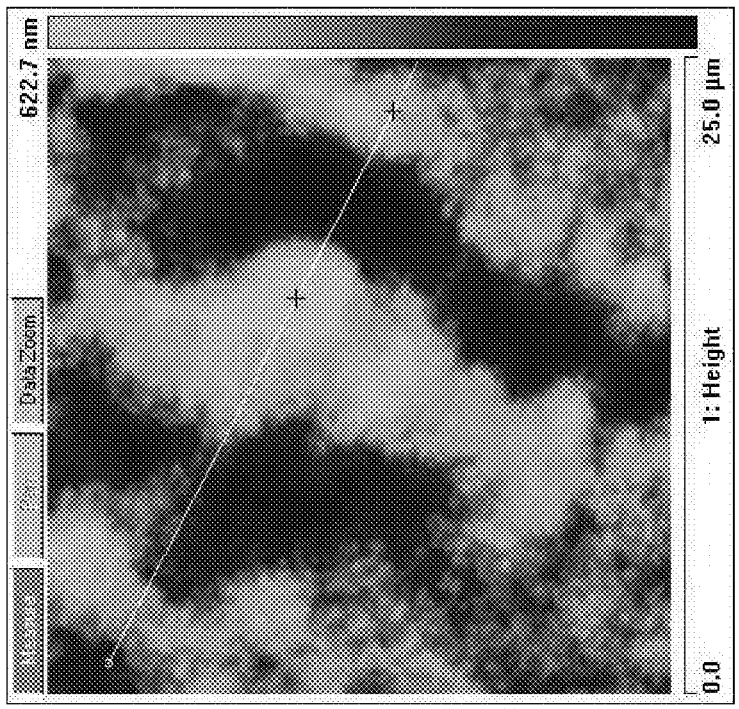
Figure 32H:
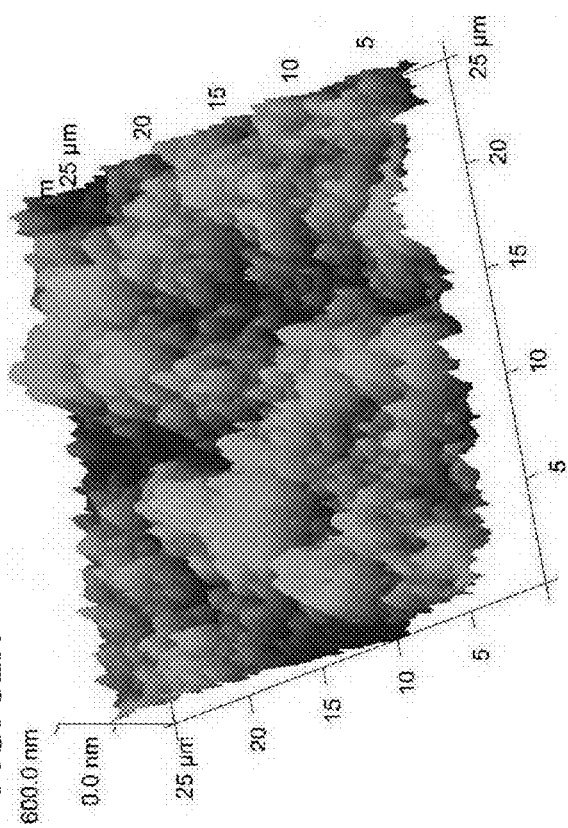
Figure 32I:
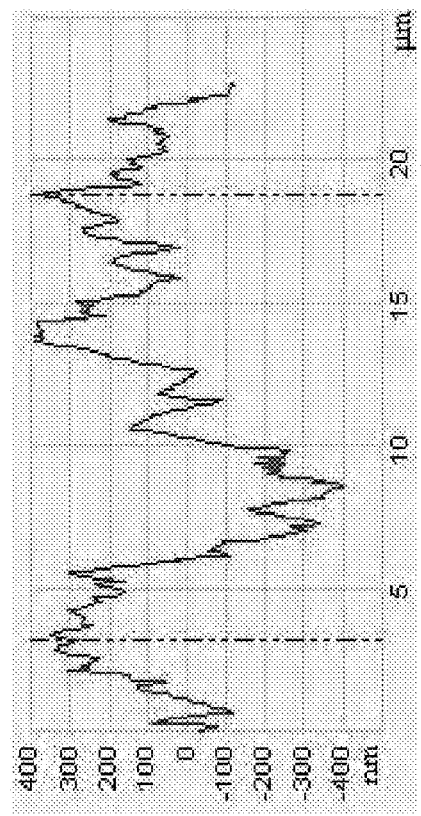
Figure 32G:
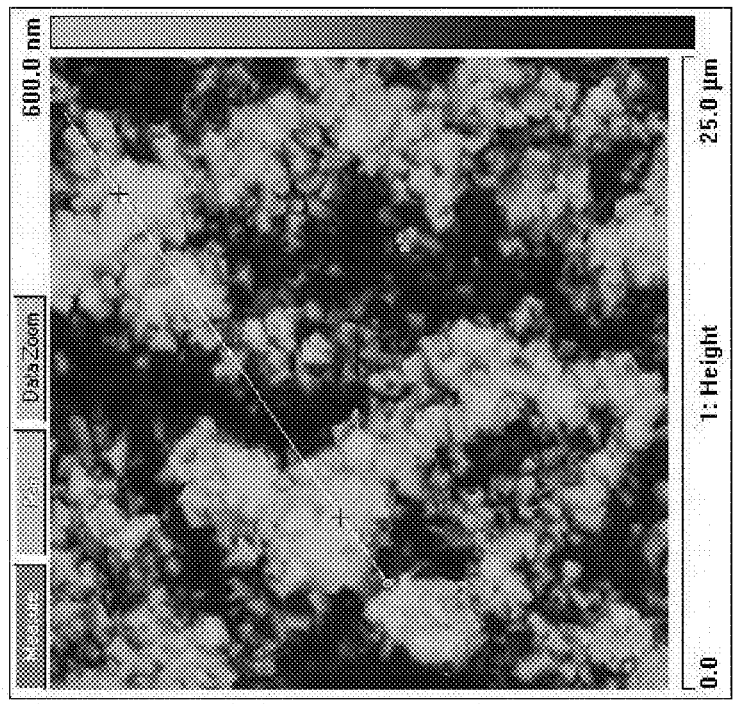
Figure 33A:
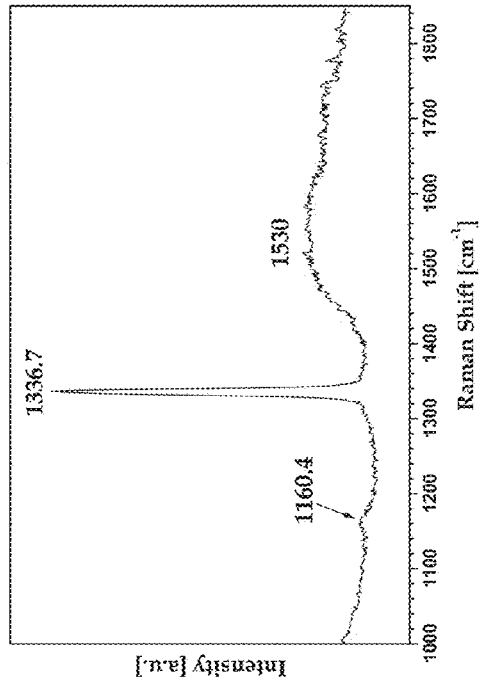
Figure 33C:
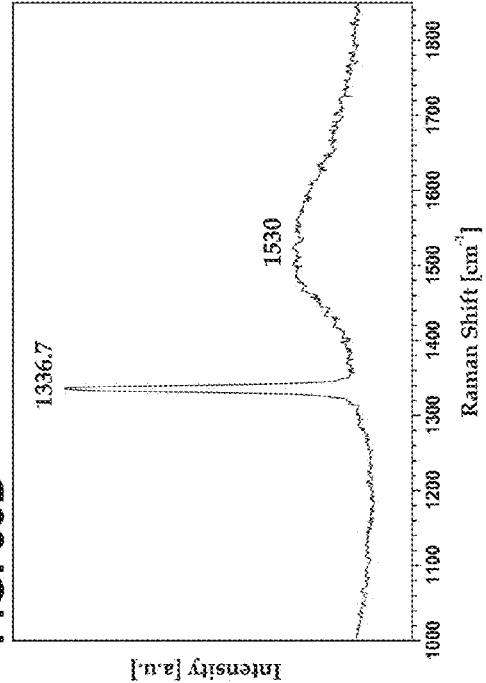
Figure 33B:
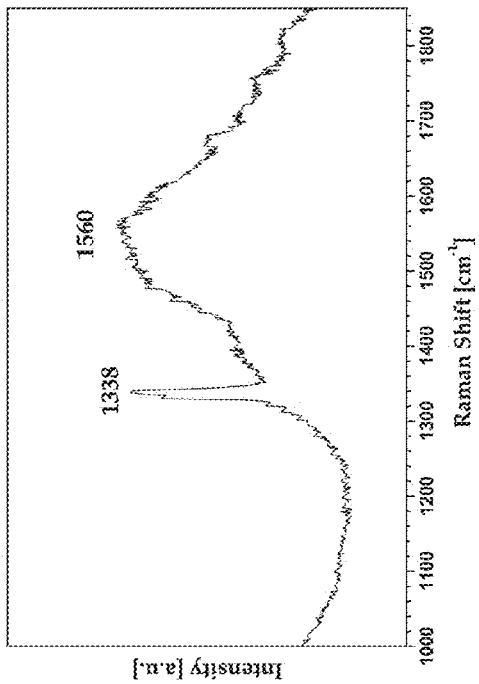
Figure 33D:
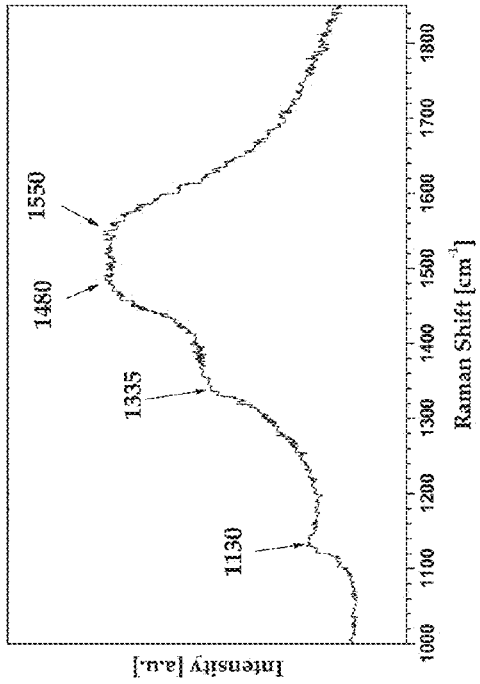

As can be seen in FIGS. 31A-B, the fracture profile exhibits clear step-shaped breakage morphology, marked in both images, indicating poor adhesion of the diamond film to the substrate which causes the diamond film to separate from the substrate upon impact/fracture. As can be seen in FIGS. 31C-D, the SP3-made diamond film microstructure is characterized by small diamond crystallites.

In conclusion, the results of the SEM fracture analysis presented herein clearly show that the diamond films deposited onto WC—Co using the methodology of chromium nitride interlayer, pretreatment for the enhancement of diamond nucleation and formation of a diamond film thereon, as described herein, exhibit excellent adhesion properties also in comparison to the results obtained for two commercially available samples.

Smoothness/Roughness of the Diamond Surface:

AFM was used to evaluate the smoothness of the top surface of the diamond layer of the composite structures presented herein in order to study the effect of the diamond-coating process on the smoothness of the pre-coated substrate. The AFM technique was performed as described hereinabove. All AFM scans were carried out over an area of 25×25 microns and for each sample scans were carried out on three different points.

FIGS. 32A-I present an AFM imaging analysis of a sand blasted WC-10% Co sample surface before formation of an interlayer (FIGS. 32A-C), after the formation of a 1 micron thick chromium nitride interlayer (FIGS. 32D-F), and after a 6 hours CVD of a diamond film thereon (FIGS. 32G-I), showing an orthogonal representation of the height scan results (FIGS. 32A, 32D and 32G), an isometric representation of the height scan results (FIGS. 32B, 32E and 32H) and a graphical representation of the to height measurements (FIGS. 32C, 32F and 32I), wherein the average roughness value $R_q$ is 190±10 nm for the sand blasted substrate, 170±7 nm for the CrN-coated substrate, and 165±5 nm for the diamond-coated/CrN-coated substrate.

As can be seen in FIGS. 32A-I, the results indicated that the integrated interlayer and diamond film coats the WC—Co substrate's flat surface substantially homogenously, namely the added layers do not increase the original roughness of the substrate. In fact, as can be seen in the decreasing Rq values, the roughness decreases by a relatively small amount in each layering step. The scans and their topographical and mathematical analysis show that the diamond film is conformal and does not cause an increase of the surface roughness, which supports the assumption that the diamond grain size is substantially finer that the non-homogeneous topographical peaks and crevices of the WC—Co substrate material.

In summary, the results demonstrate that the roughness of the substrate material is not affected by the additional films due to the fact that it covers uniformly and conformably the substrate's surface with morphological grain sizes in the sub-micron range, whereas the large scale topographical features of the WC—Co surface are in the micron range.

Example 3

Spectroscopic Evaluation of Diamond-Coated WC—Co Substrates

The deposited diamond films have been studied on their coated substrates (WC-10% Co and WC-6% Co substrates) in terms of their chemical composition by means of Raman and XRD spectroscopy (spectroscopic chemical fingerprint).

Raman Spectroscopy:

The presence of graphite or amorphous carbon in the deposited film as well as stresses were analyzed by Raman spectroscopy using an Ar ion laser (512 nm) with an output power of 5 mW and laser beam diameter of 2 mm.

FIGS. 33A-D present Raman spectra in the 1000-1850 cm-1 range, obtained for a diamond-coated WC—Co sample from SP3 (FIG. 33A), a similar sample from Cemecon (FIG. 33B), and samples referred to as coating A (FIG. 33C) and coating B (FIG. 33D), prepared according to some embodiments of the present invention.

As can be seen in FIGS. 33A-D, the Raman spectrum obtained for the samples, to prepared according to some embodiments of the present invention, displayed a line at 1336.7 cm-1 and a shoulder at 1530 cm-1, characteristic for polycrystalline diamond, without any bands or peaks associated with amorphous carbon. In sharp contrast, the Raman spectra obtained for the commercial samples (Cemecon and SP3) are dominated by peaks and bands which are characteristic for amorphous carbon or graphite. In the case of Cemecon peaks characteristic of nanocrystalline diamond are also observed in the measured Raman spectrum. These results suggest that the diamond films deposited onto a WC—Co substrate, according to some embodiments of the present invention, are composed of larger and higher quality crystalline diamond grains as compared to the commercial samples.

Secondary Ion Mass Spectroscopy:

SIMS test was used to evaluate the chemical composition of the substrate, interlayer and of the diamond layer of the composite structures presented herein. The SIMS technique was performed as described hereinabove. The substrate used for these experiments was WC-10% Co, and the ToF-SIMS measurements were conducted at an M⁻ negative polarity.

FIGS. 34A-E present secondary ion mass spectrograms (SIMS) plotted as intensity as a function of distance from the surface (depth), obtained for various samples, wherein FIG. 34A is a SIMS of a 2 microns thick chromium nitride interlayer deposited onto a WC-10% Co substrate (Sample 11), FIG. 34B is a SIMS of a 1 micron thick chromium nitride interlayer deposited onto a WC-10% Co substrate (Sample 9), FIG. 34C is a SIMS of a carbidized 1 micron thick chromium nitride interlayer deposited onto a WC-10% Co substrate (Sample 10), FIG. 34D is a SIMS of a diamond film (about 1.2 micron thick) deposited in a two hours CVD process onto a 1 micron thick chromium nitride interlayer deposited onto a WC-10% Co substrate (Sample 9), FIG. 34E is a SIMS of a diamond film (about 1.2 micron thick) deposited in a two hours CVD process onto a carbidized CrN interlayer deposited onto a WC-10% Co substrate (Sample 10).

As can be seen in FIG. 34A, analysis of the spectrum shows that the interlayer in this sample (2 microns thick chromium nitride interlayer; Sample 11) is composed of two stoichiometric chromium nitride layers of similar thicknesses, CrN and $Cr_2N$, wherein the $Cr_2N$ layer is adjacent to the WC—Co substrate, and the CrN layer is closer to the surface. It is noted that no significant diffusion of cobalt into the interlayer was observed, which is beneficial for effective carbon deposition as diamond rather than graphite.

As can be seen in FIG. 34B, the interlayer in this sample (1 micron thick chromium nitride interlayer; Sample 9) is composed predominantly of one stoichiometric CrN layer while no distinct $Cr_2N$ layer could be observed. Also in this sample no significant diffusion of Co into the interlayer was observed.

As can be seen in FIG. 34C, the interlayer in this sample (1 micron carbidized chromium nitride; Sample 10) is composed predominantly of one stoichiometric CrN layer, with no significant diffusion of Co into the interlayer.

As can be seen in FIG. 34D, the interlayer in this sample (about 1.2 micron thick diamond film deposited onto a 1 micron thick chromium nitride interlayer; Sample 9) is composed predominantly of a stoichiometric CrN layer with no significant diffusion of Co into the interlayer during the diamond film deposition, and no diffusion of carbon towards the substrate. It is noted that a surface essentially devoid of cobalt is desirable towards the formation and adhesion of a diamond film, while similarly beneficial is the minimization or prevention of carbon diffusion towards the WC—Co substrate. Comparing the results presented in FIG. 34B to the results of FIG. 34D, it is noted that no significant changes occurs in the interlayer composition during the diamond deposition process.

As can be seen in FIG. 34E, the interlayer in this sample (diamond deposition on 1 micron carbidized chromium nitride; Sample 10) is composed predominantly of a stoichiometric CrN layer with no significant diffusion of Co into the interlayer during the diamond deposition processes and no diffusion of carbon towards the WC—Co substrate. Also in this case, no significant change in the interlayer's chemical composition occurs during the diamond deposition process.

In summary, the SIMS analysis suggests that nitridation of a 1 micron chromium layer, according to some embodiments of the present invention, results in the formation of a stoichiometric CrN interlayer, with no diffusion of cobalt, chromium, tungsten and/or carbon between the various interfaces during the chromium nitridation process or during the diamond deposition process. On the other hand, nitridation of a 2 microns thick metallic chromium results in the formation of a complex interlayer composed of to two layers composed of $Cr_2N$ and CrN each; the $Cr_2N$ layer is adjacent to the WC—Co substrate and the CrN layer is at the exposed interface. Diamond deposition onto these various interlayers confers no noticeable change to the chemical composition of the interlayers. These SIMS results and the interlayer XRD results presented hereinabove are in agreement.

In conclusion, the SIMS analyses presented herein show that a chromium nitride (carbidized or not), formed on a WC—Co substrate according to some embodiments of the present invention, can be used as an effective diffusion barrier, and therefore can be used as an effective interlayer for diamond film deposition on such substrates.

X-Ray Diffraction Analysis:

Following diamond deposition, performed as described hereinabove, the phases of the nitridized chromium interlayer and the diamond film were investigated by X-ray diffraction (XRD). Based on the XRD and SIMS results obtained for the interlayer laid on various samples and the SEM micrograph analysis thereof it was determined that the crystalline phases formed upon nitridation of a 1 micron chromium film is predominantly CrN whereas nitridation of the 2 micron chromium film resulted in $Cr_2N$ and CrN.

The results presented below are XRD patterns measured for the same samples, as defined in Table 1, coated with a diamond film to a thickness of about 3 microns with and without interlayer. Briefly, following diamond film deposition to a thickness of about 3 microns on all WC—Co samples having an interlayer as described herein, a strong diffraction peak associated with diamond appeared in the XRD pattern along side with small peak associated with $Cr_7C_3$ crystalline phases. In addition in all cases the intensities of the XRD peaks associated to CrN and $Cr_2N$ also appear in the diffraction pattern.

XRD results, obtained for samples listed in Table 1 before (top layer is chromium nitride or carbidized chromium nitride) and after diamond seeding and diamond film deposition over the interlayer, are summarized hereinbelow.

FIGS. 35A-D present XRD patterns, showing counts per second (Cps, (FIGS. 35A and 35C) and $Log_{10}$ (FIGS. 35B and 35D) obtained for a WC-6% Co sample without an interlayer before diamond film formation (FIGS. 35A and 35B), and after diamond film deposition, constituting Sample 1 (see, Table 1)(FIGS. 35C and 35D).

As can be seen in FIGS. 35A-D, before diamond deposition XRD only peaks associated with WC are observed. Following diamond deposition, a small peak associated to diamond was measured in the XRD pattern in addition to the WC peaks.

FIGS. 36A-D present the XRD pattern obtained for the interlayer (FIGS. 36A-B), and the diamond coating (FIGS. 36C-D) obtained for Sample 2, prepared according to some embodiments of the present invention.

FIGS. 37A-D present XRD spectra obtained for the interlayer (FIGS. 37A-B), and the diamond coating (FIGS. 37C-D) obtained for Sample 3, prepared according to some embodiments of the present invention.

FIGS. 38A-D present XRD spectra obtained for the interlayer (FIGS. 38A-B) and the diamond coating (FIGS. 38C-D) obtained for Sample 4, prepared according to some embodiments of the present invention.

FIGS. 39A-D present XRD spectra obtained for the interlayer (FIGS. 39A-B) and the diamond coating (FIGS. 39C-D) obtained for Sample 5, prepared according to some embodiments of the present invention.

FIGS. 40A-D present XRD spectra obtained for the interlayer (FIGS. 40A-B), and the diamond coating (FIGS. 40C-D) obtained for Sample 9, prepared according to some embodiments of the present invention.

FIGS. 41A-D present XRD spectra obtained for the interlayer (FIGS. 41A-B), and the diamond coating (FIGS. 41C-D) obtained for Sample 10, prepared according to some embodiments of the present invention.

FIGS. 42A-D present XRD spectra obtained for the interlayer (FIGS. 42A-B), and the diamond coating (FIGS. 42C-D) obtained for Sample 11, prepared according to some embodiments of the present invention.

FIGS. 43A-D present XRD spectra obtained for the interlayer (FIGS. 43A-B), and the diamond coating (FIGS. 43C-D) obtained for Sample 12, prepared according to some embodiments of the present invention.

As can be seen in all the XRD patterns presented in FIGS. 35A-43D, obtained before and after diamond film deposition:

(i) The chromium nitride interlayer obtained following nitridation of 1 micron to metallic chromium results in the formation of a predominant highly crystalline CrN layer. Upon diamond deposition onto this interlayer, in addition to the CrN, small XRD peaks, characteristic to CrC, appear in the spectrum; and (ii) The chromium nitride interlayer obtained following nitridation of 2 micron layer of metallic chromium results in the formation of a mixed crystalline CrN and $Cr_2N$ crystalline layer. Upon diamond deposition onto this interlayer, in addition to the CrN and $Cr_2N$ XRD peaks, small peaks characteristic to CrC appear also in the spectrum.

(iii) the conclusion obtained from XRD is fully supported by the SIMS measurements presented hereinabove.

CONCLUSIVE REMARKS

The results presented hereinabove show that according to some embodiments of the present invention, a CrN interlayer can be deposited directly onto the WC—Co substrate without prior modification, namely physical or chemical manipulation of the substrate other than basic cleaning. This can be attested by cross-sectional electron microscopy of a fractured sample as well as a SIMS scan.

The interlayer formation comprises two steps, deposition of a metallic layer of chromium followed by high temperature (about 800° C.) exposure to ammonia flow.

The diamond film formation comprises a diamond seeding step and a carbon CVD step.

A 1-2 micron thick CrN interlayer exhibits a nearly homogeneous stoichiometric Cr:N composition at all stage of the process, as determined by SIMS.

A phase analysis of the interlayer supports a CrN composition of the interlayer and further show that it is composed predominantly of crystalline phase essentially through the interlayer at all stages of the process, as determined by XRD.

Substantially no diffusion of cobalt occurs towards the diamond film through the interlayer, as determined by SIMS.

Substantially no diffusion of carbon occurs through the interlayer, as determined by SIMS.

Substantially no diffusion of W or Cr occurs between the interlayer and the substrate at any stage of the process, as determined by SIMS and XPS.

SEM examination of a fracture composite structure (i.e. substrate/interlayer/diamond film) does not show on a statistical base steeps at the different boundaries.

Microhardness tests show co-adhesion of the composite structure at a load of at least 50 kg.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A composite structure, comprising a cemented carbide substrate, an interlayer disposed over said substrate and a contiguous diamond film disposed over said interlayer, wherein said cemented carbide substrate comprises a binder, and said interlayer comprises crystalline chromium nitride, the composite structure being characterized by at least one of:
   a thickness of said interlayer which is lower than 20 microns;
   a concentration of said binder in said interlayer which is lower than 0.5 percent by weight;
   a concentration of amorphous carbon in said interlayer which is lower than 0.5 percent by weight; and
   a co-adhesion of said diamond film to said interlayer and of said interlayer to said substrate, which is exhibited by a microhardness test at a load of at least 20 kg.

2. The composite structure of claim 1, being characterized by exhibiting at least three of the peaks of an X-Ray diffraction pattern selected from the group consisting of the X-Ray diffraction patterns as presented in FIG. 36C, FIG. 37C, FIG. 38C, FIG. 39C, FIG. 40C, FIG. 41C, FIG. 42C and FIG. 43C.

3. The composite structure of claim 1, wherein a concentration of said binder in said substrate is at least 2 percents by weight.

4. The composite structure of claim 1, wherein a concentration of said binder in said cemented carbide substrate near an interface with said interlayer is substantially the same as a concentration of said binder in deeper regions of said cemented carbide substrate.

5. The composite structure of claim 1, wherein a chemical composition of said interlayer is substantially homogenous with respect to a perpendicular axis of said interlayer.

6. The composite structure of claim 1, wherein a ratio of chromium to nitrogen in said interlayer ranges from 0.90 to 1.50.

7. The composite structure of claim 1, wherein said cemented carbide substrate comprises tungsten carbide and said binder.

8. The composite structure of claim 7, wherein said binder comprises cobalt.

9. The composite structure of claim 8, being characterized by a secondary ion mass spectrogram (SIMS) exhibiting at least one of:
   a concentration of carbon;
   a concentration of chromium nitride;
   a concentration of cobalt; and
   a concentration of tungsten
   as determined by a SIMS spectrum selected from the group consisting of the SIMS spectra as presented in FIG. 34D and FIG. 34E.

10. The composite of claim 9, being characterized by a secondary ion mass spectrogram (SIMS) exhibiting at least three of:
   a concentration of carbon;
   a concentration of chromium nitride;
   a concentration of cobalt; and
   a concentration of tungsten
   as determined by a SIMS spectrum selected from the group consisting of the SIMS spectra as presented in FIG. 34D and FIG. 34E.

11. The composite of claim 9, being characterized by a secondary ion mass spectrogram (SIMS) exhibiting any of:
   a concentration of carbon;
   a concentration of chromium nitride;
   a concentration of cobalt; and
   a concentration of tungsten
   as determined by a SIMS spectrum selected from the group consisting of the SIMS spectra as presented in FIG. 34D and FIG. 34E.

12. The composite of claim 1, wherein a thickness of said interlayer is lower than 10 microns.

13. The composite of claim 1, comprising a single interlayer between said substrate and said diamond film.

14. An article of manufacture comprising the composite structure of claim 1.

15. A process of preparing a composite structure which comprises a cemented carbide substrate, an interlayer disposed over said substrate and a contiguous diamond film disposed over said interlayer, wherein said cemented carbide substrate comprises a binder, and said interlayer comprises crystalline chromium nitride, the process comprising:
   depositing a layer of metallic chromium having a thickness lower than 20 microns onto a surface of said cemented carbide substrate, to thereby form a cemented carbide substrate having a layer of metallic chromium deposited onto its surface;
   nitiridizing said layer of metallic chromium by exposing said cemented carbide substrate having said layer of metallic chromium deposited onto its surface to gaseous ammonia, at a temperature of at least 700° C., to thereby form said cemented carbide substrate having a layer of chromium nitride deposited on its surface; and
   depositing said contiguous diamond film onto said layer of chromium nitride, thereby preparing the composite structure.

16. The process of claim 15, wherein depositing said layer of metallic chromium is effected by a physical vapor deposition method selected from the group consisting of sputter deposition, magnetron sputtering and cathodic arc.

17. The process of claim 15, wherein said exposing to ammonia comprises exposing said cemented carbide substrate having said layer of metallic chromium deposited onto its surface to ammonia at a flow ranging from 200 sccm to 500 sccm.

18. The process of claim 15, wherein said exposing to ammonia comprises exposing said cemented carbide substrate having said layer of metallic chromium deposited onto its surface to ammonia at a pressure that ranges from 100 to 300 Torr.

19. The process of claim 15, wherein said exposing to ammonia comprises exposing said cemented carbide substrate having said layer of metallic chromium deposited onto its surface to ammonia at a temperature that ranges from 600° C. to 1000° C.

20. The process of claim 15, wherein said exposing to ammonia is effected for a time period that ranges from 30 minutes to 90 minutes.

21. The process of claim 20, wherein said exposing to ammonia is effected for a time period of 60 minutes.

22. The process of claim 15, further comprising, prior to said depositing said contiguous diamond film onto said layer of chromium nitride,
carbidizing said layer of chromium nitride.

23. The process of claim 22, wherein said carbidizing said layer of chromium nitride comprises:
heating said cemented carbide substrate having a layer of chromium nitride deposited on its surface to a temperature that ranges from 500° C. to 800° C.;
exposing said substrate to a thermally activated gas mixture of methane and hydrogen at a volume ratio that ranges from 1:90 to 1:99 for a time period that ranges from 10 minutes to 20 minutes.

24. The process of claim 15, further comprising, prior to depositing said diamond film, seeding said layer of chromium nitride with diamond particles by contacting said layer of chromium nitride with an abrasive slurry that comprises said diamond particles.

25. The process of claim 15, wherein depositing said contiguous diamond film onto said layer of chromium nitride comprises:
heating said cemented carbide substrate having said layer of chromium nitride deposited on its surface to a temperature that ranges from 500° C. to 800° C.; and
exposing said substrate to a thermally activated gas mixture of methane and hydrogen at a volume ratio that ranges from 1:90 to 1:99.

26. The process of claim 15, wherein said cemented carbide substrate comprises tungsten carbide and a binder.

27. The process of claim 26, wherein said binder comprises cobalt.

28. A composite structure prepared by the process of claim 15.

29. An article of manufacture comprising the composite structure of claim 28.

* * * * *